US010748933B2

(12) United States Patent
Yadoguchi et al.

(10) Patent No.: US 10,748,933 B2
(45) Date of Patent: Aug. 18, 2020

(54) SEMICONDUCTOR DEVICE

(71) Applicant: RENESAS ELECTRONICS CORPORATION, Tokyo (JP)

(72) Inventors: Yasuhiro Yadoguchi, Tokyo (JP); Takashi Fujii, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 100 days.

(21) Appl. No.: 16/182,142

(22) Filed: Nov. 6, 2018

(65) Prior Publication Data
US 2019/0198529 A1 Jun. 27, 2019

(30) Foreign Application Priority Data
Dec. 22, 2017 (JP) ................. 2017-246395

(51) Int. Cl.
*H01L 27/02* (2006.01)
*H01L 27/118* (2006.01)
*H03K 19/173* (2006.01)

(52) U.S. Cl.
CPC .... *H01L 27/11807* (2013.01); *H01L 27/0207* (2013.01); *H03K 19/1736* (2013.01); *H01L 2027/1182* (2013.01); *H01L 2027/1187* (2013.01); *H01L 2027/11875* (2013.01); *H01L 2027/11881* (2013.01); *H01L 2027/11885* (2013.01)

(58) Field of Classification Search
CPC ............ H01L 27/0207; H01L 27/0629; H01L 27/0886; H01L 27/11521; H01L 27/11807; H01L 29/0653; H01L 29/785
See application file for complete search history.

(56) References Cited

U.S. PATENT DOCUMENTS 7,404,154 B1 * 7/2008 Venkatraman .... H01L 27/11807
326/103
2008/0224321 A1 9/2008 Jinno
(Continued)

FOREIGN PATENT DOCUMENTS

JP 2008-227035 A 9/2008

OTHER PUBLICATIONS

Extended European Search Report issued in corresponding European Patent Application No. 18207918.6-1212, dated Sep. 24, 2019.

*Primary Examiner* — Cuong Q Nguyen
(74) *Attorney, Agent, or Firm* — McDermott Will & Emery LLP

(57) ABSTRACT

Provided is a semiconductor device in which influence resulting from a cell function change can be reduced. The semiconductor device includes a function cell designed using a basic cell including a first wiring layer provided over a main surface of a semiconductor substrate and having a predetermined pattern and a second wiring layer provided over the first wiring layer and having a predetermined pattern. The function cell corresponds to the basic cell which is modified to have a predetermined function by changing the pattern of the second wiring layer at a design stage. The function cell has a first layout and a second layout which are disposed in juxtaposition in one direction in a plane parallel with the main surface. The function cell is provided with the predetermined function by coupling together wires belonging to the respective second wiring layers of the first layout and the second layout.

20 Claims, 24 Drawing Sheets

(56) References Cited

U.S. PATENT DOCUMENTS

| | | |
|---|---|---|
| 2015/0048424 A1 | 2/2015 | Tien et al. |
| 2016/0329276 A1* | 11/2016 | Lin ...................... H01L 29/785 |
| 2017/0116366 A1 | 4/2017 | Seo et al. |
| 2017/0331478 A1 | 11/2017 | Stahl et al. |
| 2018/0097004 A1* | 4/2018 | Shimbo ............... H01L 27/0886 |

* cited by examiner

FIG. 6

| | COMPARATIVE EXAMPLES | | | | EMBODIMENTS | |
|---|---|---|---|---|---|---|
| | 1 | 2 | 3 | 4 | 1 | 2 |
| THE NUMBER OF MASKS TO BE CHANGED WHEN A FUNCTION IS CHANGED IS REDUCED (COST IS REDUCED) | YES | NO | NO | NO | YES AND CONGESTION IN A SPECIFIED WIRING LAYER IS ALSO REDUCED | |
| THE NUMBER OF CELLS TO BE PROVIDED IS REDUCED (AREA IS REDUCED) | NO | NO | YES | YES | YES AND AT LEAST FOUR TYPES OF FUNCTION CELLS ARE IMPLEMENTED USING A BASIC CELL | |
| LEAKAGE CURRENT IS INHIBITED | NO | NO | YES | YES | YES | |

FIG. 12
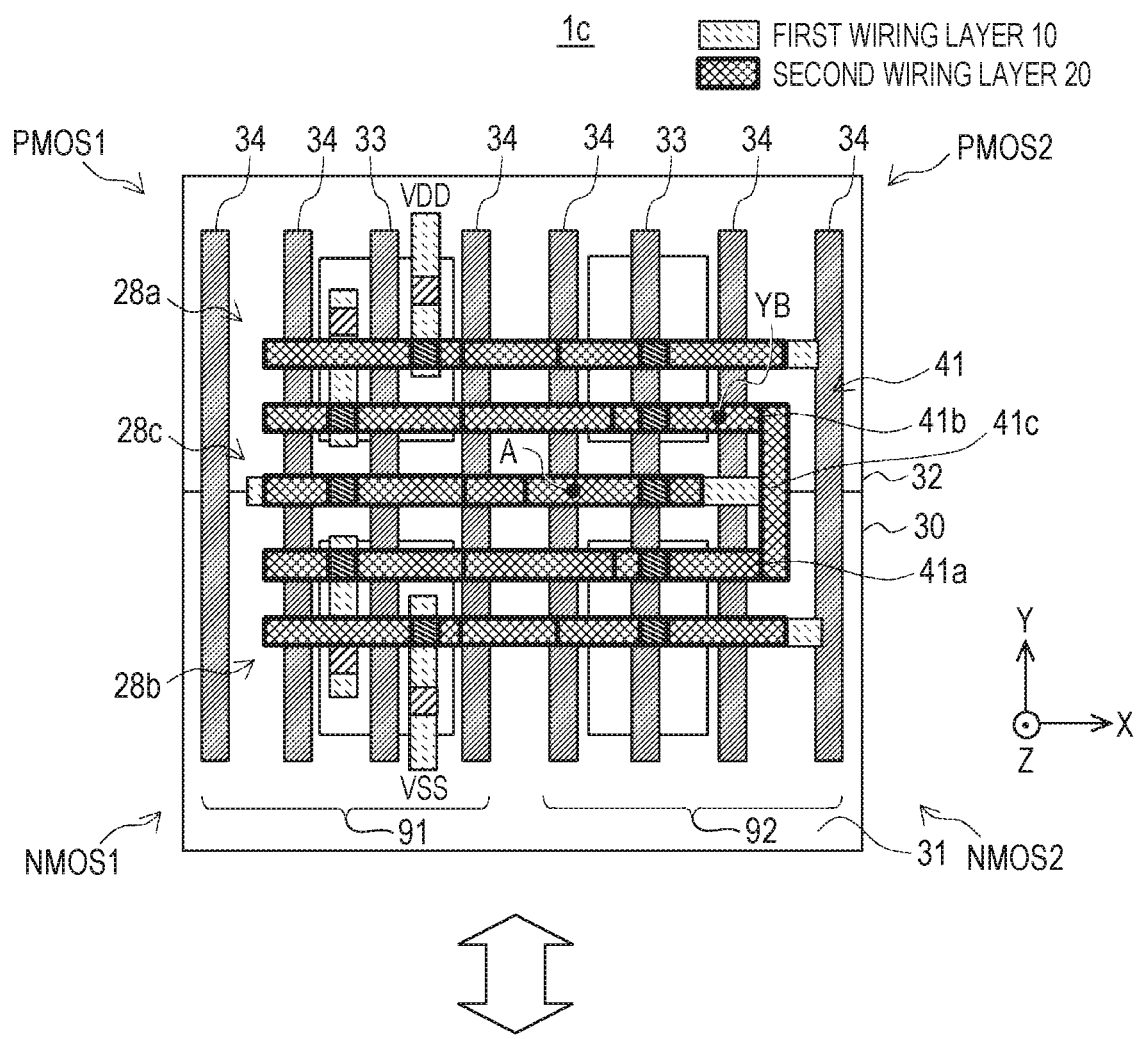
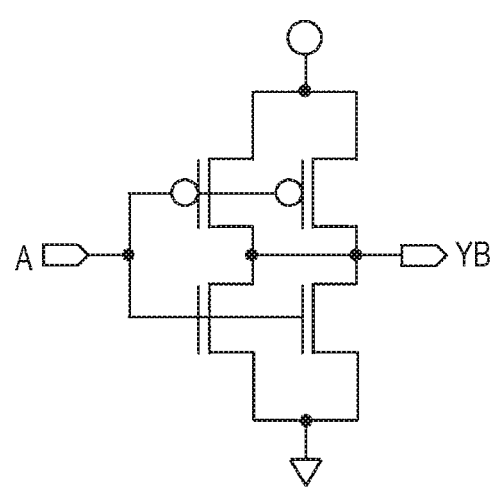

FIG. 13
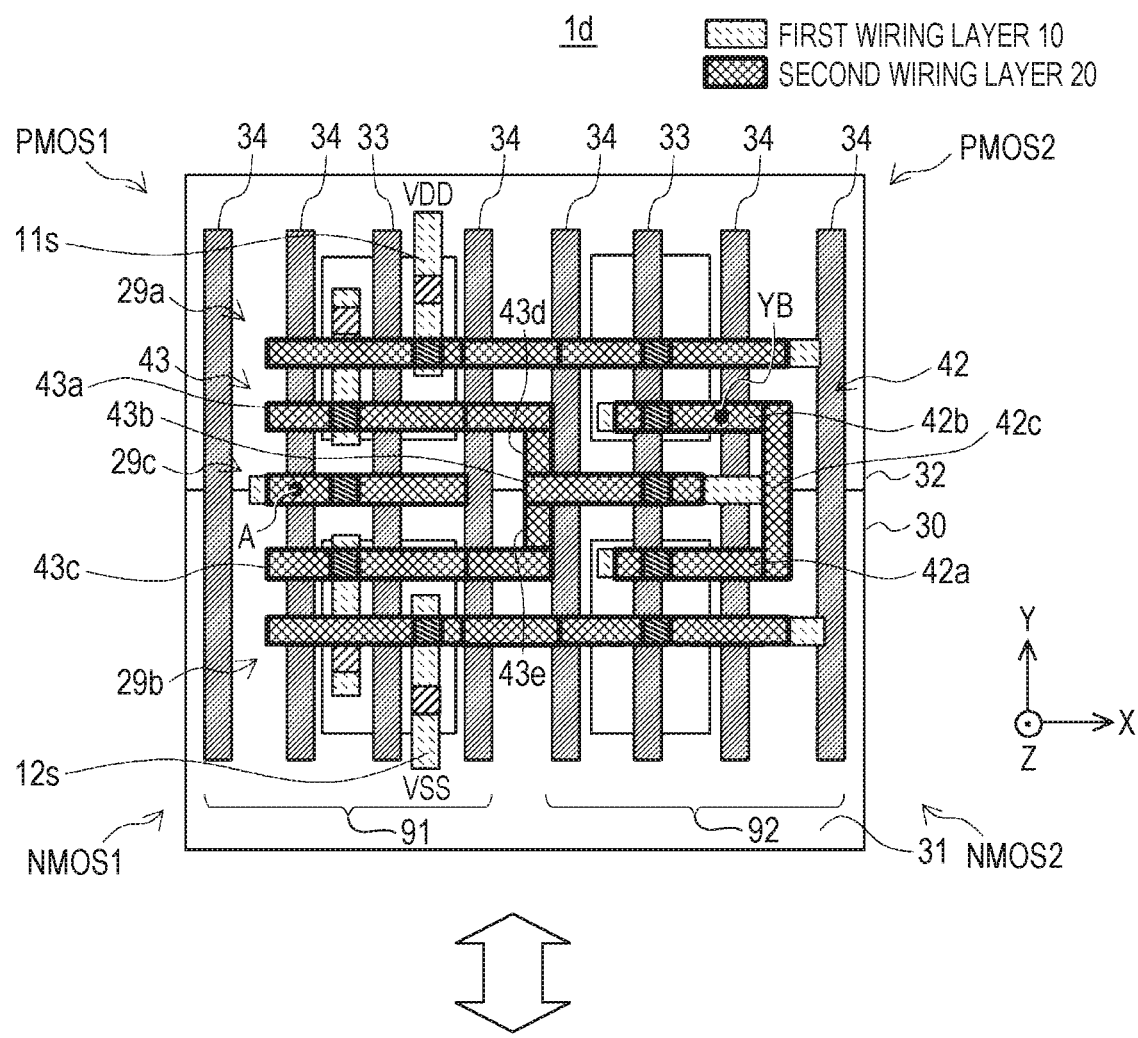
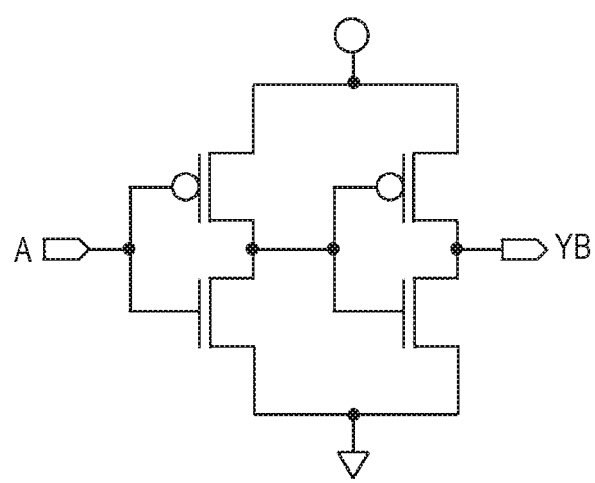

FIG. 15
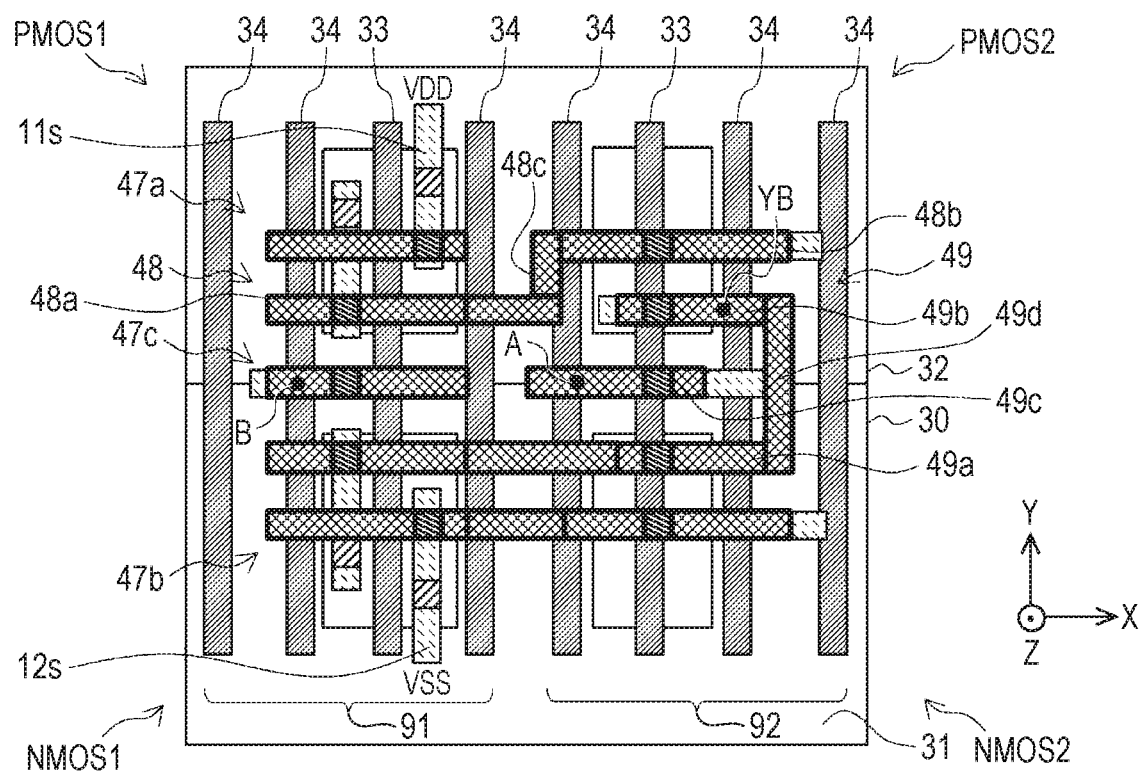
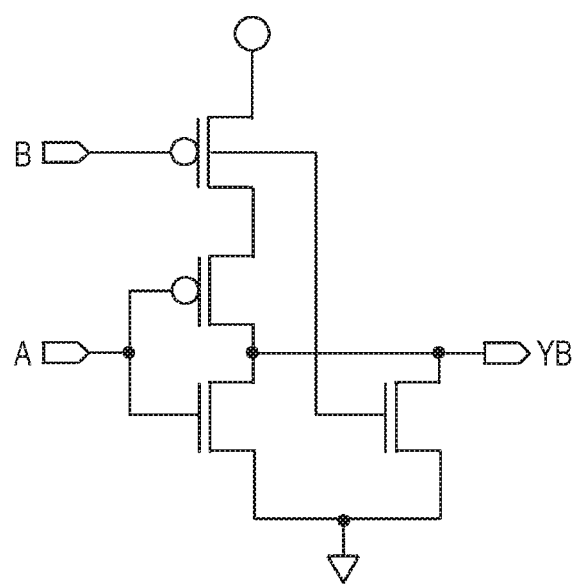

FIG. 18
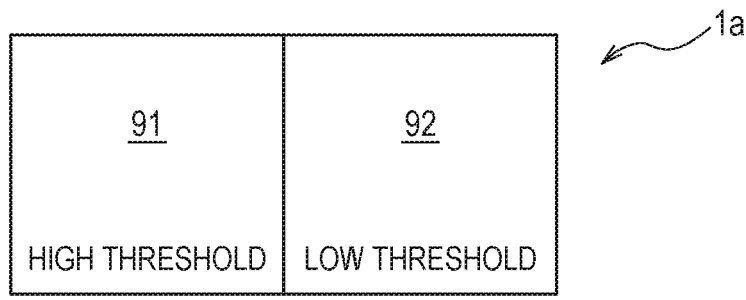
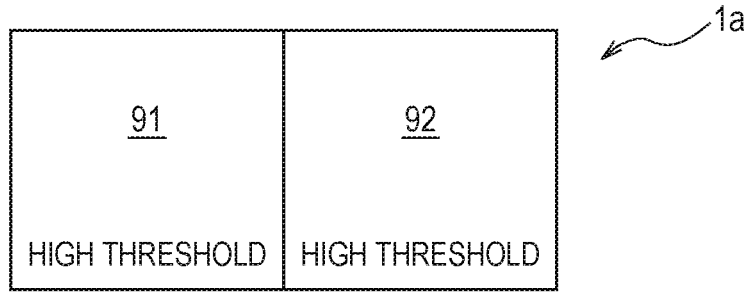
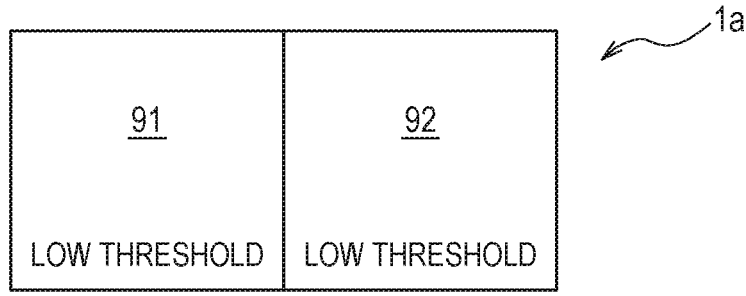

FIG. 22
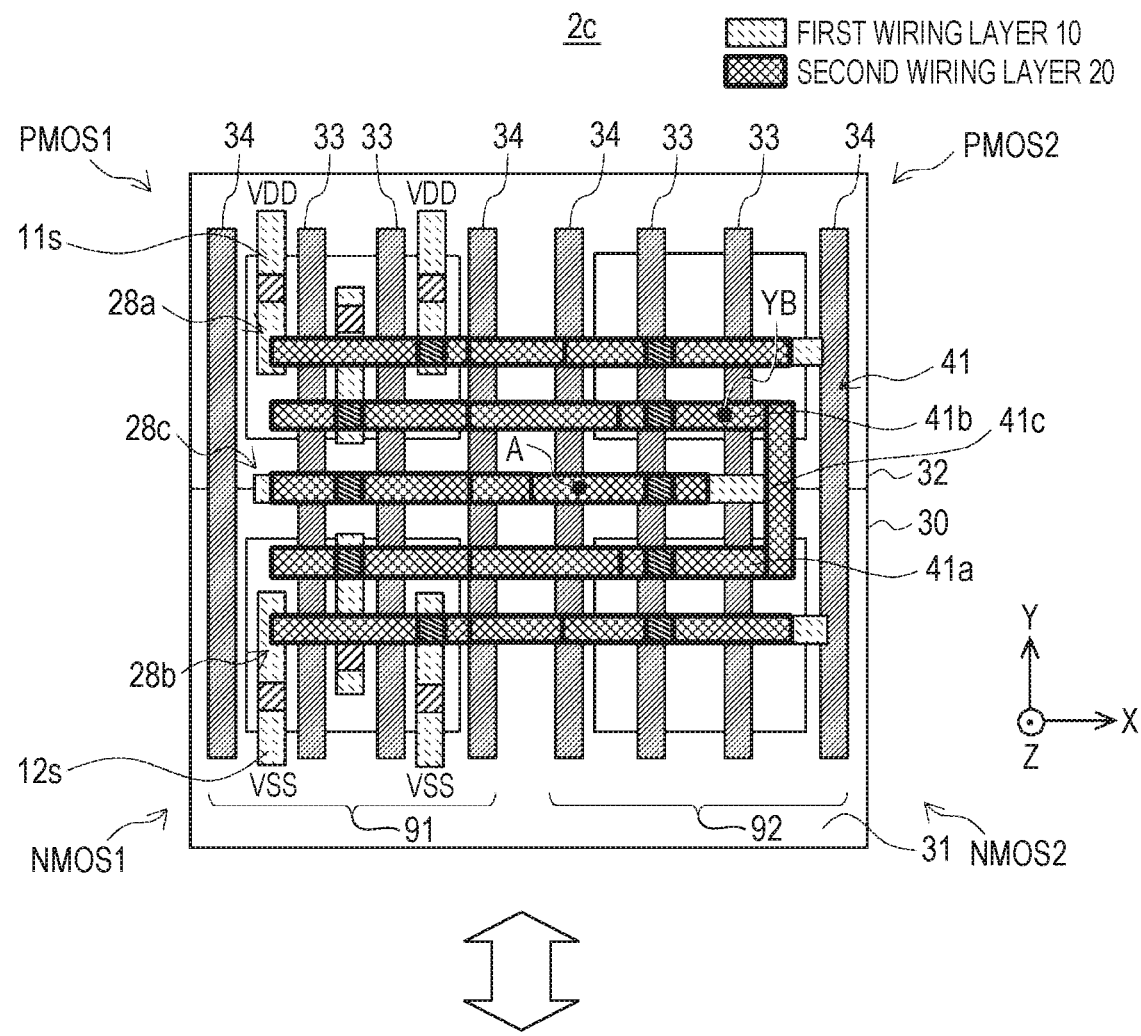
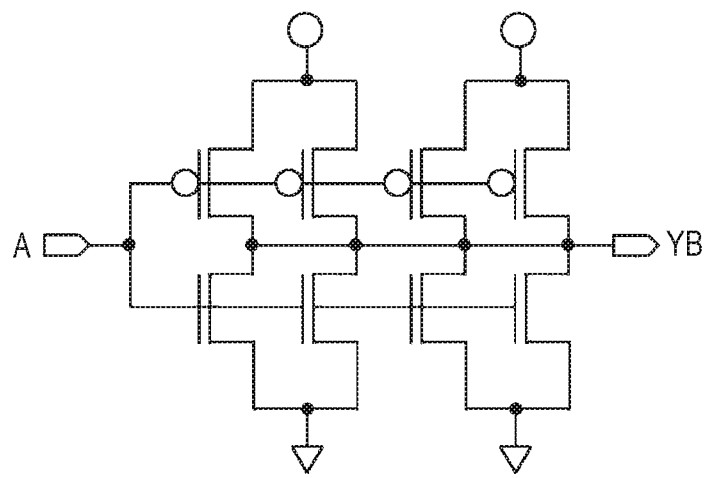

FIG. 23
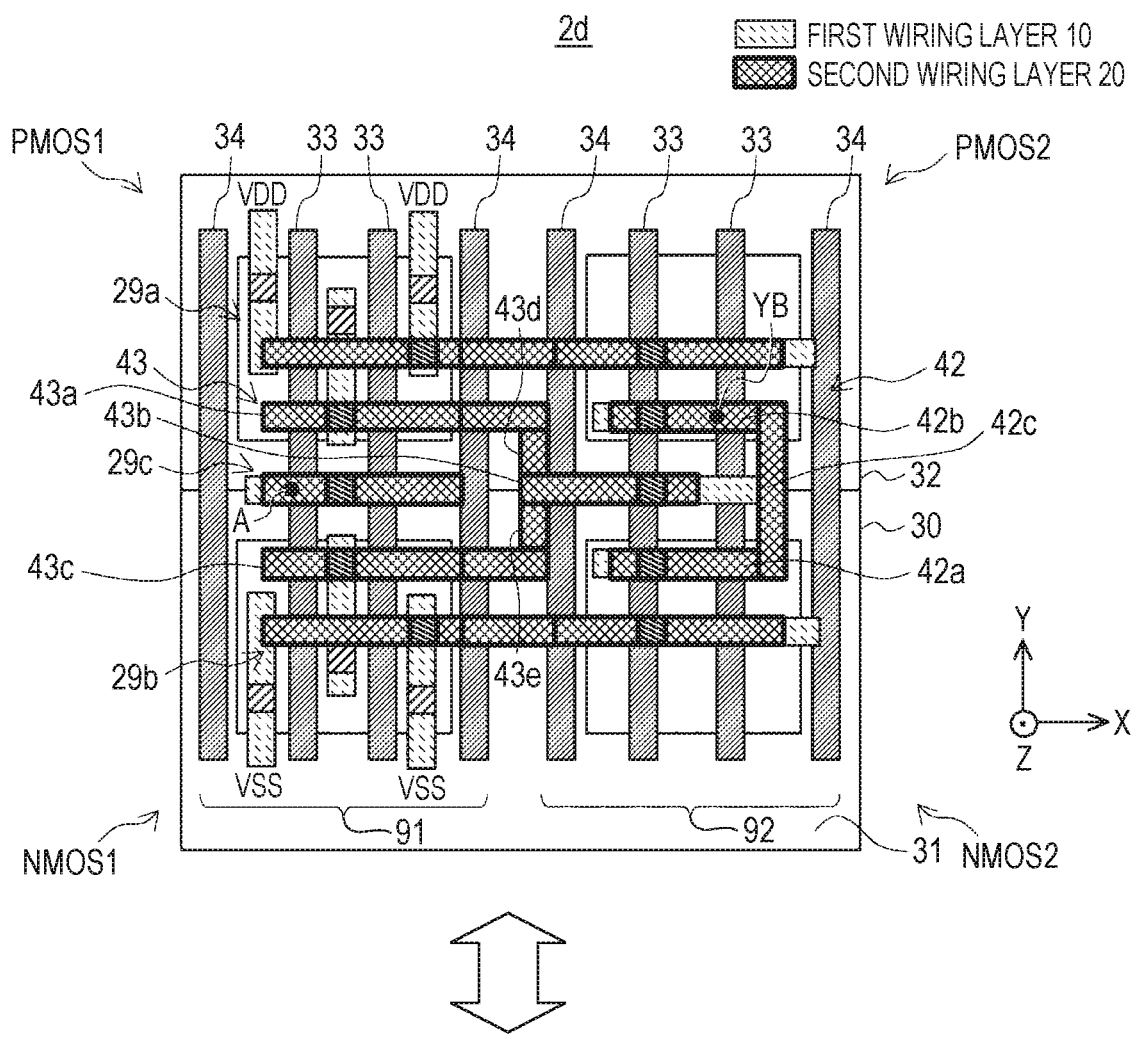
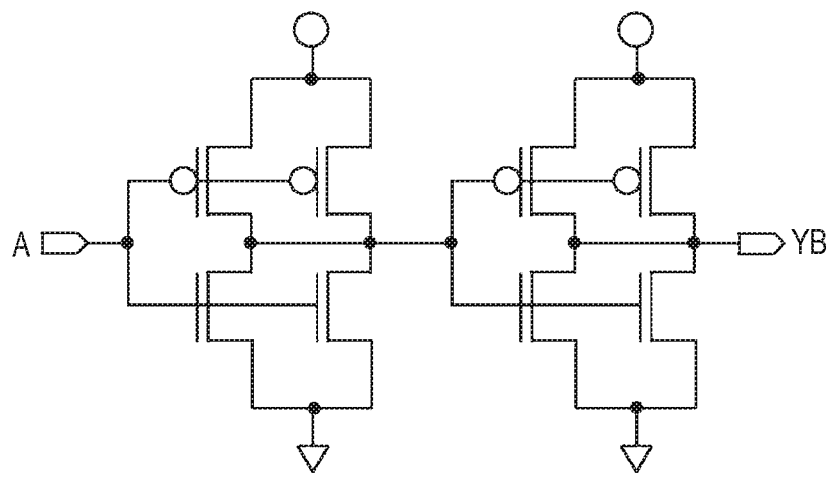

FIG. 24
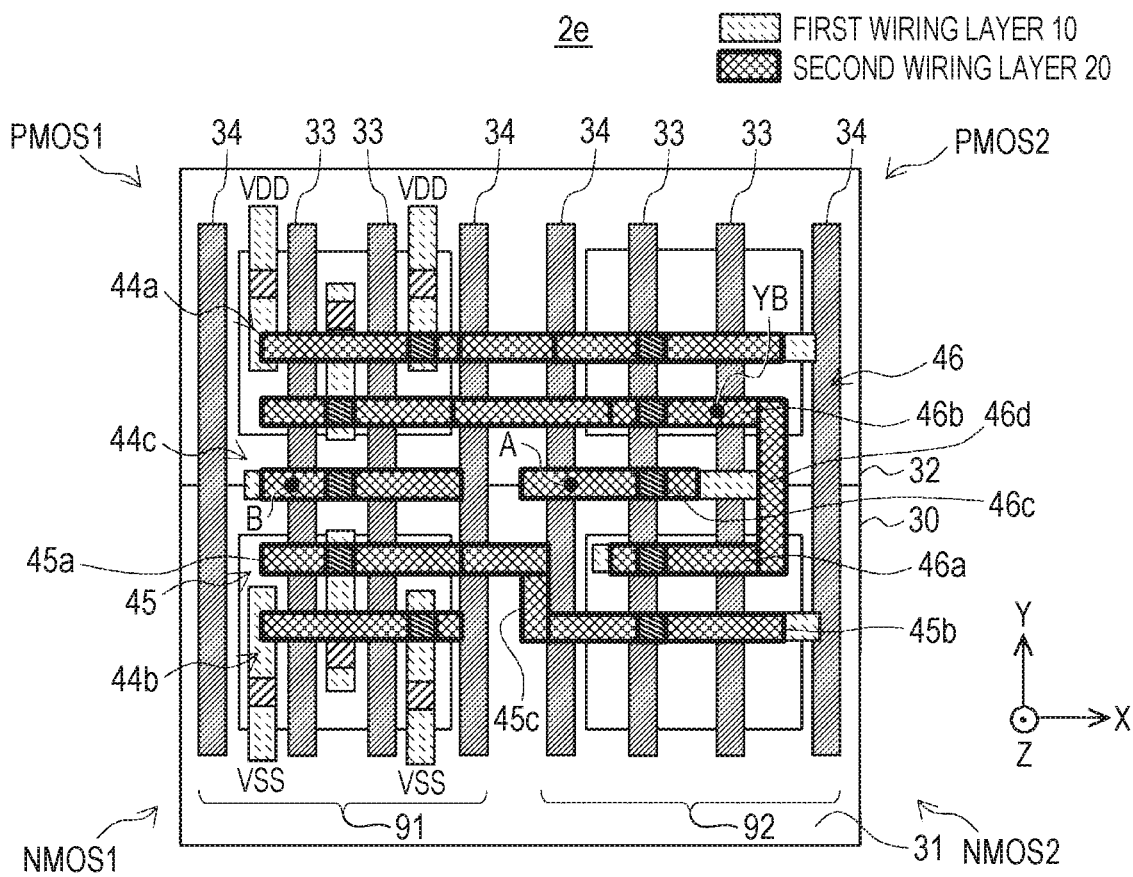
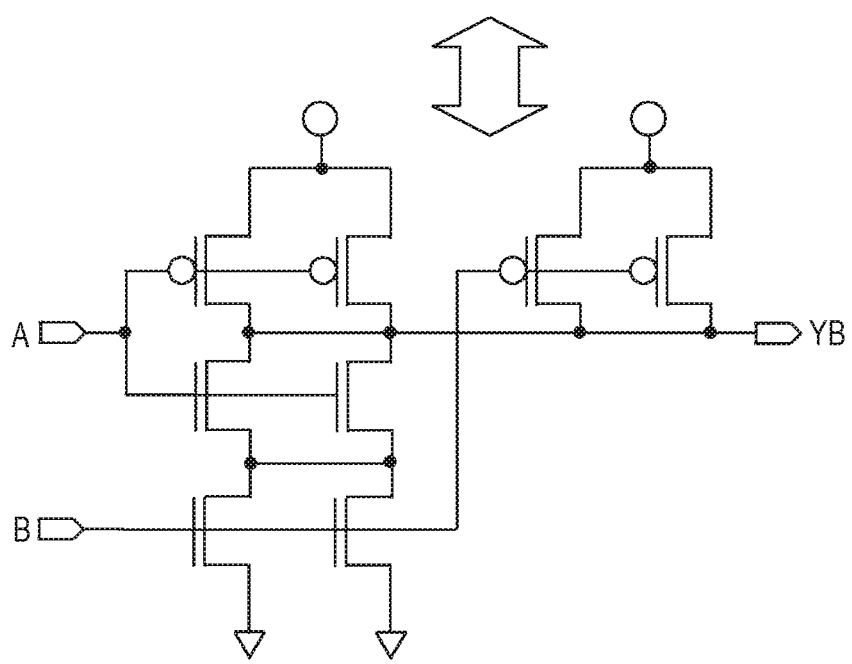

FIG. 25
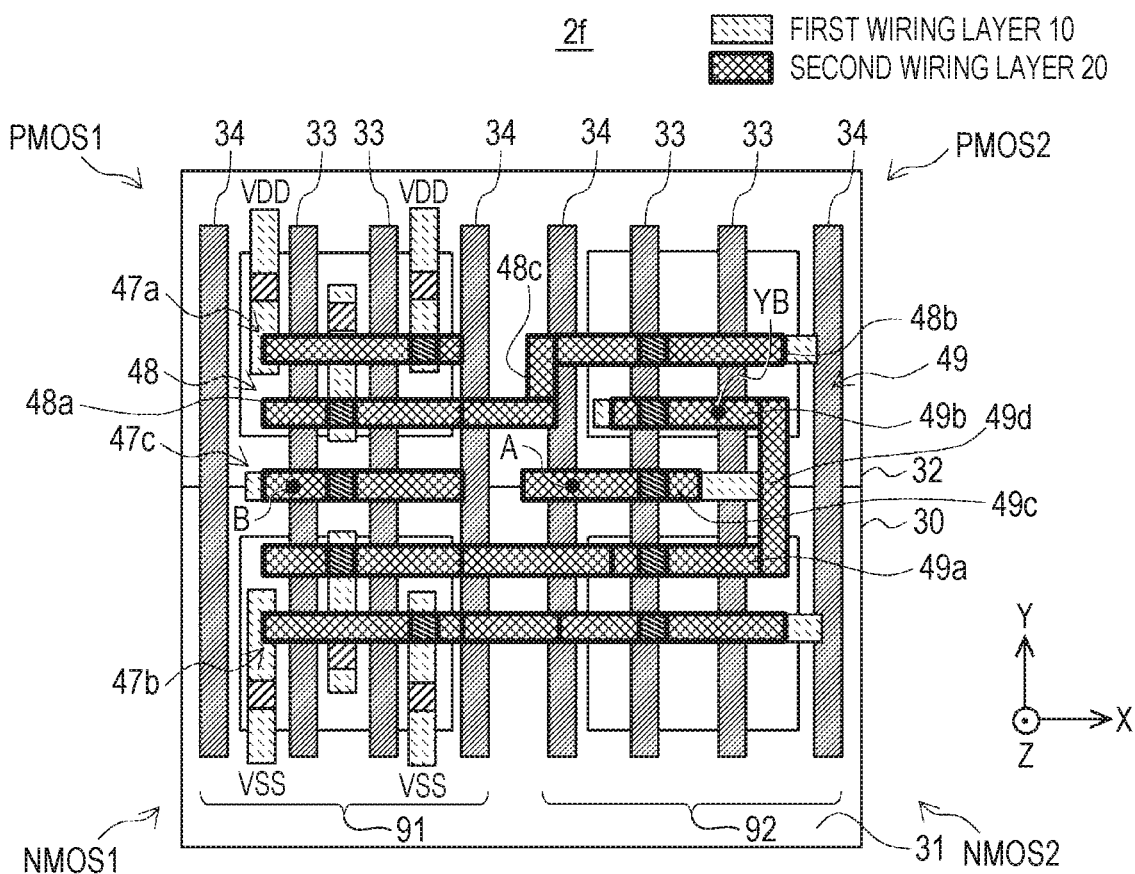
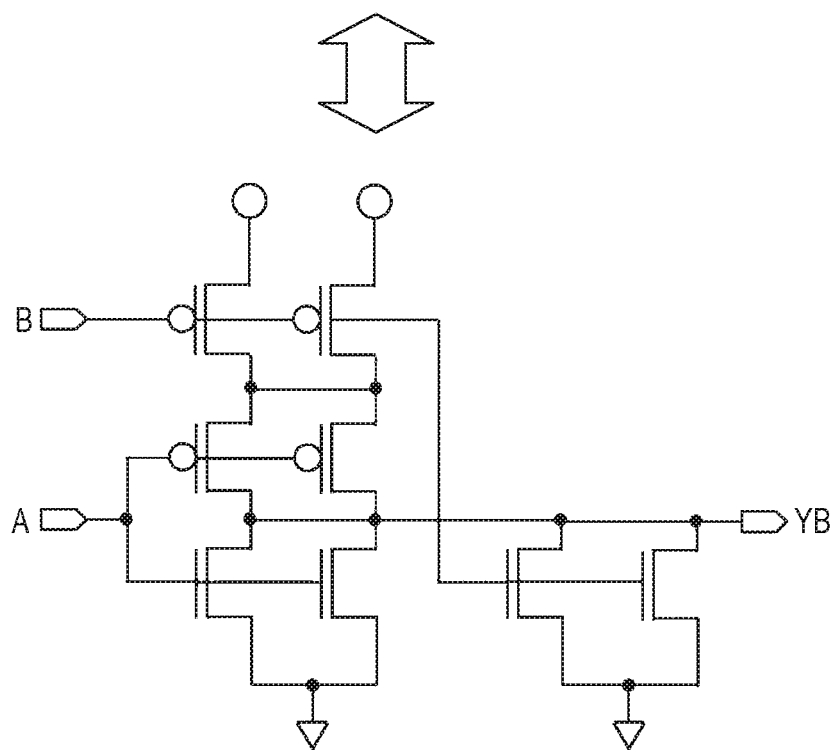

SEMICONDUCTOR DEVICE

CROSS-REFERENCE TO RELATED APPLICATIONS

The disclosure of Japanese Patent Application No. 2017-246395 filed on Dec. 22, 2017 including the specification, drawings and abstract is incorporated herein by reference in its entirety.

BACKGROUND

The present invention relates to a semiconductor device, e.g., a semiconductor device having a plurality of cells.

Patent Document 1 describes a semiconductor device in which cells each having a plurality of wiring layers are formed over a semiconductor substrate. The semiconductor device of Patent Document 1 includes the cells having functions that can be changed among a plurality of types of functions by merely changing the patterns of the wiring layers including and higher than the second layer over the semiconductor substrate. This reduces design influence resulting from changes in the functions of the cells.

RELATED ART DOCUMENT

Patent Document

[Patent Document 1] Japanese Unexamined Patent Application Publication No. 2008-227035

SUMMARY

The patterns of the wiring layers for changing the functions of the cells have room for improvement.

Other problems and novel features of the present invention will become apparent from a statement in the present specification and the accompanying drawings.

According to an embodiment, a semiconductor device includes a function cell designed using a basic cell including a first wiring layer provided over a main surface of a semiconductor substrate and having a predetermined pattern and a second wiring layer provided over the first wiring layer and having a predetermined pattern. The function cell corresponds to the basic cell which is modified to have a predetermined function by changing the pattern of the second wiring layer at a design stage. The function call has a first layout and a second layout which are disposed in juxtaposition in one direction in a plane parallel with the main surface. The function cell is provided with predetermined function by coupling together wires belonging to the respective second wiring layers of the first layout and the second layout. The first layout includes a first transistor, a second transistor disposed in juxtaposition with the first transistor in another direction crossing the one direction in the plane and having a conductivity type different from that of the first transistor, a first wire coupling either one diffusion layer of the first transistor to a first power supply, a second wire coupled to the other diffusion layer of the first transistor, a third wire coupling either one diffusion layer of the second transistor to a second power supply, a fourth wire coupled to the other diffusion layer of the second transistor, and a fifth wire disposed between the first transistor and the second transistor in the other direction and coupled to a shared gate electrode of the first and second transistors. The second layout includes a third transistor, a fourth transistor disposed in juxtaposition with the third transistor in the other direction and having a conductivity type different from that of the third transistor, a sixth wire coupled to either one diffusion layer of the third transistor, a seventh wire coupled to the other diffusion layer of the third transistor, an eighth wire coupled to either one diffusion layer of the fourth transistor, a ninth wire coupled to the other diffusion layer of the fourth transistor, and a tenth wire disposed between the third transistor and the fourth transistor in the other direction and coupled to a shared gate electrode of the third and fourth transistors. The first wire, the second wire, the third wire, and the fourth wire each belonging to the first wiring layer extend in the other direction. The fifth wire, the sixth wire, the seventh wire, the eighth wire, the ninth wire, and the tenth wire each belonging to the first wiring layer extend in the one direction.

According to the foregoing first embodiment, it is possible to provide a semiconductor device in which influence resulting from a cell function change can be reduced.

BRIEF DESCRIPTION OF THE DRAWINGS

FIG. 6 is a view illustrating a problem to be solved in a wiring layer for changing the function of a cell;

FIG. 12 is a plan view illustrating an INVx2 cell in the semiconductor device according to the first embodiment;

FIG. 13 is a plan view illustrating a BUF cell in the semiconductor device according to the first embodiment;

FIG. 15 is a plan view illustrating a 2NOR cell in the semiconductor device according to the first embodiment;

FIG. 18 is a view illustrating respective threshold voltages in a first layout and a second layout of the basic cell in in the semiconductor device according to the first embodiment;

FIG. 22 is a plan view illustrating an INVx4 cell in the semiconductor device according to the second embodiment;

FIG. 23 is a plan view illustrating a BUFx2 cell in the semiconductor device according to the second embodiment;

FIG. 24 is a plan view illustrating a 2NANDx2 cell in the semiconductor device according to the second embodiment;

FIG. 25 is a plan view illustrating a 2NORx2 cell in the semiconductor device according to the second embodiment;

DETAILED DESCRIPTION

Figure 1:
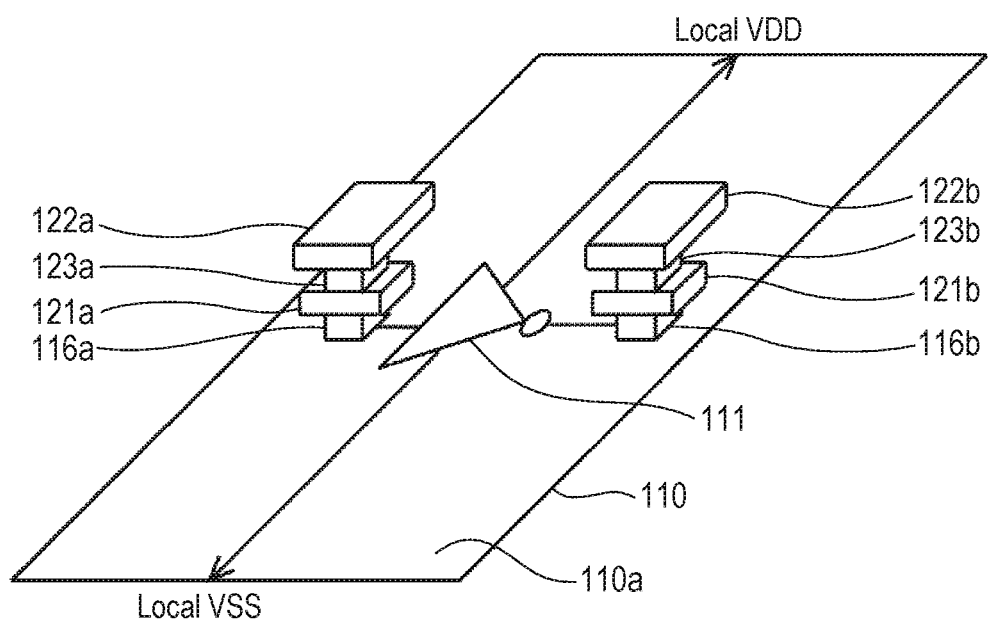
FIG. 1 is a perspective view illustrating a semiconductor device according to a first comparative example.

For improved clarity of description, the following description and drawings are omitted and simplified as appropriate. Note that, in the individual drawings, like parts are denoted by like reference numerals, and a repeated description is omitted as necessary.

First, a problem to be solved in a wiring layer for changing the function of a cell will be described using comparative examples. This allows semiconductor devices according to embodiments to be more clearly shown.

Figure 2:
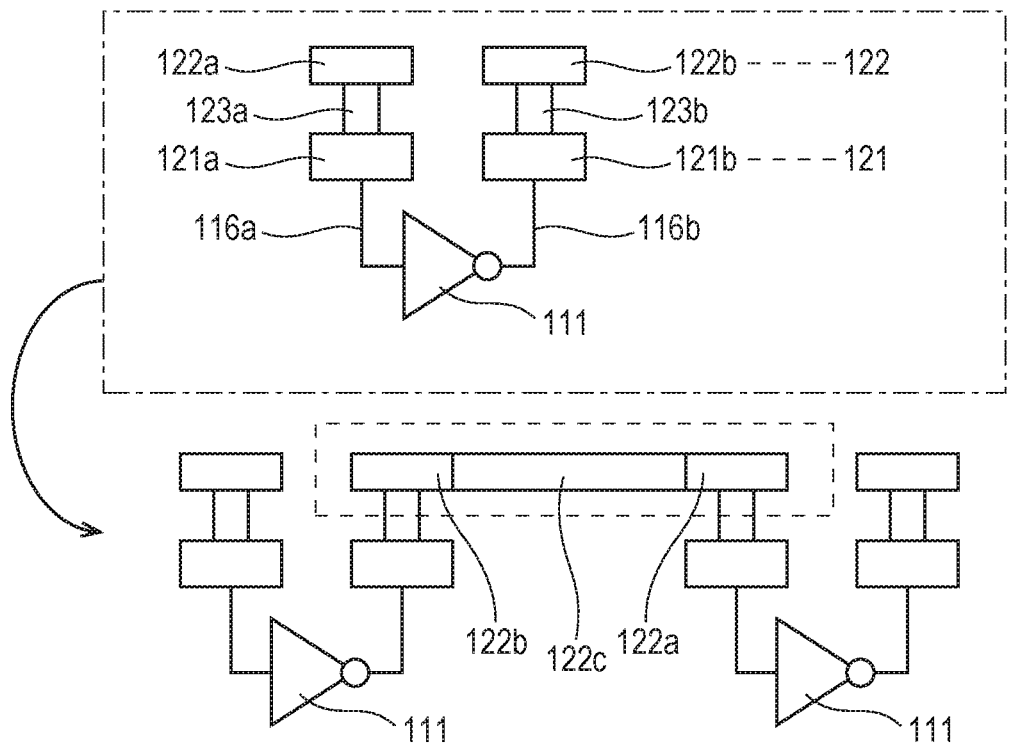
FIG. 2 is a schematic diagram illustrating the semiconductor device according to the first comparative example.

FIG. 1 is a perspective view illustrating a semiconductor device according to the first comparative example. FIG. 2 is a schematic diagram illustrating the semiconductor device according to the first comparative example. As shown in FIGS. 1 and 2, a semiconductor device 101 includes a semiconductor substrate 110, an inverter (referred to also as INV) 111, wires 121a and 121b belonging to a first wiring layer 121, wires 122a and 122b belonging to a second wiring layer 122, and vias 123a and 123b.

The first wiring layer 121 is stacked over the semiconductor substrate 110. By patterning the first wiring layer 121, the wires 121a and 121b are formed. The second wiring layer 122 is stacked over the semiconductor substrate 110 via the first wiring layer 121. By patterning the second wiring layer 122, the wires 122a and 122b are formed.

The inverter 111 is formed over the semiconductor substrate 110. The wire 122a is a signal input terminal which is coupled to the transistor included in the inverter 111 via the via 123a, the wire 121a, and a contact 116a. The wire 122b is a signal output terminal which is coupled to the transistor included in the inverter 111 via the via 123b, the wire 121b, and a contact 116b.

A cell implementing a logic such as the inverter 111, a buffer (referred to also as BUF), a NAND, or a NOR is referred to a function cell. A portion which receives and outputs a signal or the like from and to a minimum block forming the function cell is referred to as a terminal. For example, the cell having the inverter 111 shown in FIG. 1 is referred to as a function cell, while the wires 122a and 122b belonging to the second wiring layer 122 are referred to also as an input terminal and an output terminal. Note that a portion serving as a terminal may occasionally be referred to also as a wire.

As shown in FIG. 2, when the inverters 111 are coupled together, using a wire 122c belonging to the second wiring layer 122, one input terminal (wire 122a) and the other output terminal (wire 122b) are coupled together. Thus, in the semiconductor device 101 according to the comparative example 1, the input/output terminals are formed in the second wiring layer 122. In other words, the input/output terminals are lifted up to the second wiring layer 122. Accordingly, when the need arises to change the coupling of the inverter 111 for a logic change or a logic correction in the process of designing the semiconductor device 101, the patterns of wires in the wiring layers including and higher than the second wiring layer 122 are changed. This allows for a logic change or a logic correction. In this case, mask patterns for the vias 123a and 123b and the first wiring layer 121 need not be corrected to allow a reduction in manufacturing cost.

Figure 3:
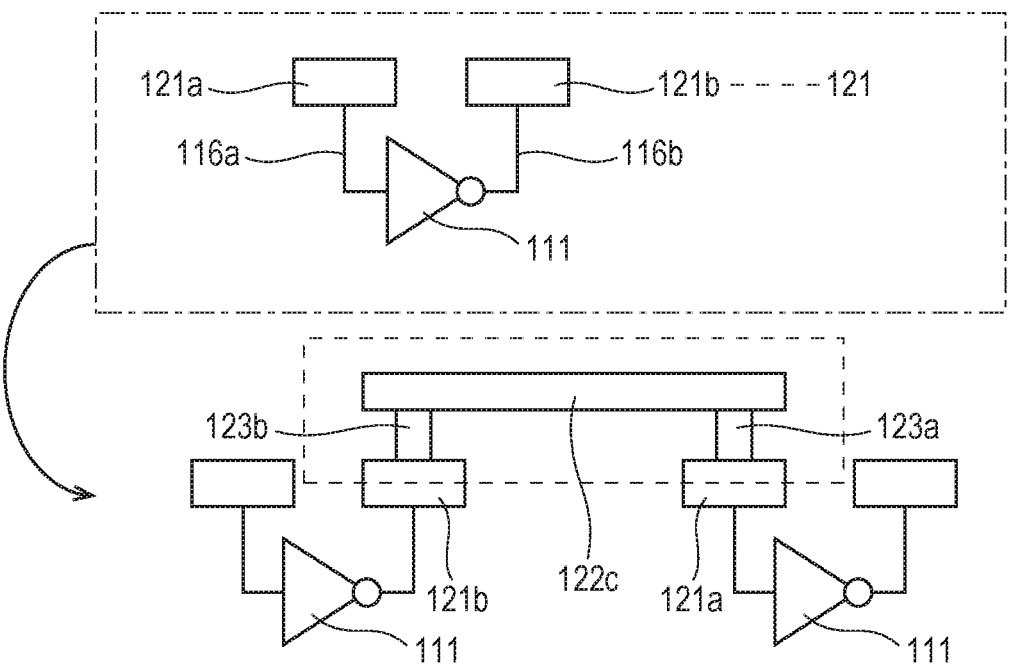
FIG. 3 is a schematic diagram illustrating a semiconductor device according to a second comparative example.

FIG. 3 is a schematic diagram illustrating a semiconductor device according to the second comparative example. As shown in FIG. 3, a semiconductor device 102 includes the inverter 111 and the wires 121a and 121b belonging to the first wiring layer 121. The wire 121a is the signal input terminal which is coupled to the transistor included in the inverter 111 via the contact 116a. The wire 121b is the signal output terminal which is coupled to the transistor included in the inverter 111 via the contact 116a. As shown in FIG. 3, when the inverters 111 are coupled together, the coupling is achieved using the wire 122c belonging to the second wiring layer 122 and the vias 123a and 123b.

In the semiconductor device 102 according to the second comparative example, the input/output terminals are formed in the first wiring layer 121. Accordingly, when the need arises to change the coupling of the inverter 111 for a logic change or a logic correction in the process of designing the semiconductor device 102, the vias 123a and 123b are additionally changed. In addition, in the case where the need arises to avoid another second wiring layer 122 formed over the first wiring layer 121 when the coupling is changed, the patterns of the vias 123a and 123b and the wires in the first wiring layer 121 are changed. This allows for a logic change or a logic correction. In this case, it is necessary to change the mask pattern for the first wiring layer 121 or for the vias 123a and 123b, which has small design rules and is relatively costly, resulting in an increased manufacturing cost. Thus, in the semiconductor device 101 in the first comparative example, by lifting up the input/output terminals to the second wiring layer 122, the mask patterns which need to be changed can be reduced compared to those in the semiconductor device 102 in the second comparative example.

However, when the inverter 111 is to be modified to another function cell, in either of the cases in the first and second comparative examples, it is necessary to remake the cell including the inverter 111. If a plurality of types of function cells are made in advance so as to be modified, the number of the cells to be provided in advance increases to increase the area occupied thereby in the semiconductor device.

Also, in either of the cases in the first and second comparative examples, a first power supply VDD and a second power supply VSS are coupled to the function cells such as the inverter 111. Consequently, a through current flowing through the function cell may cause a leakage.

Figure 4:
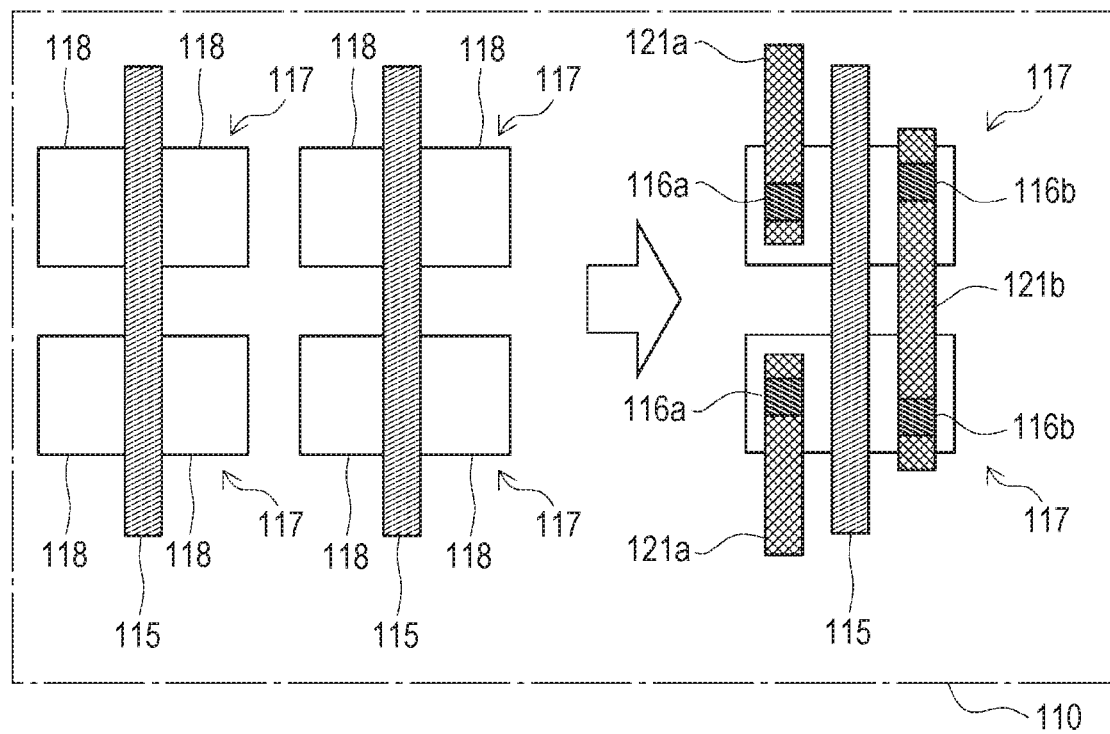
FIG. 4 is a plan view illustrating a semiconductor device according to a third comparative example.

FIG. 4 is a plan view illustrating a semiconductor device according to the third comparative example. As shown in FIG. 4, a semiconductor device 103 according to the third comparative example uses a gate array method in which a plurality of transistors 117 are formed. Each of the transistors 117 includes a gate electrode 115 formed over the semiconductor substrate 110 and diffusion layers 118 formed in the semiconductor substrate 110 located on both sides of the gate electrode 115. When the transistor 117 is to be coupled to another component, the transistor 117 is coupled thereto via the contacts 116*a* and 116*b* and the wires 121*a* and 121*b* belonging to the first wiring layer 121.

When the need arises to modify a function cell in the semiconductor device 103 and the coupling of the transistor 117 is changed, the patterns of the contacts 116*a* and 116*b* and the first wiring layer 121 are changed.

Figure 5:
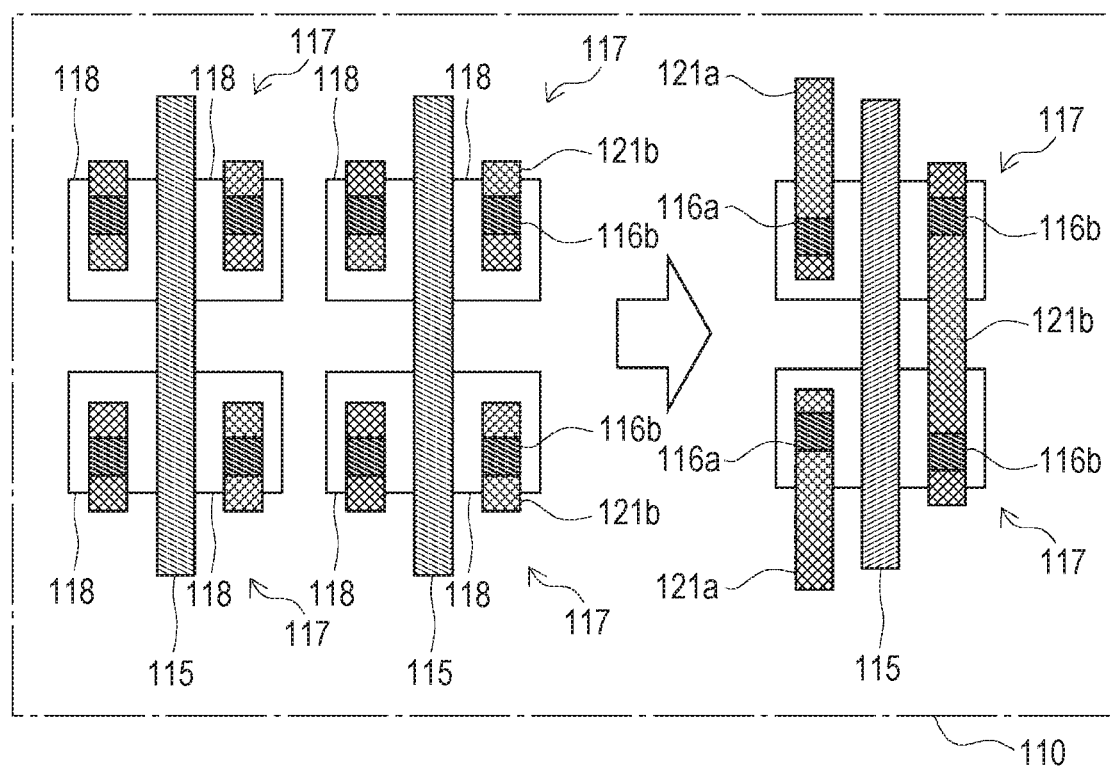
FIG. 5 is a plan view illustrating a semiconductor device according to a fourth comparative example.

FIG. 5 is a plan view illustrating a semiconductor device according to the fourth comparative example. As shown in FIG. 5, a semiconductor device 104 according to the fourth comparative example uses a gate array method in which the plurality of transistors 117 are formed. Each of the transistors 117 includes the gate electrode 115 formed over the semiconductor substrate 110, the diffusion layers 118 formed in the semiconductor substrate 110 located on both sides of the gate electrode 115, and the contacts 116*a* and 116*b*. When the transistor 117 is to be coupled to another component, the transistor 117 is coupled thereto via the wires 121*a* and 121*b* belonging to the first wiring layer 121.

When the need arises to modify a function cell in the semiconductor device 104 and the coupling of the transistor 117 is changed, the pattern of the first wiring layer 121 is changed.

In each of the semiconductor devices 103 and 104 according to the third and fourth comparative examples, in the process of designing the function cell, the first power supply VDD and the second power supply VSS need not be coupled to the first transistor 117. In this case, it is possible to inhibit the generation of a leakage due to a through current flowing through the function cell.

Also, in each of the semiconductor devices 103 and 104 according to the third and fourth comparative examples, when the inverter 111 is to be modified to another function cell, the modification of the inverter 111 is performed by changing the coupling of the transistor 117. Accordingly, there is no remaking of the transistor 117. In addition, a plurality of types of function cells need not be made in advance so as to be modified.

However, it is necessary to change the pattern of the contacts 116*a* and 116*b* coupling the transistors 117 or the pattern of the first wiring layer 121. Consequently, the mask pattern for the first wiring layer 121 may be changed to increase manufacturing cost.

FIG. 6 is a view illustrating a problem to be solved in a wiring layer for changing the function of a cell. As shown in FIG. 6, in the first comparative example (semiconductor device 101), when the function cell is modified, the modification involves changing of the patterns of the wiring layers including and higher than the second wiring layer 122. This allows a reduction in the number of masks.

However, it is necessary to provide as many cells as required by the modification of the function cell, resulting in an increased area. In addition, since the function cell is coupled to the power supplies, a leakage current may flow.

In the second comparative example (semiconductor device 102), when the function cell is modified, the modification involves changing of the patterns of the wiring layers including and higher than the first wiring layer 121 or the vias 123*a* and 123*b*, which increases the number of masks. In addition, it is necessary to provide as many cells as required by the modification of the function cell, resulting in an increased area. Moreover, since the function cell is coupled to the power supplies, a leakage current may flow.

In the third comparative example 3 (semiconductor device 103), when the function cell is modified, the modification involves changing of the patterns of the wiring layers including and higher than the contacts 116, which increases the number of masks. However, since the modification of the function cell entails mere changing of the coupling of the transistor 117, it is sufficient to provide a minimum number of cells, resulting in an area reduction. In addition, since the function cell need not be coupled to the power supplies, the generation of a leakage current is inhibited.

In the fourth comparative example (semiconductor device 104), when the function cell is modified, the modification involves changing of the patterns of the wiring layers including and higher than the first wiring layer 121, which increases the number of masks. However, since the modification of the function cell entails mere changing of the coupling of the transistor 117, it is sufficient to provide a minimum number of cells, resulting in an area reduction. In addition, since the semiconductor device need not be coupled to the power supplies, the generation of a leakage current is inhibited.

First Embodiment

Figure 7:
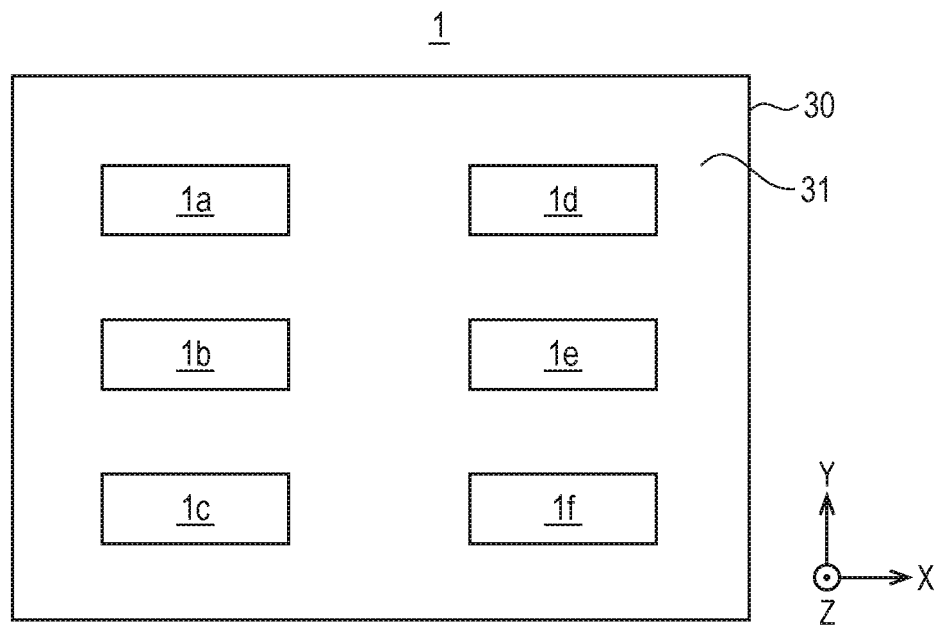
FIG. 7 is a plan view illustrating a semiconductor device according to a first embodiment.
Figure 8:
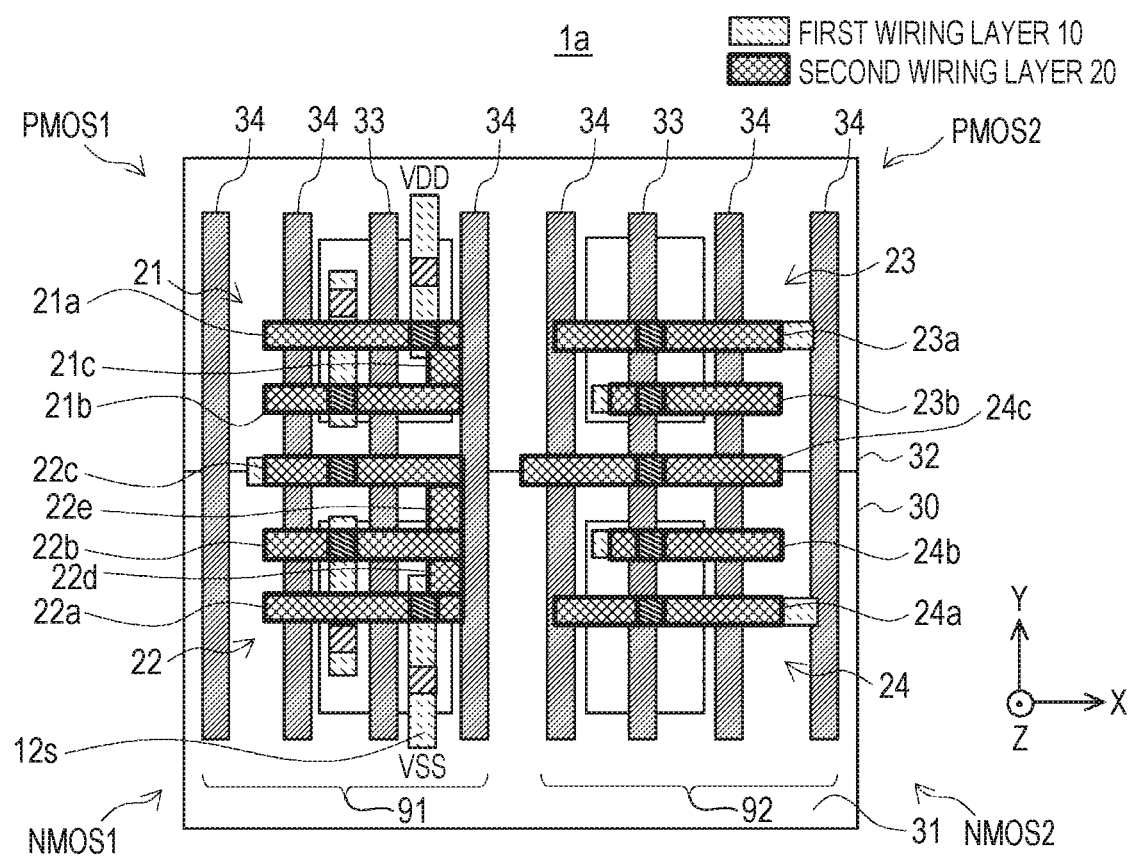
FIG. 8 is a plan view illustrating a basic cell in the semiconductor device according to the first embodiment.
Figure 9:
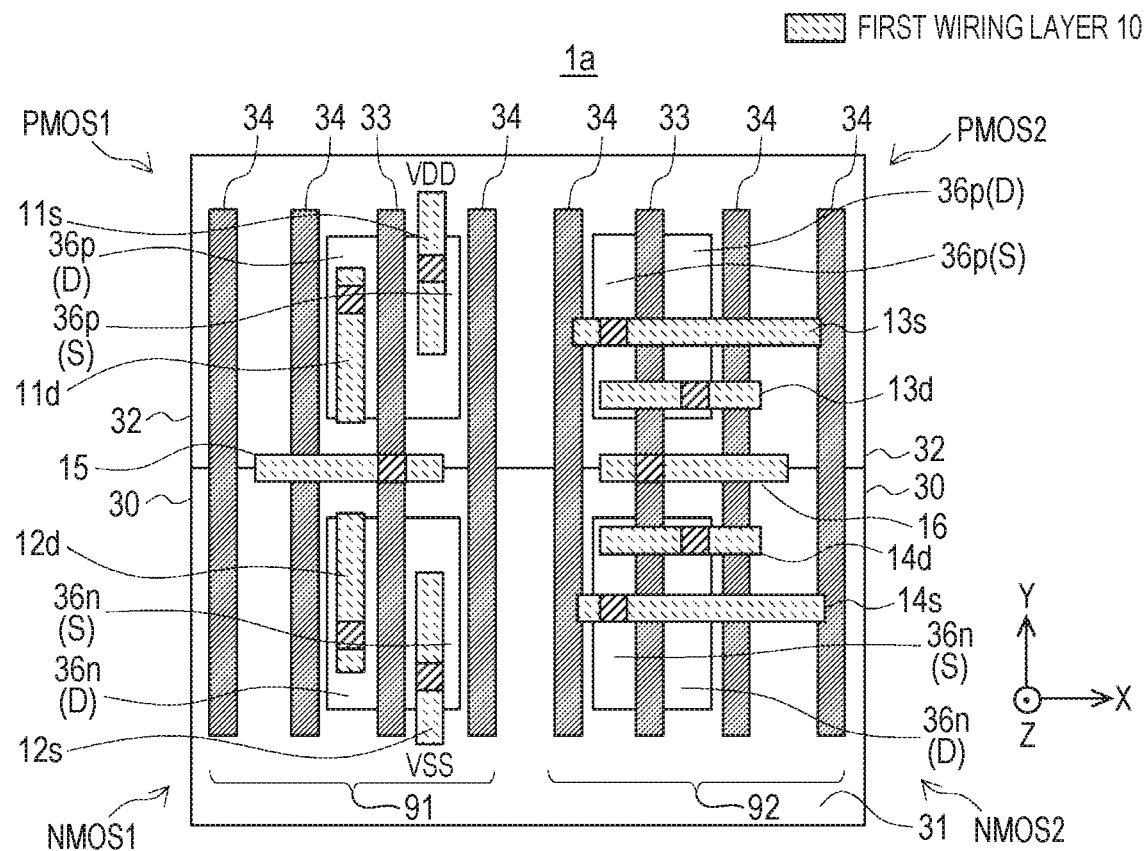
FIG. 9 is a plan view illustrating a base portion in the basic cell in the semiconductor device according to the first embodiment, in which a second wiring layer is removed from the basic cell.
Figure 10:
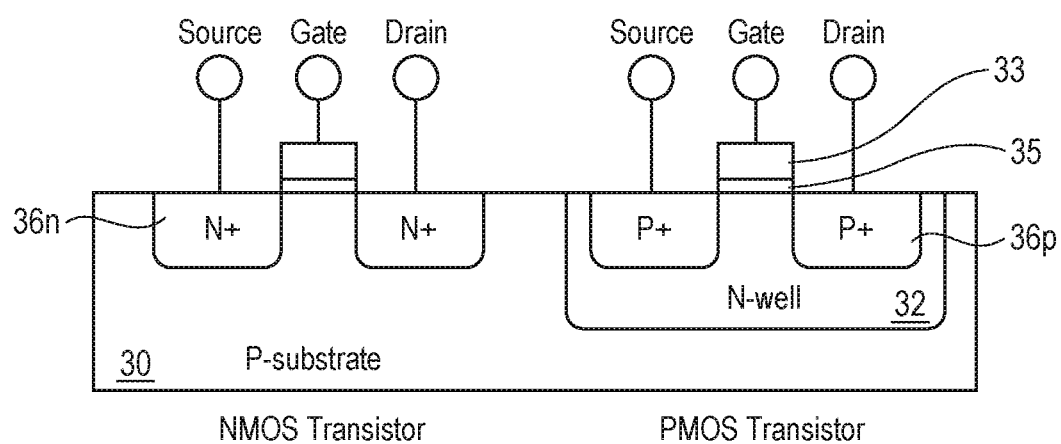
FIG. 10 is a schematic cross-sectional view illustrating a semiconductor substrate in the basic cell in the semiconductor device according to the first embodiment.

Next, a first embodiment will be described. FIG. 7 is a plan view illustrating a semiconductor device according to the first embodiment. FIG. 8 is a plan view illustrating a basic cell 1*a* in the semiconductor device according to the first embodiment. FIG. 9 is a plan view illustrating a base portion in the basic cell 1*a* in the semiconductor device according to the first embodiment, in which a second wiring layer is removed from the basic cell 1. FIG. 10 is a schematic cross-sectional view illustrating a semiconductor substrate in the basic cell 1*a* in the semiconductor device according to the first embodiment.

As shown in FIGS. 7 to 10, the semiconductor device 1 includes a semiconductor substrate 30 having a main surface 31, a first wiring layer 10 stacked over the main surface 31 of the semiconductor substrate 30 and patterned so as to include a plurality of wires, and a second wiring layer 20 stacked over the main surface 31 via the first wiring layer 10 so as to include a plurality of wires.

For the sake of convenience of description, an XYZ orthogonal coordinate axis system is introduced. It is assumed that one direction and another direction which are orthogonal to each other in a plane parallel with the main surface 31 are an X-axis direction and a Y-axis direction. It is also assumed that a direction orthogonal to the main surface 31 is a Z-axis direction. A positive Z-axis direction may be referred to also as an upward direction, while a negative Z-axis direction may be referred to also as a downward direction. Note that the terms "X-, Y-, and Z-axis directions" and "upward and downward directions" are used for the sake of convenience of description, and do not show directions when the semiconductor device 1 is used.

As shown in FIG. 7, over the main surface 31 of the semiconductor substrate 30, a plurality of cells each including wires belonging to the first wiring layer 10 and wires belonging to the second wiring layer 20 are provided. The plurality of cells may also include the basic cell 1*a*. The plurality of cells may also include at least any of an inverter cell 1*b* (referred to also as INV cell 1*b*), an INVx2 cell 1*c*, a buffer cell 1*d* (referred to also as BUF cell 1*d*), a 2NAND cell 1*e*, and a 2NOR cell 1*f* obtained by changing the pattern of the second wiring layer 20 in the basic cell 1*a*.

First, a configuration of the basic cell 1*a* will be described. The basic cell includes the first wiring layer 10 provided over the main surface 31 of the semiconductor substrate 30 and having a predetermined pattern and the second wiring layer 20 provided over the first wiring layer and having a predetermined pattern. The basic cell 1*a* refers to a cell which has a predetermined constituent unit and can be modified into a function cell such as the INV cell 1*b* by changing the pattern of the second wiring layer 20 thereof. For example, the basic cell 1*a* in the first embodiment is a cell having four transistors and can be modified into a function cell which is any of the INV cell, the INVx2 cell, the BUF cell, the 2NAND cell, the 2NOR cell, and the like by changing the wiring pattern of the second wiring layer 20.

(Base Portion in Basic Cell)

As shown in FIGS. 8 and 9, when the basic cell 1*a* is viewed from thereabove (downwardly in the positive Z-axis direction), the basic cell 1*a* has a first layout 91 and a second layout 92. The first layout 91 and the second layout 92 are disposed in juxtaposition in the X-axis direction. The second layout 92 is disposed on the positive side of the first layout 91 in the positive X-axis direction. The basic cell 1*a* is configured to have a base portion (configuration in FIG. 9) including the semiconductor substrate 30 and the first wiring layer 10, and the second wiring layer 20 provided over the base portion.

The first layout 91 includes a first transistor PMOS1 and a second transistor NMOS1 having a conductivity type different from that of the first transistor PMOS1. For example, the first transistor PMOS1 is a P-type MOS transistor. The second transistor NMOS1 is an N-type MOS transistor. In the first layout 91, the first transistor PMOS1 and the second transistor NMOS2 are disposed in juxtaposition in the Y-axis direction. The first transistor PMOS1 is disposed on the positive side of the second transistor NMOS1 in the positive Y-axis direction.

Specifically, the first layout 91 is divided across the Y-axis direction into a portion extending along the positive Y-axis direction and a portion extending along the negative Y-axis direction. In the portion of the P-type semiconductor substrate 30 extending along the positive Y-axis direction, an N-type well 32 is formed.

A gate electrode 33 is formed over the N-type well 32 and the P-type semiconductor substrate 30 so as to extend in the Y-axis direction. On the other hand, a plurality of dummy electrodes 34 are formed over the N-type well 32 and the P-type semiconductor substrate 30 so as to extend in the Y-axis direction. The gate electrode 33 and the dummy electrodes 34 are formed to be arranged in spaced-apart relation in the X-axis direction. Between the gate electrode 33 and the dummy electrode 34 and between the N-type well 32 and the P-type semiconductor substrate 30, an insulating film 35 is formed.

P-type diffusion layers 36*p* are formed in the N-type well 32 located on both sides of the gate electrode 33. The N-type well 32 covered with the gate electrode 33 is interposed between the P-type diffusion layers 36*p*. The N-type well 32 covered with the gate electrode 33 functions as a P-type channel layer. Accordingly, on the positive part of the first layout 91 in the positive Y-axis direction, the first transistor PMOS1 is formed. Of the P-type diffusion layers 36*p* on both sides of the gate electrode 33, the one P-type diffusion layer 36*p* located on the negative side of the gate electrode 33 in the negative X-axis direction is, e.g., a drain D, while the other P-type diffusion layer 36*p* located on the positive side of the gate electrode 33 in the positive X-axis direction is, e.g., a source S.

N-type diffusion layers 36*n* are formed in the P-type semiconductor substrate 30 located on both sides of the gate electrode 33. Consequently, the P-type semiconductor substrate covered with the gate electrode 33 is interposed between the N-type diffusion layers 36*n*. The P-type semiconductor substrate 30 covered with the gate electrode 33 functions as an N-type channel layer. Accordingly, on the negative part of the first layout 91 in the negative Y-axis direction, the second transistor NMOS1 is formed. Of the N-type diffusion layers 36*n* on both sides of the gate electrode 33, the one N-type diffusion layer 36*n* located on the negative side of the gate electrode 33 in the negative X-axis direction is, e.g., the drain D, while the other P-type diffusion layer 36*n* located on the positive side of the gate electrode 33 in the positive X-axis direction is, e.g., the source S.

To the source S of the first transistor PMOS1, a wire 11*s* is coupled via a contact. The wire 11*s* (first wire) couples the source S of the first transistor PMOS1 to the first power supply VDD. To the drain D of the first transistor PMOS1, a wire 11*d* (second wire) is coupled via a contact. Note that, to the first power supply VDD, as the first wire, the wire 11*d* may also be coupled. In other words, the first wire couples either one of the diffusion layers of the first transistor PMOS1 to the first power supply VDD. For example, the wire 11*s* and the wire 11*d* extend in the Y-axis direction.

To the source S of the second transistor NMOS1, a wire 12*s* is coupled via a contact. The wire 12*s* (third wire) couples the source S of the second transistor NMOS1 to the second power supply VSS. To the drain D of the second transistor NMOS1, a wire 12*d* (fourth wire) is coupled via a contact. Note that, to the second power supply VSS, as the third wire, the wire 12*d* may also be coupled. That is, the third wire couples either one of the diffusion layers of the second transistor NMOS1 to the second power supply VSS. For example, the wire 12*s* and the wire 12*d* extend in the Y-axis direction.

In the portion of the N-type well 32 closer to the negative side or edge thereof in the negative Y-axis direction, a wire 15 (fifth wire) is coupled to the shared gate electrode 33 of the first and second transistors PMOS1 and NMOS1 via a contact. Accordingly, the wire 15 is disposed between the first transistor PMOS1 and the second transistor NMOS1 in the Y-axis direction. For example, the wire 15 extends in the X-axis direction.

Thus, the first layout 91 includes the wire 11*d*, the wire 11*s*, the wire 12*d*, the wire 12*s*, and the wire 15. The wire 11*d*, the wire 11*s*, the 12*d*, the wire 12*s*, and the wire 15 belong to the first wiring layer 10 and are formed by patterning the first wiring layer 10.

The second layout 92 includes a third transistor PMOS2 and a fourth transistor NMOS2 having a conductivity type different from that of the third transistor PMOS2. For example, the third transistor PMOS2 is a P-type MOS transistor. The fourth transistor NMOS2 is an N-type MOS transistor. In the second layout 92, the third transistor PMOS2 and the fourth transistor NMOS2 are disposed in juxtaposition in the Y-axis direction. The third transistor PMOS2 is disposed on the positive side of the fourth transistor NMOS2 in the positive Y-axis direction.

Specifically, the second layout 92 is divided across the Y-axis into a portion extending along the positive Y-axis direction and a portion extending along the negative Y-axis direction. In the portion of the P-type semiconductor substrate 30 extending along the positive Y-axis direction, the N-type well 32 is formed.

The gate electrode 33 is formed over the N-type well 32 and the P-type semiconductor substrate 30 so as to extend in the Y-axis direction. On the other hand, the plurality of dummy electrodes 34 are formed over the N-type well 32 and the P-type semiconductor substrate 30 so as to extend in the Y-axis direction. The gate electrode 33 and the dummy electrodes 34 are formed to be arranged in spaced-apart relation in the X-axis direction. Between the gate electrode 33 and the dummy electrodes 34 and between the N-type well 32 and the P-type semiconductor substrate 30, the insulating film 35 is formed.

The P-type diffusion layers 36p are formed in the N-type well 32 located on both sides of the gate electrode 33. The N-type well 32 covered with the gate electrode 33 is interposed between the P-type diffusion layers 36p. The N-type well 32 covered with the gate electrode 33 functions as the P-type channel layer. Accordingly, on the positive part of the second layout 92 in the positive Y-axis direction, the third transistor PMOS2 is formed. Of the P-type diffusion layers 36p on both sides of the gate electrode 33, the one P-type diffusion layer 36p located on the positive side of the gate electrode 33 in the positive X-axis direction is, e.g., the drain D, while the other P-type diffusion layer 36p located on the negative side of the gate electrode 33 in the negative X-axis direction is, e.g., the source S.

The N-type diffusion layers 36n are formed in the P-type semiconductor substrate 30 located on both sides of the gate electrode 33. Consequently, the P-type semiconductor substrate covered with the gate electrode 33 is interposed between the N-type diffusion layers 36n. The P-type semiconductor substrate 30 covered with the gate electrode 33 functions as the N-type channel layer. Accordingly, on the negative part of the second layout 92 in the negative Y-axis direction, the fourth transistor NMOS2 is formed. Of the N-type diffusion layers 36n on both sides of the gate electrode 33, the one N-type diffusion layer 36n located on the positive side of the gate electrode 33 in the positive X-axis direction is, e.g., the drain D, while the other N-type diffusion layer 36n located on the negative side of the gate electrode 33 in the negative X-axis direction is, e.g., the source S.

To the source S of the third transistor PMOS2, a wire 13s (sixth wire) is coupled via a contact. To the drain D of the third transistor PMOS2, a wire 13d (seventh wire) is coupled via a contact. For example, the wire 13d and the wire 13s extend in the X-axis direction.

To the source S of the fourth transistor NMOS2, a wire 14s (eighth wire) is coupled via a contact. To the drain D of the fourth transistor, a wire 14d (ninth wire) is coupled via a contact. For example, the wire 14d and the wire 14s extend in the X-axis direction.

In the portion of the N-type well 32 closer to the negative side or edge thereof in the negative Y-axis direction, a wire 16 (tenth wire) is coupled to the shared gate electrode 33 of the third and fourth transistors PMOS2 and NMOS2 via a contact. Accordingly, the wire 16 is disposed between the third transistor PMOS2 and the fourth transistor NMOS2 in the Y-axis direction. For example, the wire 16 extends in the X-axis direction.

Thus, the second layout 92 includes the wire 13d, the wire 13s, the wire 14d, the wire 14s, and the wire 16. At least either one of the wire 13d and the wire 113s is coupled to either one of the diffusion layers of the third transistor. At least either one of the wire 14d and the wire 14s is coupled to either one of the diffusion layers of the fourth transistor NMOS2. The wire 13d, the wire 13s, the wire 14d, the wire 14s, and the wire 16 belong to the first wiring layer 10 and formed by patterning the first wiring layer 10. The sixth wire, the seventh wire, the eighth wire, and the ninth wire are electrically floating. In other words, the sixth wire, the seventh wire, the eighth wire, and the ninth wire are coupled neither to the first power supply VDD nor to the second power supply VSS.

(Second Wiring Layer in Basic Cell)

Next, the second wiring layer 20 in the basic cell 1a will be described. As shown in FIG. 8, the first layout 91 of the basic cell 1a has wires 21 and 22 belonging to the second wiring layer 20. The wire 21 couples together the source S and the drain D of the first transistor PMOS1 via the wires 11d and 11s. The wire 22 couples together the source S and the drain D of the second transistor NMOS1 via the wires 12d and 12s. Thus, the basic cell 1a has the wire 21 (eleventh wire) coupling together the one diffusion layer and the other diffusion layer of the first transistor PMOS1 and the wire 22 (twelfth wire) coupling together the one diffusion layer and the other diffusion layer of the second transistor NMOS1.

The wire 22 is also coupled to the gate electrode 33 of the first and second transistors PMOS1 and NMOS1 via the wire 15.

Specifically, the wire 21 includes two wires 21a and 21b extending in the X-axis direction and a wire 21c extending in the Y-axis direction and connecting the wires 21a and 21b. The wire 21a is coupled to the wire 11s in the first wiring layer 10 via a via. The wire 21b is coupled to the wire 11d in the first wiring layer 10 via a via. Thus, the wire 21 couples together the source S and the drain D of the first transistor PMOS1.

The wire 22 includes three wires 22a, 22b, and 22c extending in the X-axis direction, a wire 22d extending in the Y-axis direction and connecting the wires 22a and 22b, and a wire 22e extending in the Y-axis direction and connecting the wires 22b and 22c. The wire 22a is coupled to the wire 12s in the first wiring layer 10 via a via. The wire 22b is coupled to the wire 12d in the first wiring layer 10 via a via. Thus, the wire 22 couples together the source S and the drain D of the second transistor NMOS1. The wire 22c is coupled to the wire 15 in the first wiring layer 10 via a via. Thus, the wire couples the gate electrode 33 of the first and second transistors PMOS1 and NMOS1 to the source S and the drain D of the second transistor NMOS1.

The second layout 92 has wires 23 and 24 belonging to the second wiring layer 20. Specifically, the wire 23 includes two wires 23a and 23b extending in the X-axis direction. The wire 23a is coupled to the wire 13s in the first wiring layer 10 via a via. The wire 23b is coupled to the wire 13d in the first wiring layer 10 via a via.

The wire 24 includes three wires 24a, 24b, and 24c extending in the X-axis direction. The wire 24a is coupled to the wire 14s in the first wiring layer 10 via a via. The wire 24b is coupled to the wire 14d in the first wiring layer 10 via a via. The wire 24c is coupled to the wire 16 in the first wiring layer 10 via a via.

Thus, the basic cell 1a has the wire belonging to the second wiring layer 20, coupled to the sixth wire, and extending in the X-axis direction, the wire belonging to the second wiring layer 20, coupled to the seventh wire, and extending in the X-axis direction, the wire belonging to the second wiring layer 20, coupled to the eighth wire, and extending in the X-axis direction, the wire belonging to the second wiring layer 20, coupled to the ninth wire, and extending in the X-axis direction, and the wire belonging to the second wiring layer 20, coupled to the tenth wire, and extending in the X-axis direction.

At a design stage, by changing the pattern of the second wiring layer 20 in the basic cell 1a, the basic cell 1a can be modified into a function cell. For example, the function cell is formed by coupling together wires belonging to the respective second wiring layers 20 of the first layout 91 and the second layout 92. The function cell has such a predetermined function as to implement a logic such as an inverter, a buffer, a NAND, or a NOR. Note that the predetermined function is not limited to those implementing the logics shown above.

(INVx1 Cell)

Next, a configuration of the INVx1 (inverterx1) cell 1b will be described. Over the main surface 31 of the semiconductor device 1, the plurality of cells including the wires belonging to the first wiring layer 10 and the wires belonging to the second wiring layer 20 are provided. The plurality of cells may also include a function cell, e.g., the INV cell 1b.

Figure 11:
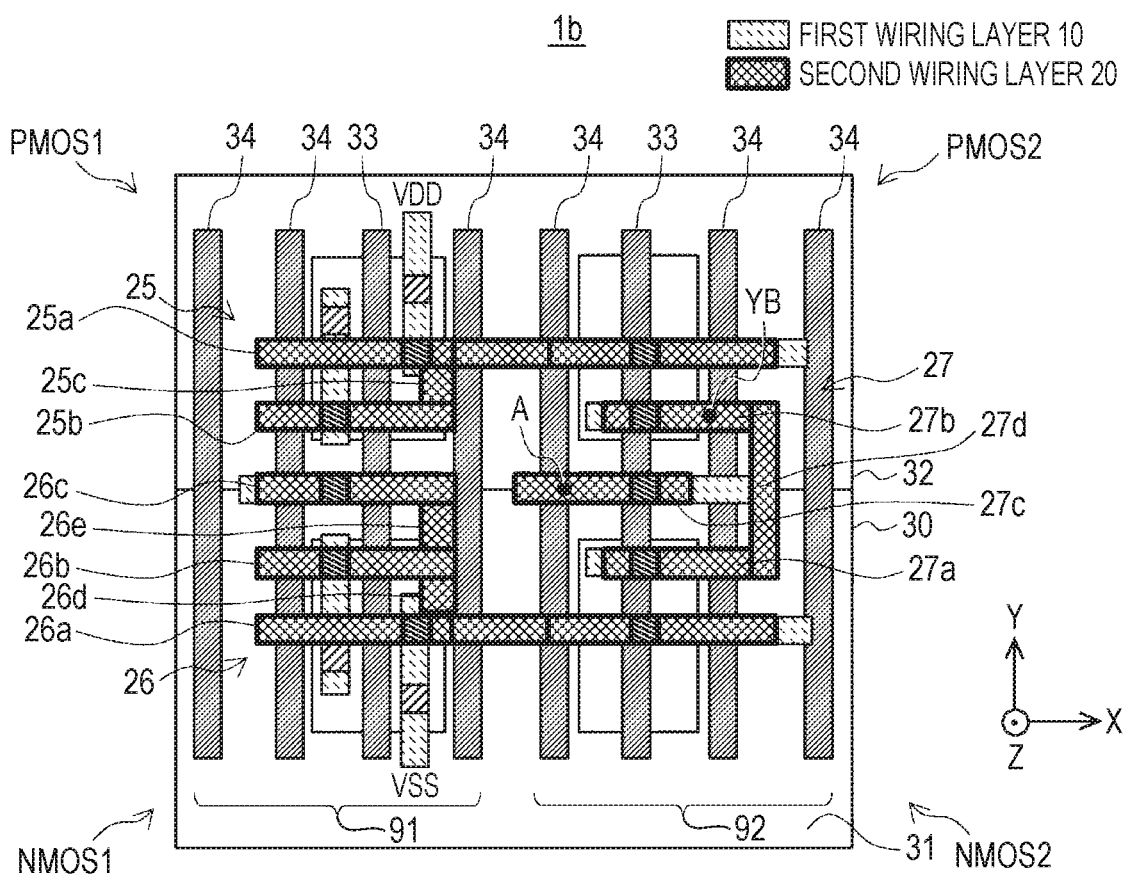
FIG. 11 is a plan view illustrating an INV cell in the semiconductor device according to the first embodiment.

FIG. 11 is a plan view illustrating the INV cell 1b in the semiconductor device according to the first embodiment. FIG. 11 also shows an equivalent circuit corresponding to the INV cell 1b. As shown in FIG. 11, when the INV cell 1b is viewed from thereabove (downwardly in the positive Z-axis direction), the INV cell 1b also has the first layout 91 and the second layout 92, similarly to the basic cell 1a. The first layout 91 and the second layout 92 are disposed in juxtaposition in the X-axis direction. The INV cell 1b is configured to have the base portion (configuration in FIG. 8) including the semiconductor substrate 30 and the first wiring layer 10), and the second wiring layer 20 provided over the base portion. A configuration of the base portion in the INV cell 1b is the same as the configuration of the base portion in the basic cell 1a described above so that a description thereof is omitted herein.

The second wiring layer 20 in the INV cell 1b will be described. As shown in FIG. 11, the INV cell 1b has wires 25, 26, and 27 belonging to the second wiring layer 20. The wire 25 couples together the source S and the drain D of the first transistor PMOS1 via the wires 11d and 11s. The wire 25 is also coupled to the source S of the third transistor PMOS2 via the wire 13s.

The wire 26 couples together the source S and the drain D of the second transistor NMOS1 via the wires 12d and 12s. The wire 26 is also coupled to the gate electrode 33 via the wire 15. The wire 26 is also coupled to the sources S of the fourth transistor NMOS2 via the wire 14s. The wire 27 couples together the drain D of the third transistor PMOS2 and the drain D of the fourth transistor NMOS2.

Thus, the INV cell 1b has the wire 25 belonging to the second wiring layer 20 and coupling together the one diffusion layer and the other diffusion layer of the first transistor PMOS1 and the other diffusion layer of the third transistor PMOS2, the wire 26 belonging to the second wiring layer 20 and coupling together the one diffusion layer and the other diffusion layer of the second transistor NMOS1, the other diffusion layer of the fourth transistor NMOS2, and the gate electrode 33 of the first and second transistors PMOS1 and NMOS1, and the wire 27 belonging to the second wiring layer 20 and coupling together the one diffusion layer of the third transistor PMOS2 and the one diffusion layer of the fourth transistor NMOS2. The INV cell 1b has the function of an inverter.

Specifically, the wire 25 includes two wires 25a and 25b extending in the X-axis direction and the wire 25c extending in the Y-axis direction and connecting the wires 25a and 25b. The wire 25a is coupled to the wires 11d and 13s in the first wiring layer 10 via vias. The wire 25b is coupled to the wire 11d in the first wiring layer 10 via a via. Thus, the wire 25 couples together the source S and the drain D of the first transistor PMOS1 and the source S of the third transistor PMOS2.

The wire 26 includes three wires 26a, 26b, and 26c extending in the X-axis direction, a wire 26d extending in the Y-axis direction and connecting the wires 26a and 26b, and a wire 26e extending in the Y-axis direction and connecting the wires 26b and 26c. The wire 26a is coupled to the wires 12s and 14s in the first wiring layer 10 via vias. The wire 26b is coupled to the wire 12d in the first wiring layer 10 via a wire. The wire 26c is coupled to the wire 15 in the first wiring layer 10 via a via. Thus, the wire 26 couples together the source S and the drain D of the second transistor NMOS1. The wire 26 also couples the gate electrode 33 of the first and second transistors PMOS1 and NMOS1 to the source S and the drain D of the second transistor NMOS1.

The wire 27 includes three wires 27a, 27b, and 27c extending in the X-axis direction and a wire 27d extending in the Y-axis direction and connecting the wires 27a and 27b. The wire 27a is coupled to the wire 14d in the first wiring layer 10 via a via. The wire 27b is coupled to the wire 13d in the first wiring layer 10 via a via. Thus, the wire 27 couples together the drain D of the third transistor PMOS2 and the drain D of the fourth transistor NMOS2. The wire 27c is coupled to the wire 16 via a via.

The wire 27c serves as an input terminal A of the INV cell 1b. The wire 27b serves as an output terminal YB of the INV cell 1b.

(INVx2 Cell)

Next, a description will be given of a configuration of the INVx2 (inverterx2) cell 1c. Over the main surface 31 of the semiconductor device 1, the plurality of cells are provided. The plurality of cells may also include the INVx2 cell 1c where x2 represents an inverter having a twofold driving capability.

FIG. 12 is a plan view illustrating the INVx2 cell 1c in the semiconductor device according to the first embodiment. FIG. 12 also shows an equivalent circuit corresponding to the INVx2 cell 1c. As shown in FIG. 12, when the INVx2 cell 1c is viewed from thereabove (downwardly in the positive Z-axis direction), the INVx2 cell 1b also has the first layout 91 and the second layout 92, similarly to the basic cell 1a. The INVx2 cell 1c is configured to have the second wiring layer 20 provided over the base portion. A configuration of the base portion in the INVx2 cell 1c is the same as the configuration of the base portion in the basic cell 1a described above so that a description thereof is omitted herein.

The second wiring layer 20 in the INVx2 cell 1c will be described. As shown in FIG. 12, the INVx2 cell 1c has wires 28a, 28b, 28c, and 41 belonging to the second wiring layer 20. The wire 28a couples together the source S of the first transistor PMOS1 and the source S of the third transistor PMOS2 via the wires 11s and 13s. The wire 28b couples together the source S of the second transistor NMOS1 and the source of the fourth transistor NMOS2 via the wires 12s and 14s. The wire 28c couples together the gate electrode 33 of the first and second transistors PMOS1 and NMOS1 and the gate electrode 33 of the third and fourth transistors PMOS2 and NMOS2 via the wires 15 and 16.

The wire 41 includes a wire 41a extending in the X-axis direction, a wire 41b extending in the X-axis direction, and a wire 41c extending in the Y-axis direction and coupling together the wires 41a and 41b. The wire 41a couples together the drain D of the second transistor NMOS1 and the drain D of the fourth transistor NMOS2 via the wires 12d and 14d. The wire 41b couples together the drain D of the first transistor PMOS1 and the drain D of the third transistor PMOS2 via the wires 11d and 13d. Thus, the wire 41 couples together the respective drains D of the first to fourth transistors. The wire 28c serves as the input terminal A of the INVx2 cell 1c. The wire 41b serves as the output terminal YB of the INVx2 cell 1c.

Thus, the INVx2 cell 1c has the wire 41 belonging to the second wiring layer 20 and coupling together the one diffusion layer of the first transistor PMOS1, the one diffusion layer of the second transistor NMOS1, the one diffusion layer of the third transistor PMOS2, and the one diffusion layer of the fourth transistor NMOS2, the wire 28a belonging to the second wiring layer 20 and coupling together the other diffusion layer of the first transistor PMOS1 and the other diffusion layer of the third transistor PMOS2, the wire 28b belonging to the second wiring layer 20 and coupling together the other diffusion layer of the second transistor NMOS1 and the other diffusion layer of the fourth transistor NMOS2, and the wire 28c belonging to the second wiring layer 20 and coupling together the gate electrode 33 of the first and second transistors PMOS1 and NMOS1 and the gate electrode 33 of the third and fourth transistors PMOS2 and NMOS2. The INVx2 cell 1c has the function of an inverter having a twofold driving capability.

(BUF Cell)

Next, a configuration of the BUF (buffer) cell 1d will be described. The plurality of cells provided over the main surface 31 of the semiconductor device 1 may also include the buffer cell 1d.

FIG. 13 is a plan view illustrating the BUF cell 1d in the semiconductor device according to the first embodiment. FIG. 13 also shows an equivalent circuit corresponding to the BUF cell 1d. As shown in FIG. 13, when the BUF cell 1d is viewed from thereabove (downwardly in the positive Z-axis direction), the BUF cell 1d also has the first layout 91 and the second layout 92, similarly to the basic cell 1a. The BUF cell 1d is configured to have the second wiring layer 20 provided over the base portion. A configuration of the base portion in the BUF cell 1d is the same as the configuration of the base portion in the basic cell 1a described above so that a description thereof is omitted.

The second wiring layer 20 in the BUF cell 1d will be described. As shown in FIG. 13, the BUF cell 1d has wires 29a, 29b, 29c, 42, and 43 belonging to the second wiring layer 20. The wire 29a couples together the source S of the first transistor PMOS1 and the source S of the third transistor PMOS2 via the wires 11s and 13s. The wire 29b couples together the source S of the second transistor NMOS1 and the source S of the fourth transistor NMOS2 via the wires 12s and 14s. The wire 29c is coupled to the gate electrode 33 of the first and second transistors PMOS1 and NMOS1 via the wire 15.

The wire 42 includes a wire 42a extending in the X-axis direction, a wire 42b extending in the X-axis direction, and a wire 42c extending in the Y-axis direction and coupling together the wires 42a and 42b. The wire 42a is coupled to the drain D of the fourth transistor NMOS2 via the wire 14d. The wire 42b is coupled to the drain D of the third transistor PMOS2 via the wire 13d. Thus, the wire 42 couples together the drain D of the third transistor PMOS2 and the drain D of the fourth transistor NMOS2.

The wire 43 includes three wires 43a, 43b, and 43c extending in the X-axis direction, a wire 43d extending in the Y-axis direction and connecting the wires 43a and 43b, and a wire 43e extending in the Y-axis direction and connecting the wires 43b and 43c. The wire 43a is coupled to the drain D of the first transistor PMOS1 via the wire 11d. The wire 43b is coupled to the gate electrode 33 of the third and fourth transistors PMOS2 and NMOS2 via the wire 16. The wire 43c is coupled to the drain D of the second transistor NMOS1 via the wire 12d. Thus, the wire 43 couples together the drain D of the first transistor PMOS1, the drain of the second transistor NMOS1, and the gate electrode 33 of the third and fourth transistors. The wire 29c serves as the input terminal A of the BUF cell 1d. The wire 42b serves as the output terminal YB of the BUF cell 1d.

Thus, the BUF cell 1d has the wire 43 belonging to the second wiring layer 20 and coupling together the one diffusion layer of the first transistor PMOS1, the one diffusion layer of the second transistor NMOS1, and the gate electrode 33 of the third and fourth transistors PMOS2 and NMOS2, the wire 29a belonging to the second wiring layer 20 and coupling together the other diffusion layer of the first transistor PMOS1 and the other diffusion layer of the third transistor PMOS2, the wire 42 belonging to the second wiring layer 20 and coupling together the one diffusion layer of the third transistor PMOS2 and the one diffusion layer of the fourth transistor NMOS2, and the wire 29b belonging to the second wiring layer 20 and coupling together the other diffusion layer of the second transistor NMOS1 and the other diffusion layer of the fourth transistor NMOS2. The BUF cell 1d has the function of a buffer.

(2NAND Cell)

Next, a configuration of the 2NAND cell 1e will be described. The plurality of cells provided over the main surface 31 of the semiconductor device 1 may also include the 2NAND cell 1e.

Figure 14:
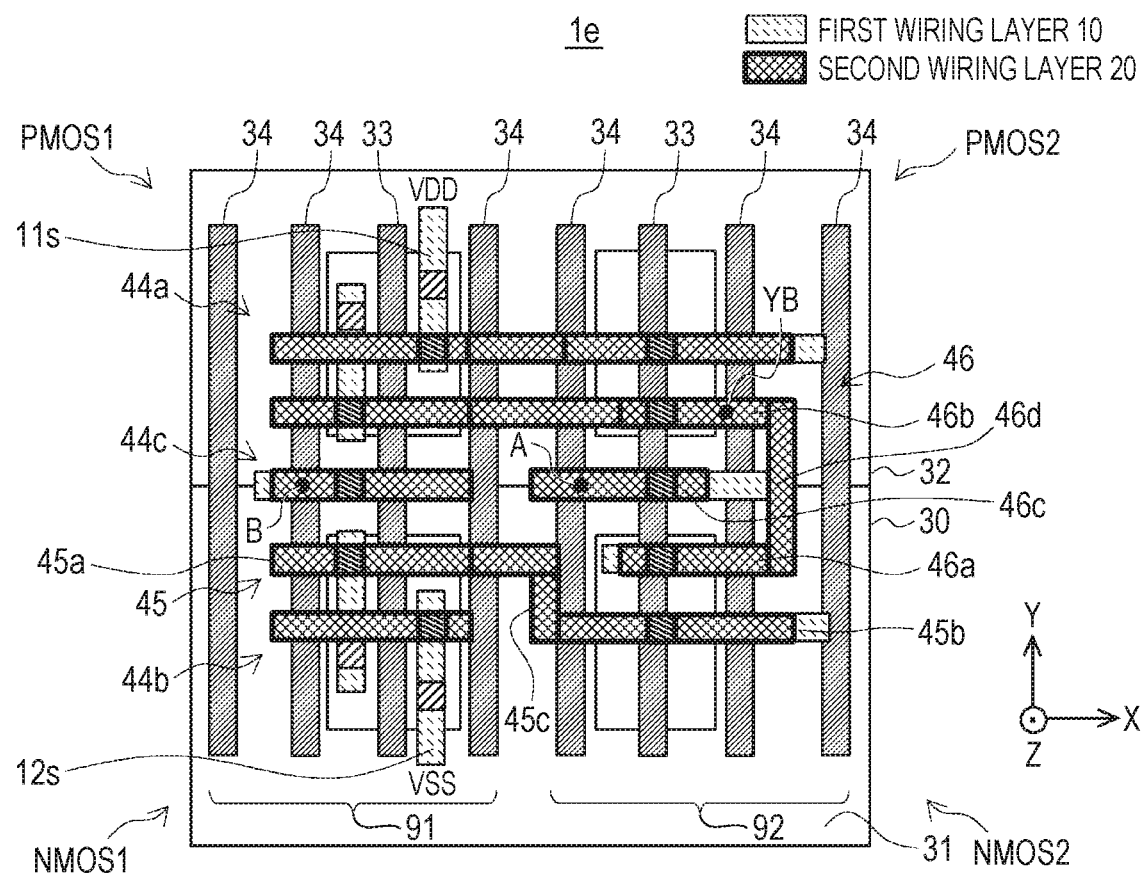
FIG. 14 is a plan view illustrating a 2NAND cell in the semiconductor device according to the first embodiment.

FIG. 14 is a plan view illustrating the 2NAND cell 1e in the semiconductor device according to the first embodiment. FIG. 14 also shows an equivalent circuit corresponding to the 2NAND cell 1e. As shown in FIG. 14, when the 2NAND cell 1e is viewed from thereabove (downwardly in the positive Z-axis direction), the 2NAND cell 1e also has the first layout 91 and the second layout 92, similarly to the basic cell 1a. The 2NAND cell 1e is configured to have the second wiring layer 20 provided over the base portion. A configuration of the base portion in the 2NAND cell 1e is the same as the configuration of the base portion in the basic cell 1a described above so that a description thereof is omitted herein.

The second wiring layer 20 in the 2NAND cell 1e will be described. As shown in FIG. 14, the 2NAND cell 1e has wires 44a, 44b, 44c, 45, and 46 belonging to the second wiring layer 20. The wire 44a couples together the source S of the first transistor PMOS1 and the source S of the third transistor PMOS2 via the wires 11s and 13s. The wire 44b is coupled to the source S of the second transistor NMOS1 via the wire 12s. The wire 44c is coupled to the gate electrode 33 of the first transistor PMOS1 and the second transistor NMOS1 via the wire 15.

The wire 45 includes a wire 45a extending in the X-axis direction, a wire 45b extending in the X-axis direction, and a wire 45c extending in the Y-axis direction and coupling together the wires 45a and 45b. The wire 45a is coupled to the drain D of the second transistor NMOS1 via the wire 12d. The wire 45b is coupled to the source S of the fourth transistor NMOS2 via the wire 14s. Thus, the wire 45 couples together the drain D of the second transistor NMOS1 and the source S of the fourth transistor NMOS2.

The wire 46 includes three wires 46a, 46b, and 46c extending in the X-axis direction and a wire 46d extending in the Y-axis direction and connecting the wires 46a and 46b. The wire 46b is coupled to the drain D of the first transistor PMOS1 and the drain of the third transistor PMOS2 via the wires 11d and 13d. The wire 46a is coupled to the drain D of the fourth transistor NMOS2 via the wire 14d. The wire 46d is coupled to the gate electrode 33 of the third and fourth transistors via the wire 16. The wires 46c and 44c serve as the input terminal A and an input terminal B of the 2NAND cell 1e. The wire 46b serves as the output terminal YB of the 2NAND cell 1e.

Thus, the 2NAND cell 1e has the wire belonging to the second wiring layer 20 and coupling together the one diffusion layer of the first transistor PMOS1, the one diffusion layer of the third transistor PMOS2, and the one diffusion layer of the fourth transistor NMOS2, the wire 45 belonging to the second wiring layer and coupling together the one diffusion layer of the second transistor NMOS1 and the other diffusion layer of the fourth transistor NMOS2, and the wire 44a belonging to the second wiring layer and coupling together the other diffusion layer of the first transistor PMOS1 and the other diffusion layer of the third transistor PMOS2. The 2NAND cell 1e has the function of a NAND.

(2NOR Cell)

Next, a configuration of the 2NOR cell 1f will be described. The plurality of cells provided over the main surface 31 of the semiconductor device 1 may also include the 2NOR cell 1f.

FIG. 15 is a plan view illustrating the 2NOR cell 1f in the semiconductor device according to the first embodiment. FIG. 15 also shows an equivalent circuit corresponding to the 2NOR cell 1f. As shown in FIG. 15, when the 2NOR cell 1f is viewed from thereabove (downwardly in the positive Z-axis direction), the 2NOR cell 1f also has the first layout 91 and the second layout 92, similarly to the basic cell 1a. The 2NOR cell 1f is configured to have the second wiring layer 20 provided over the base portion. A configuration of the base portion in the 2NOR cell 1f is the same as the configuration of the base portion in the basic cell 1a described above so that a description thereof is omitted herein.

The second wiring layer 20 in the 2NOR cell 1f will be described. As shown in FIG. 15, the 2NOR cell 1f has wires 47a, 47b, 47c, 48, and 49 belonging to the second wiring layer 20. The wire 47a is coupled to the source S of the first transistor PMOS1 via the wire 11s. The wire 47b is coupled to the source S of the second transistor NMOS1 and the source S of the fourth transistor NMOS2 via the wires 12s and 14s. The wire 47c is coupled to the gate electrode 33 of the first and second transistors PMOS1 and NMOS1 via the wire 15.

The wire 48 includes a wire 48a extending in the X-axis direction, a wire 48b extending in the X-axis direction, and a wire 48c extending in the Y-axis direction and coupling together the wires 48a and 48b. The wire 48a is coupled to the drain D of the first transistor PMOS1 via the wire 11d. The wire 48b is coupled to the source S of the third transistor PMOS2 via the wire 13s. Thus, the wire 48 couples together the drain D of the first transistor PMOS1 and the source S of the third transistor PMOS2.

The wire 49 includes three wires 49a, 49b, and 49c extending in the X-axis direction and a wire 49d extending in the Y-axis direction and connecting the wires 49a and 49b. The wire 49a is coupled to the drain D of the second transistor NMOS1 and the drain D of the fourth transistor NMOS2 via the wires 12d and 14d. The wire 49b is coupled to the drain D of the third transistor PMOS2 via the wire 13d. The wire 49d is coupled to the gate electrode 33 of the third and fourth transistors via the wire 16. The wires 49c and 47c serve as the input terminals A and B of the 2NOR cell 1f. The wire 49b serves as the output terminal YB of the 2NOR cell 1f.

Thus, the 2NOR cell 1f has the wire 48 belonging to the second wiring layer 20 and coupling together the one diffusion layer of the first transistor PMOS1 and the other diffusion layer of the third transistor PMOS2, the wire belonging to the second wiring layer 20 and coupling together the one diffusion layer of the third transistor PMOS2, the one diffusion layer of the fourth transistor NMOS2, and the one diffusion layer of the second transistor NMOS1, and the wire 47b belonging to the second wiring layer 20 and coupling together the other diffusion layer of the second transistor NMOS1 and the other diffusion layer of the fourth transistor NMOS2. The 2NOR cell 1f has the function of a NOR.

As described above, the semiconductor device 1 has the plurality of cells, e.g., any of the basic cell 1a, the INV cell 1b, the INVx2 cell 1c, the BUF cell 1d, the 2NAND cell 1e, and the 2NOR cell 1f. In some cases, the semiconductor device 1 has at least two types among these cells. For example, the semiconductor device 1 has a first cell and a second cell different from the first cell in the pattern of the second wiring layer 20. Both of the first and second cells have the first and second layouts and the base portions having the same configuration.

The semiconductor device 1 is designed using the basic cell 1a. The semiconductor device 1 includes a function cell corresponding to the basic cell 1a which is modified by changing the pattern of the second wiring layer 20 at the design stage to have a predetermined function.

Next, the effects of the first embodiment will be described. The basic cell 1a can be modified into at least one of the function cells which are the inverter, the buffer, the NAND, and the NOR by changing the wiring pattern of the second wiring layer 20. Accordingly, by disposing the basic cell 1a in a design process, it is possible to implement the function of the inverter, the buffer, the NAND, the NOR, or the like.

Figure 16:
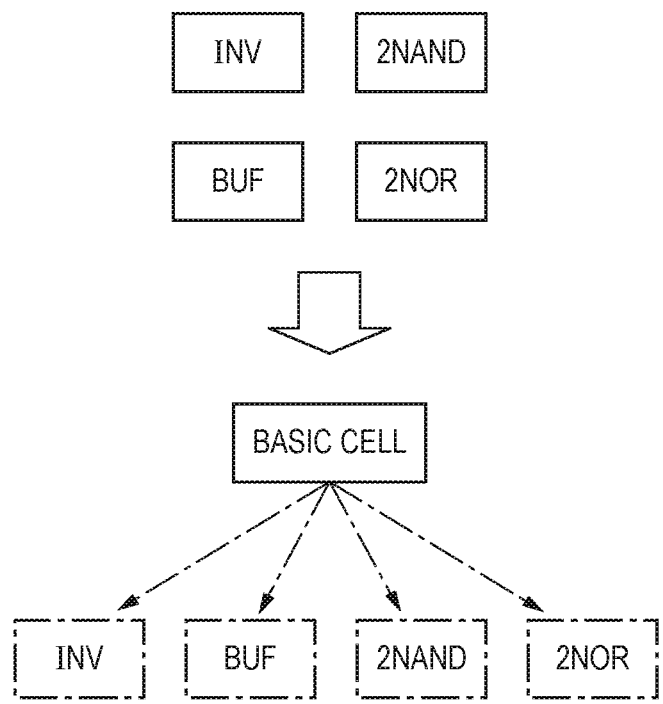
FIG. 16 is a view illustrating a modification of the basic cell in the semiconductor device according to the first embodiment.

FIG. 16 is a view illustrating a modification of the basic cell 1a in the semiconductor device according to the first embodiment. As shown in FIG. 16, in the comparative examples, extra function cells such as the inverter, the buffer, the NAND, and the NOR are produced in advance so as to be modified into the function cells such as the inverter, the buffer, the NAND, and the NOR. By contrast, in the first embodiment, by merely disposing the basic cells 1a, the basic cells 1a can be modified into the function cells such as the inverter, the buffer, the NAND, and the NOR. This can save preliminary production of the extra function cells such as the inverter, the buffer, the NAND, and the NOR such that the extra function cells are modified into the function cells. Accordingly, it is possible to reduce the area occupied by the extra cells over the main surface 31 (see FIG. 6).

In addition, even when the need arises to change the function of the basic cell 1a in the design process, the function of the basic cell 1a can successfully be changed by merely changing the wiring pattern of the second wiring layer 20. Accordingly, it is sufficient to merely change mask patterns for the wiring layers including and higher than the second wiring layer 20. It is possible to avoid the changing of mask patterns for the first wiring layer 10 and the vias, which are relatively costly. Therefore, manufacturing cost can be reduced (see FIG. 6).

Moreover, the first wire and the third wire which are coupled to the first power supply VDD and the second power supply VSS are formed in the first wiring layer 10. This can inhibit the wires to be coupled to the first and second power supplies VDD and VSS from being formed in a wiring layer which is not lower in level than the second wiring layer 20. This can reduce congestion in a specified wiring layer which is not lower in level than the second wiring layer 20. For example, in the second wiring layer 20, particularly many wires are formed. As a result, it is unnecessary to form the wires to be coupled to the first and second power supplies VDD and VSS in such a wiring layer in which many wires are formed. This can increase the unoccupied area of the main surface 31.

The second layout 92 is not coupled to the first and second power supplies VDD and VSS. Accordingly, the first wiring layer 10 and the second wiring layer 20 in the second layout 92 are electrically floating. This can inhibit the generation of a through current and inhibit a leakage current (see FIG. 6)

Figure 17:
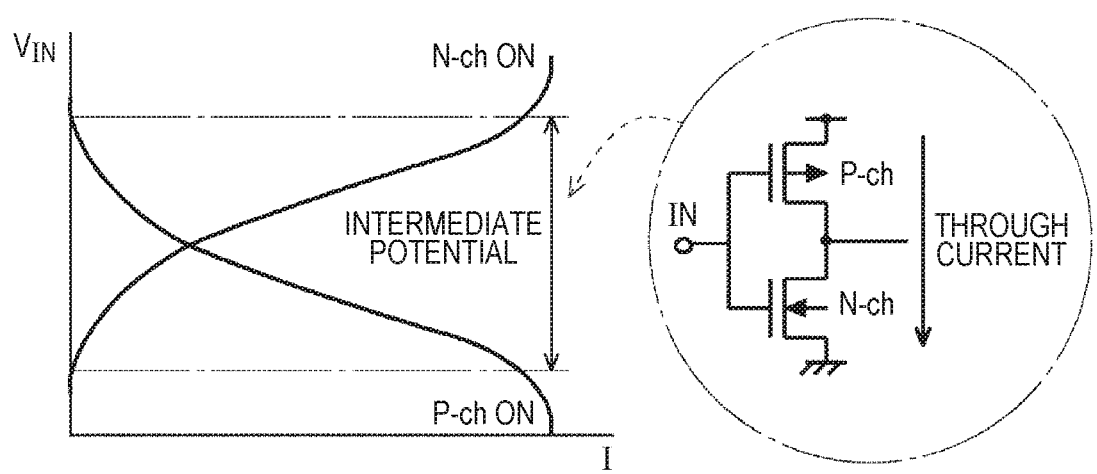
FIG. 17 is a graph illustrating the relationship between a voltage input to the semiconductor device and a current flowing therein, in which an abscissa axis represents the flowing current and an ordinate axis represents the input voltage.

FIG. 17 is a graph illustrating the relationship between a voltage input to the semiconductor device and a current flowing therein, in which the abscissa axis represents the flowing current and the ordinate axis represents the input voltage. As shown in FIG. 17, when a voltage intermediate between a High voltage and a Low voltage is input to a CMOS device, a through current is generated. The CMOS is a combination of a PMOS and an NMOS. Each of the PMOS and the NMOS is not completely turned OFF at a given voltage, but is brought into an ON state at an intermediate potential. Consequently, a current is caused to flow from a power supply to the ground, resulting in a short-circuited state. The current caused to flow at this time is referred to as the through current. When the input signal is slow in rising or falling, the input time of the intermediate potential is long. As a result, a through current may be generated to possibly cause malfunction.

However, in the present first embodiment, the second layout 92 is not coupled to the first and second power supplies VDD and VSS. Accordingly, it is possible to inhibit the generation of a leakage current resulting from the through current.

FIG. 18 is a view illustrating respective threshold voltages in the first layout 91 and the second layout 921a of the basic cell 1a in the semiconductor device 1 according to the first embodiment. As shown in FIG. 18, the respective threshold voltages of the first and second transistors PMOS1 and NMOS1 in the first layout 91 of the basic cell 1a may be higher than the respective threshold voltages of the third and fourth transistors PMOS2 and NMOS2 in the second layout 92 of the basic cell 1a. Since the first and second transistors PMOS1 and NOMS1 in the first layout 91 are coupled to the first and second power supplies VDD and VSS, a through current may be generated, and therefore the respective threshold voltages of the first and second transistors PMOS1 and NMOS1 are set high.

On the other hand, the third and fourth transistors PMOS2 and NMOS2 in the second layout 92 are coupled neither to the first power supply VDD nor to the second power supply VSS. This can inhibit the generation of the through current and therefore reduce the respective threshold voltages of the third and fourth transistors PMOS2 and NMOS2. As a result, it is possible to increase the respective operating speeds of the third and fourth transistors PMOS2 and NMOS2.

When cells having higher or lower threshold voltages are provided by controlling the threshold voltages of transistors, e.g., a cell having a higher threshold voltage has a lower operating speed and a smaller amount of leakage current. On the other hand, a cell having a lower threshold voltage has a higher operating speed and a larger amount of leakage current. Accordingly, the basic cells and the function cells that have higher and lower threshold voltages can be disposed in accordance with respective regions in the semiconductor device 1 where operating speeds are higher and lower. In addition, the basic cells and the function cells that have higher and lower threshold voltages can appropriately be disposed in first layout 91 and the second layout 92 thereof on a per layout basis. This can inhibit a leakage current in the entire semiconductor device 1 and improve the operating speed thereof.

Second Embodiment

Figure 19:
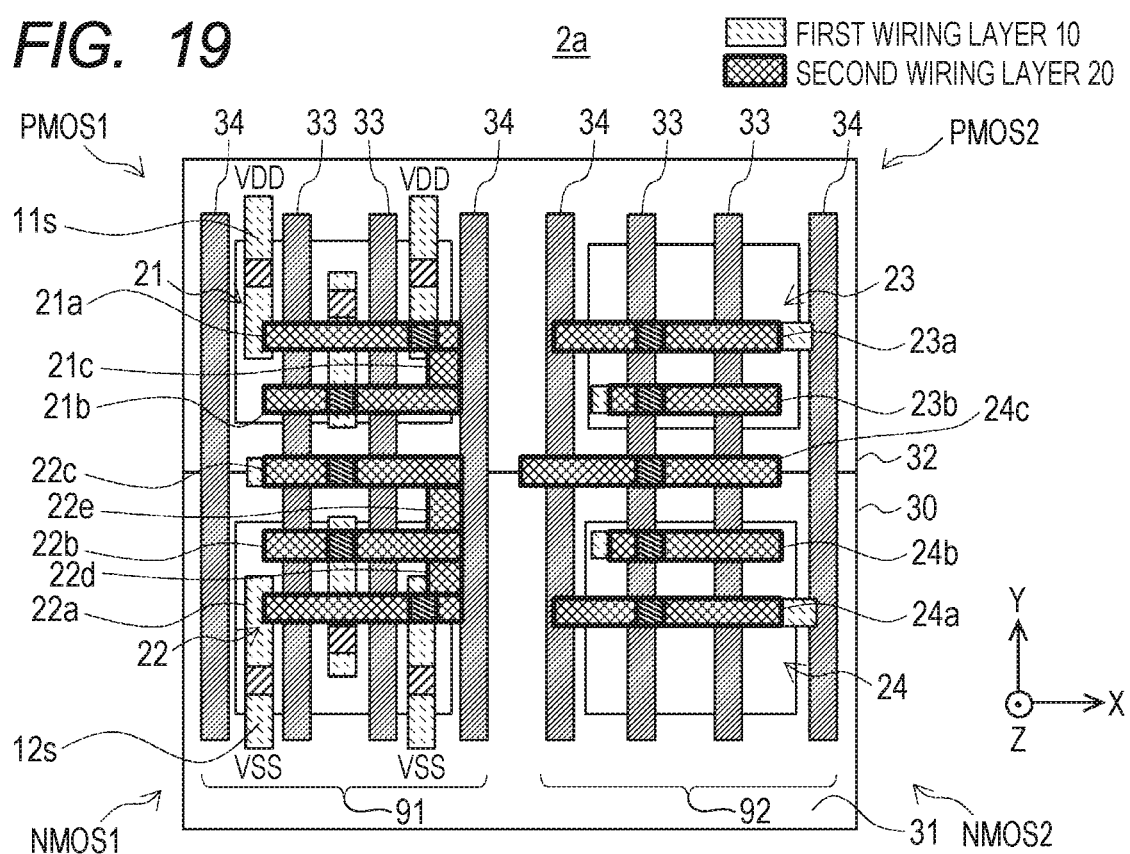
FIG. 19 is a plan view illustrating a basic cell in a semiconductor device according to a second embodiment.
Figure 20:
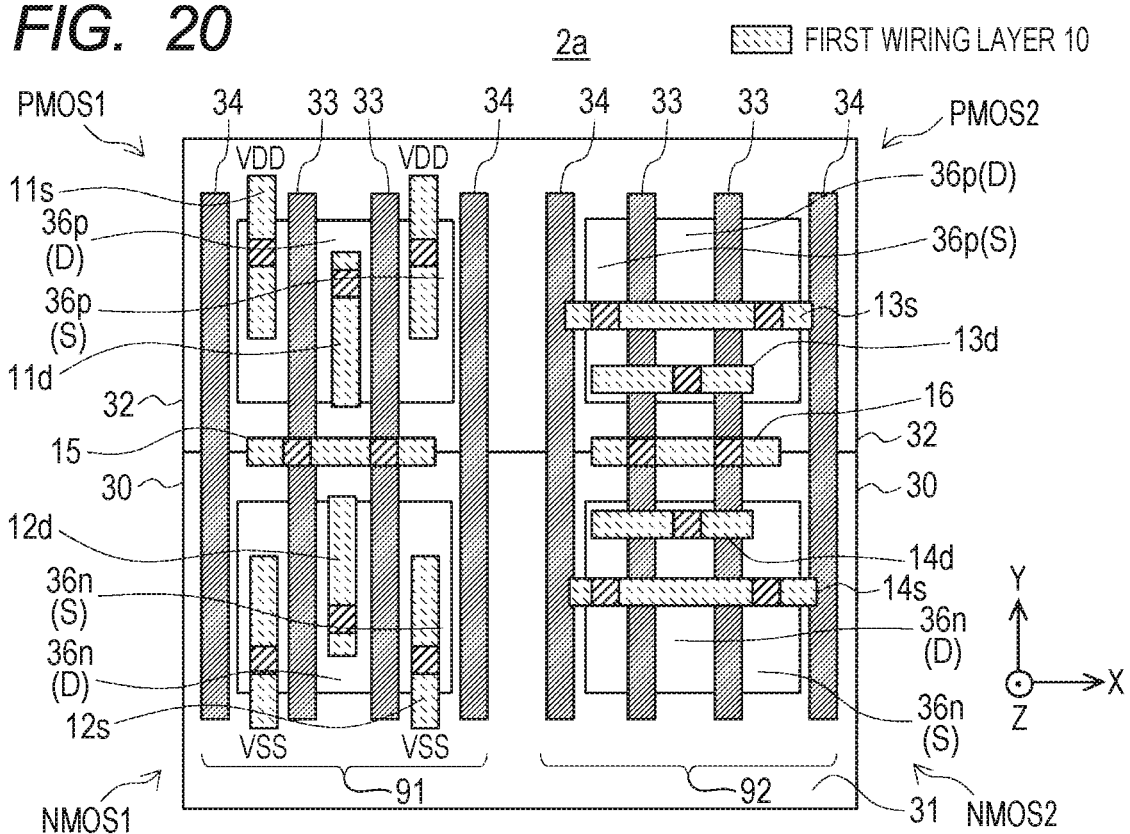
FIG. 20 is a plan view illustrating a base portion in the basic cell in the semiconductor device according to the second embodiment, in which a second wiring layer is removed from the basic cell.

Next, a second embodiment will be described. FIG. 19 is a plan view illustrating a basic cell 2a in a semiconductor device according to the second embodiment. FIG. 20 is a plan view illustrating a base portion in the basic cell 2a in the semiconductor device according to the second embodiment, in which the second wiring layer 20 is removed from the basic cell 2a.

As shown in FIGS. 19 and 20, a semiconductor device 2 includes the semiconductor substrate 30 having the main surface 31, the first wiring layer 10 stacked over the main surface 31 of the semiconductor substrate 30 and patterned so as to include the plurality of wires, and the second wiring layer 20 stacked over the main surface 31 via the first wiring layer 10 so as to include the plurality of wires. Over the main surface 31 of the semiconductor substrate 30, the plurality of cells including the wires belonging to the first wiring layer 10 and the wires belonging to the second wiring layer 20 are provided.

First, a configuration of the basic cell 2a in the second embodiment will be described. Similarly to the basic cell 1a in the first embodiment, the basic cell 2a also includes the first wiring layer 10 provided over the main surface 31 of the semiconductor substrate 30 and having a predetermined pattern and the second wiring layer 20 provided over the first wiring layer and having a predetermined pattern. The basic cell 2a in the second embodiment is a cell having eight transistors and, by changing the wiring pattern of the second wiring layer 20, the basic cell 2a can be modified into a function cell which is any of the INVx2 cell, the INVx4 cell, the BUFx2 cell, the 2NANDx2 cell, the 2NORx2 cell, and the like.

(Base Portion in Basic Cell)

As shown in FIGS. 19 and 20, when the basic cell 2a is viewed from thereabove (downwardly in the positive Z-axis direction), the basic cell 2a has the first layout 91 and the second layout 92. The first layout 91 and the second layout 92 are disposed in juxtaposition in the X-axis direction. The second layout 92 is disposed on the positive side of the first layout 91 in the positive X-axis direction. The basic cell 2a is configured to have a base portion (configuration in FIG. 20) including the semiconductor substrate 30 and the first wiring layer 10, and the second wiring layer 20 provided over the base portion.

The first layout 91 includes the two first-conductivity-type first transistors PMOS1 having one shared diffusion layer and the two second-conductivity-type second transistors NMOS1 having one shared diffusion layer. For example, the first transistors PMOS1 are P-type MOS transistors. The first transistors PMOS1 have the shared drain D. For example, the second transistors NMOS1 are N-type MOS transistors. The second transistors NMOS1 have the shared drain D. Note that, in FIGS. 19 and 20, to avoid complicated illustration, only some components are denoted by reference numerals.

In the first layout 91, the two first transistors PMOS1 having the shared drain and the two second transistors NMOS2 having the shared drain are disposed in juxtaposition in the Y-axis direction. The two first transistors PMOS1 are disposed on the positive side of the two second transistors NMOS1 in the positive Y-axis direction.

Specifically, the first layout 91 is divided across the Y-axis direction into a portion extending along the positive Y-axis direction and a portion extending along the negative Y-axis direction. In the portion of the P-type semiconductor substrate 30 extending along the positive Y-axis direction, the N-type well 32 is formed.

The two gate electrodes 33 are disposed over the N-type well 32 and the P-type semiconductor substrate 30 to extend in the Y-axis direction and be arranged in spaced-apart relation in the X-axis direction. On the other hand, the plurality of dummy electrodes 34 are formed over the N-type well 32 and the P-type semiconductor substrate 30 so as to extend in the Y-axis direction. The gate electrodes 33 and the dummy electrodes 34 are formed to be arranged in spaced-apart relation in the X-axis direction. Between the gate electrodes 33 and the dummy electrodes 34 and between the N-type well 32 and the P-type semiconductor substrate 30, the insulating film 35 is formed (see FIG. 10).

The P-type diffusion layers 36p are formed in the N-type well 32 located on both sides of the gate electrodes 33. The N-type well 32 covered with the gate electrodes 33 is interposed between the P-type diffusion layers 36p. The N-type well 32 covered with the gate electrodes 33 functions as P-type channel layers. Accordingly, on the positive part of the first layout 91 in the positive Y-axis direction, the two first transistors PMOS1 are formed. The P-type diffusion layer 36p interposed between the two gate electrodes 33 is the shared drain D of the two first transistors PMOS1, while the P-type diffusion layers 36p opposite to the drain D relative to the gate electrodes 33 interposed therebetween are the sources S of the first transistors PMOS1.

The N-type diffusion layers 36n are formed in the P-type semiconductor substrate 30 located on both sides of the gate electrodes 33. The P-type semiconductor substrate 30 covered with the gate electrodes 33 is interposed between the N-type diffusion layers 36n. The P-type semiconductor substrate 30 covered with the gate electrodes 33 functions as N-type channel layers. Accordingly, on the negative part of the first layout 91 in the negative Y-axis direction, the two second transistors NMOS1 are formed. The N-type diffusion layer 36n interposed between the two gate electrodes 33 is the shared drain D of the two second transistors NMOS1, while the N-type diffusion layers 36n opposite to the drain D relative to the gate electrodes 33 interposed therebetween are the sources S of the second transistors NMOS1.

To the respective sources S of the first transistors PMOS1, the wires 11s are coupled via contacts. The wires 11s (first wires) couple the respective other diffusion layers (e.g., sources S) of the first transistors PMOS1 to the first power supply VDD. To the drain D of the first transistors PMOS1, the wire 11d (second wire) is coupled via a contact. Note that, to the first power supply VDD, as the first wire, the wire 11d may also be coupled. For example, the wires 11s and the wire 11d extend in the Y-axis direction.

To the respective sources S of the second transistors NMOS1, the wires 12s are coupled via contacts. The wires 12s (third wires) couple the respective other diffusion layers (e.g., sources S) of the second transistors NMOS1 to the second power supply VSS. To the drain D of the second transistors NMOS1, the wire 12d (fourth wire) is coupled via a contact. Note that, to the second power supply VSS, as the third wire, the wire 12d may also be coupled. For example, the wires 12s and the wire 12d extend in the Y-axis direction.

In the portion of the N-type well 32 closer to the negative side or edge thereof in the negative Y-axis direction, the wire 15 (fifth wire) is coupled to the gate electrodes 33 of the two first transistors PMOS1 and the two second transistors NMOS1 via contacts. Accordingly, the wire 15 is disposed between the first transistors PMOS1 and the second transistors NMOS1 in the Y-axis direction. For example, the wire 15 extends in the X-axis direction.

Thus, the first layout 91 includes the wire 11d, the two wires 11s, the wire 12d, the two wires 12s, and the wire 15. The wire 11d, the two wires 11s, the wire 12d, the two wires 12s, and the wire 15 belong to the first wiring layer 10 and are formed by patterning the first wiring layer 10.

The second layout 92 includes the two first-conductivity-type third transistors PMOS2 having one shared diffusion layer and the two second-conductivity-type fourth transistors NMOS2 having one shared diffusion layer. For example, the third transistors PMOS2 are P-type MOS transistors. The third transistors PMOS2 have the shared drain D. For example, the fourth transistors NMOS2 are N-type MOS transistors. The fourth transistors NMOS2 have the shared drain D.

In the second layout 92, the two third transistors PMOS2 having the shared drain and the two fourth transistors NMOS2 having the shared drain are disposed in juxtaposition in the Y-axis direction. The two third transistors PMOS2 are disposed on the positive side of the two fourth transistors NMOS2 in the positive Y-axis direction.

Specifically, the second layout 92 is divided across the Y-axis direction into the portion extending along the positive Y-axis direction and the portion extending along the negative Y-axis direction. In the portion of the P-type semiconductor substrate 30 extending along the positive Y-axis direction, the N-type well 32 is formed.

The two gate electrodes 33 are disposed over the N-type well 32 and the P-type semiconductor substrate 30 to extend in the Y-axis direction and be arranged in spaced-apart relation in the X-axis direction. On the other hand, the plurality of dummy electrodes 34 are formed over the N-type well 32 and the P-type semiconductor substrate 30 so as to extend in the Y-axis direction. The gate electrodes 33 and the dummy electrodes 34 are formed to be arranged in spaced-apart relation in the X-axis direction. Between the gate electrodes 33 and the dummy electrodes 34 and between the N-type well 32 and the P-type semiconductor substrate 30, the insulating film 35 is formed (see FIG. 10).

The P-type diffusion layers 36p are formed in the N-type well 32 located on both sides of the gate electrodes 33. The N-type well 32 covered with the gate electrodes 33 is interposed between the P-type diffusion layers 36p. The N-type well 32 covered with the gate electrodes 33 functions as the P-type channel layers. Accordingly, on the positive part of the second layout 92 in the positive Y-axis direction, the two third transistors PMOS2 are formed. The P-type diffusion layer 36p interposed between the two gate electrodes 33 is the shared drain D of the two third transistors PMOS2, while the P-type diffusion layers 36p opposite to the drain D relative to the gate electrodes 33 interposed therebetween are the sources S of the third transistors PMOS2.

The N-type diffusion layers 36n are formed in the P-type semiconductor substrate 30 located on both sides of the gate electrodes 33. Consequently, the P-type semiconductor substrate 30 covered with the gate electrodes 33 is interposed between the N-type diffusion layers 36n. The P-type semiconductor substrate 30 covered with the gate electrodes 33 functions as the N-type channel layers. Accordingly, on the negative part of the second layout 92 in the negative Y-axis direction, the two fourth transistors NMOS2 are formed. The N-type diffusion layer 36n interposed between the two gate electrodes 33 is the shared drain D of the two fourth transistors NMOS2, while the N-type diffusion layers 36n opposite to the drain D relative to the gate electrodes 33 interposed therebetween are the sources S of the fourth transistors NMOS2.

To the respective sources S of the third transistors PMOS2, the wire 13s (sixth wire) is coupled via contacts. Consequently, the wire 13s couples together the respective other diffusion layers (e.g., sources S) of the third transistors PMOS2. To the drain D of the third transistors PMOS2, the wire 13d (seventh wire) is coupled via a contact. For example, the wire 13d and the wire 13s extend in the X-axis direction.

To the respective sources S of the fourth transistors NMOS2, the wire 14s (eighth wire) is coupled via contacts. Consequently, the wire 14s couples together the respective other diffusion layers (e.g., sources S) of the fourth transistors NMOS2. To the drain D of the fourth transistors NMOS2, the wire 14d (ninth wire) is coupled via a contact. For example, the wire 14d and the wire 14s extend in the X-axis direction.

In the portion of the N-type well 32 closer to the negative side or edge thereof in the negative Y-axis direction, the wire 16 (tenth wire) is coupled to the shared gate electrodes 33 of the two third transistors PMOS2 and the two fourth transistors NMOS2 via contacts. For example, the wire 16 extends in the X-axis direction.

Thus, the second layout 92 includes the wire 13d, the wire 13s, the wire 14d, the wire 14s, and the wire 16. The wire 13d, the wire 13s, the wire 14d, the wire 14s, and the wire 16 belong to the first wiring layer 10 and are formed by patterning the first wiring layer 10. The wire 13s (sixth wire), the wire 13d (seventh wire), the wire 14s (eighth wires), and the wire 14d (ninth wire) are electrically floating. In other words, the wire 13s (sixth wire), the wire 13d (seventh wire), the wire 14s (eighth wire), and the wire 14d (ninth wire) are coupled neither to the first power supply VDD nor to the second power supply VSS.

(Second Wiring Layer in Basic Cell)

Next, the second wiring layer 20 in the basic cell 2a will be described. As shown in FIG. 19, the first layout 91 of the basic cell 2a has the wires 21 and 22 belonging to the second wiring layer 20. The wire 21 couples together the sources S and the drains D of the first transistors PMOS1 via the wires 11d and 11s. The wire 22 couples together the sources S and the drains D of the second transistors NMOS1 via the wires 12d and 12s. Thus, the first layout 91 has the wire coupling together the one diffusion layers and the other diffusion layers of the first transistors PMOS1 and the wire coupling together the one diffusion layers and the other diffusion layers of the second transistors NMOS1.

The wire 22 is also coupled to the gate electrodes 33 of the first and second transistors PMOS1 and NMOS1 via the wire 15.

Specifically, the wire 21 includes the two wires 21a and 21b extending in the X-axis direction and the wire 21c extending in the Y-axis direction and connecting the wires 21a and 21b. The wire 21a is coupled to the wires 11s in the first wiring layer 10 via vias. The wire 21b is coupled to the wire 11d in the first wiring layer 10 via a via. Thus, the wire 21 couples together the sources S and the drains D of the first transistors PMOS1.

The wire 22 includes the three wires 22a, 22b, and 22c extending in the X-axis direction, the wire 22d extending in the Y-axis direction and connecting the wires 22a and 22b, and the wire 22e extending in the Y-axis direction and connecting the wires 22b and 22c. The wire 22a is coupled to the wires 12s in the first wiring layer 10 via vias. The wire 22b is coupled to the wire 12d in the first wiring layer 10 via a via. Thus, the wire 22 couples together the sources S and the drains D of the second transistors NMOS1. The wire 22c is coupled to the wire 15 in the first wiring layer 10 via a via. Thus, the wire 22 couples the gate electrodes 33 of the first and second transistors PMOS1 and NMOS1 to the sources S and the drains D of the second transistors NMOS1.

The second layout 92 has the wires 23 and 24 belonging to the second wiring layer 20. Specifically, the wire 23 includes the two wires 23a and 23b extending in the X-axis direction. The wire 23a is coupled to the wire 13s in the first wiring layer 10 via a via. The wire 23b is coupled to the wire 13d in the first wiring layer 10 via a via.

The wire 24 includes the three wires 24a, 24b, and 24c extending in the X-axis direction. The wire 24a is coupled to the wire 14s in the first wiring layer 10 via a via. The wire 24b is coupled to the wire 14d in the first wiring layer 10 via a via. The wire 24c is coupled to the wire 16 in the first wiring layer 10 via a via.

Thus, the basic cell 2a has the wire belonging to the second wiring layer 20, coupled to the sixth wire, and extending in the X-axis direction, the wire belonging to the second wiring layer 20, coupled to the seventh wire, and extending in the X-axis direction, the wire belonging to the second wiring layer 20, coupled to the eighth wire, and extending in the X-axis direction, the wire belonging to the second wiring layer 20, coupled to the ninth wire, and extending in the X-axis direction, and the wire belonging to the second wiring layer 20, coupled to the tenth wire, and extending in the X-axis direction. At a design stage, by changing the pattern of the second wiring layer 20 in the basic cell 2a, the basic cell 2a can be modified into a function cell.

(INVx2 Cell)

Next, a configuration of the INVx2 (inverterx2) cell 2b will be described. Over the main surface 31 of the semiconductor device 2, the plurality of cells including the wires belonging to the first wiring layer 10 and the wires belonging to the second wiring layer 20 are provided. The plurality of cells may also include a function cell, e.g., the INVx2 cell 2b.

Figure 21:
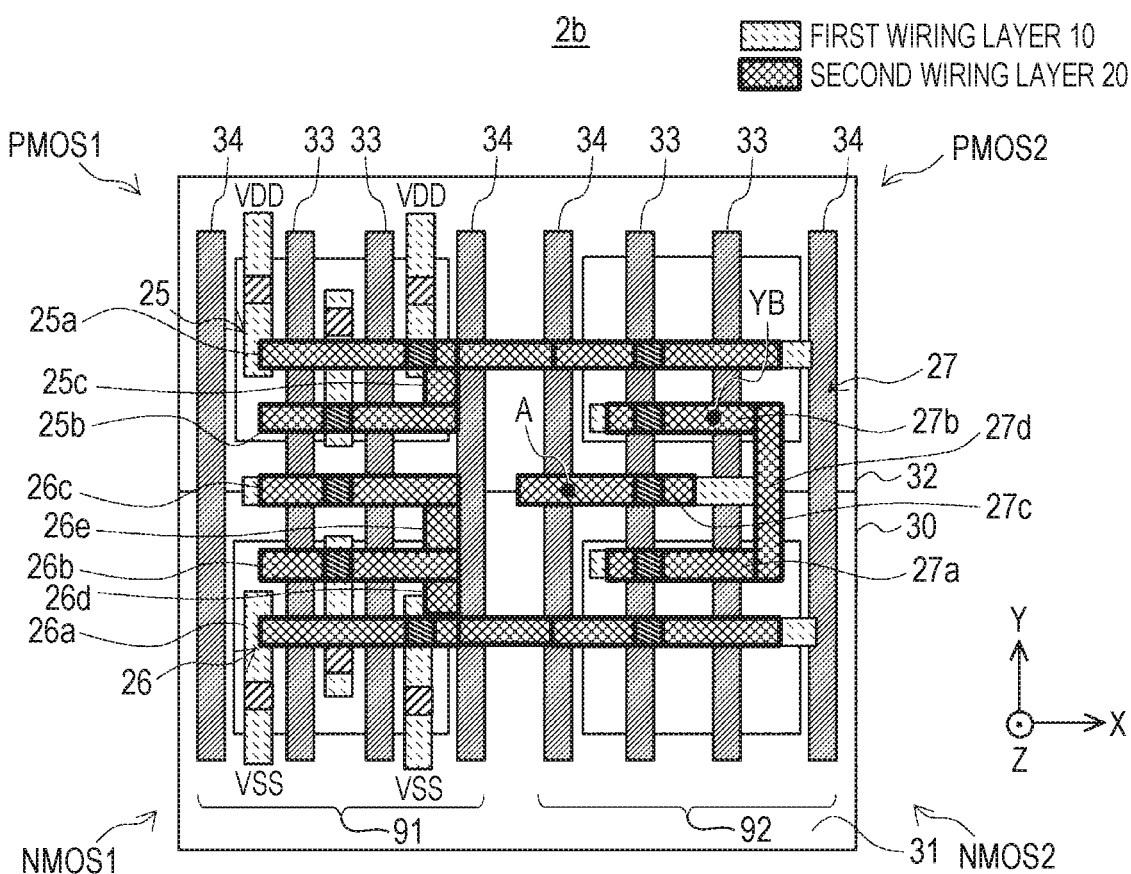
FIG. 21 is a plan view illustrating the INVx2 cell in the semiconductor device according to the second embodiment.

FIG. 21 is a plan view illustrating the INVx2 cell 2b in the semiconductor device according to the second embodiment. FIG. 21 also shows an equivalent circuit corresponding to the INVx2 cell 2b. As shown in FIG. 21, when the INVx2 cell 2b is viewed from thereabove (downwardly in the positive Z-axis direction), the INVx2 cell 2b also has the first layout 91 and the second layout 92, similarly to the basic cell 2a. The first layout 91 and the second layout 92 are disposed in juxtaposition in the X-axis direction. The INVx2 cell 2b is configured to have a base portion (configuration in FIG. 20) including the semiconductor substrate 30 and the first wiring layer 10), and the second wiring layer 20 provided over the base portion. A configuration of the base portion in the INVx2 cell 2b is the same as the configuration of the base portion in the basic cell 2a described above so that a description thereof is omitted herein.

The second wiring layer 20 in the INVx2 cell 2b will be described. As shown in FIG. 21, the INVx2 cell 2b has the wires 25, 26, and 27 belonging to the second wiring layer 20. The wire 25 couples together the sources S and the drains D of the first transistors PMOS1 via the wires 11d and 11s. The wire 25 is also coupled to the sources S of the third transistors PMOS2 via the wire 13s.

The wire 26 couples together the sources S and the drains D of the second transistors NMOS1 via the wires 12d and 12s. The wire 26 is also coupled to the gate electrodes 33 via the wire 15. The wire 26 is also coupled to the sources S of the fourth transistors NMOS2 via the wire 14s. The wire 27 couples together the drains D of the third transistors PMOS2 and the drains D of the fourth transistors NMOS2 via the wires 13d and 14d.

Thus, the INVx2 cell 2b has the wire 25 belonging to the second wiring layer 20 and coupling together the one diffusion layers and the other diffusion layers of the first transistors PMOS1 and the other diffusion layers of the third transistors PMOS2, the wire 26 belonging to the second wiring layer 20 and coupling together the one diffusion layers and the other diffusion layers of the second transistors NMOS1, the other diffusion layers of the fourth transistors NMOS2, and the gate electrodes 33 of the first and second transistors PMOS1 and NMOS1, and the wire belonging to the second wiring layer 20 and coupling together the one diffusion layers of the third transistors PMOS2 and the one diffusion layers of the fourth transistors NMOS2. The INVx2 cell 2b has the function of an inverter having a twofold driving capability.

Specifically, the wire 25 includes the two wires 25a and 25b extending in the X-axis direction and a wire 25c connecting the wires 25a and 25b and extending in the Y-axis direction. The wire 25a is coupled to the wires 11s and 13s in the first wiring layer 10 via vias. The wire 25b is coupled to the wire 11d in the first wiring layer 10 via a via. Thus, the wire 25 couples together the sources S and the drains D of the first transistors PMOS1 and the sources S of the third transistors PMOS2.

The wire 26 includes the three wires 26a, 26b, and 26c extending in the X-axis direction, the wire 26d extending in the Y-axis direction and connecting the wires 26a and 26b, and the wire 26e extending in the Y-axis direction and connecting the wires 26b and 26c. The wire 26a is coupled to the wires 12s and 14s in the first wiring layer 10 via vias. The wire 26b is coupled to the wire 12d in the first wiring layer 10 via a wire. The wire 26c is coupled to the wire 15 in the first wiring layer 10 via a via. Thus, the wire 26 couples together the sources S and the drains D of the second transistors NMOS1. The wire 26 also couples the sources S of the fourth transistors NMOS2 and the gate electrodes 33 of the first and second transistors PMOS1 and NMOS1 to the sources S and the drains D of the second transistors NMOS1.

The wire 27 includes the three wires 27a, 27b, and 27c extending in the X-axis direction and the wire 27d extending in the Y-axis direction. The wire 27a is coupled to the wire 14d in the first wiring layer 10 via a via. The wire 27b is coupled to the wire 13d in the first wiring layer 10 via a via. Thus, the wire 27 couples together the drains D of the third transistors PMOS2 and the drains D of the fourth transistors NMOS. The wire 27c is coupled to the wire 16 via a via.

The wire 27c serves as the input terminal A of the INVx2 cell 2b. The wire 27b serves as the output terminal YB of the INVx2 cell 2b.

(INVx4 Cell)

Next, a description will be given of a configuration of the INVx4 (inverterx4) cell 2c. Over the main surface 31 of the semiconductor device 2, the plurality of cells are provided. The plurality of cells may also include the INVx4 cell 2c where x4 represents an inverter having a fourfold driving capability.

FIG. 22 is a plan view illustrating the INVx4 cell 2c in the semiconductor device according to the second embodiment. FIG. 22 also shows an equivalent circuit corresponding to the INVx4 cell 2c. As shown in FIG. 22, when the INVx4 cell 2c is viewed from thereabove (downwardly in the positive Z-axis direction), the INVx4 cell 2c also has the first layout 91 and the second layout 92, similarly to the basic cell 2a. The INVx4 cell 2c is configured to have the second wiring layer 20 provided over a base portion. A configuration of the base portion in the INVx4 cell 2c is the same as the configuration of the base portion in the basic cell 2a described above so that a description thereof is omitted herein.

The second wiring layer 20 in the INVx4 cell 2c will be described. As shown in FIG. 22, the INVx4 cell 2c has the wires 28a, 28b, 28c, and 41 belonging to the second wiring layer 20. The wire 28a couples together the sources S of the first transistors PMOS1 and the sources S of the third transistors PMOS2 via the wires 11s and 13s. The wire 28b couples together the sources S of the second transistors NMOS1 and the sources of the fourth transistors NMOS2 via the wires 12s and 14s. The wire 28c couples together the gate electrodes 33 of the first and second transistors PMOS1 and NMOS1 via the wires 15 and 16.

The wire 41 includes the wire 41a extending in the X-axis direction, the wire 41b extending in the X-axis direction, and the wire 41c extending in the Y-axis direction and coupling together the wires 41a and 41b. The wire 41a couples together the drains D of the second transistors NMOS1 and the drains D of the fourth transistors NMOS2 via the wires 12d and 14d. The wire 41b couples together the drains D of the first transistors PMOS1 and the drains D of the third transistors PMOS2 via the wires 11d and 13d. Thus, the wire 41 couples together the respective drains D of the first to fourth transistors. The wire 28c serves as the input terminal A of the INVx4 cell 2c. The wire 41b serves as the output terminal YB of the INVx4 cell 2c.

Thus, the INVx4 cell 2c has the wire 41 belonging to the second wiring layer 20 and coupling together the one diffusion layers of the first transistors PMOS1, the one diffusion layers of the second transistors NMOS1, the one diffusion layers of the third transistors PMOS2, and the one diffusion layers of the fourth transistors NMOS2, the wire 28a belonging to the second wiring layer 20 and coupling together the other diffusion layer of the first transistors PMOS1 and the other diffusion layers of the third transistors PMOS2, the wire 28b belonging to the second wiring layer 20 and coupling together the other diffusion layers of the second transistors NMOS1 and the other diffusion layers of the fourth transistors NMOS2, and the wire 28c belonging to the second wiring layer 20 and coupling together the gate electrodes 33 of the first and second transistors PMOS1 and NMOS1 and the gate electrodes 33 of the third and fourth transistors PMOS2 and NMOS2. The INVx4 cell 2c has the function of an inverter having a fourfold driving capability.

(BUFx2 Cell)

Next, a configuration of the BUFx2 (bufferx2) cell 2d will be described. The plurality of cells provided over the main surface 31 of the semiconductor device 2 may also include the bufferx2 cell 2d.

FIG. 23 is a plan view illustrating the BUFx2 cell 2d in the semiconductor device according to the second embodiment. FIG. 23 also shows an equivalent circuit corresponding to the BUFx2 cell 2d. As shown in FIG. 23, when the BUFx2 cell 2d is viewed from thereabove (downwardly in the positive Z-axis direction), the BUFx2 cell 2d also has the first layout 91 and the second layout 92, similarly to the basic cell 2a. The BUFx2 cell 2d is configured to have the second wiring layer 20 provided over the base portion. A configuration of the base portion in the BUFx2 cell 2d is the same as the configuration of the base portion in the basic cell 2a described above so that a description thereof is omitted.

The second wiring layer 20 in the BUFx2 cell 2d will be described. As shown in FIG. 23, the BUFx2 cell 2d has the wires 29a, 29b, 29c, 42, and 43 belonging to the second wiring layer 20. The wire 29a couples together the sources S of the first transistors PMOS1 and the sources S of the third transistors PMOS2 via the wires 11s and 13s. The wire 29b couples together the sources S of the second transistors NMOS1 and the sources S of the fourth transistors NMOS2 via the wires 12s and 14s. The wire 29c is coupled to the gate electrodes 33 of the first and second transistors PMOS1 and NMOS1 via the wire 15.

The wire 42 includes the wire 42a extending in the X-axis direction, the wire 42b extending in the X-axis direction, and the wire 42c extending in the Y-axis direction and coupling together the wires 42a and 42b. The wire 42a is coupled to the drains D of the fourth transistors NMOS2 via the wire 14d. The wire 42b is coupled to the drains D of the third transistor PMOS2 via the wire 13d. Thus, the wire 42 couples together the drains D of the third transistors PMOS2 and the drains D of the fourth transistors NMOS2.

The wire 43 includes the three wires 43a, 43b, and 43c extending in the X-axis direction, the wire 43d extending in the Y-axis direction and connecting the wires 43a and 43b, and the wire 43e extending in the Y-axis direction and connecting the wires 43b and 43c. The wire 43a is coupled to the drains D of the first transistors PMOS1 via the wire 11d. The wire 43b is coupled to the gate electrodes 33 of the third and fourth transistors PMOS2 and NMOS2 via the wire 16. The wire 43c is coupled to the drains D of the second transistors NMOS1 via the wire 12d. Thus, the wire 43 couples together the drains D of the first transistors PMOS1, the drains of the second transistors NMOS1, and the gate electrodes 33 of the third and fourth transistors. The wire 29c serves as the input terminal A of the BUFx2 cell 2d. The wire 42b serves as the output terminal YB of the BUFx2 cell 2d.

Thus, the BUFx2 cell 2d has the wire 43 belonging to the second wiring layer 20 and coupling together the one diffusion layers of the first transistors PMOS1, the one diffusion layers of the second transistors NMOS1, and the gate electrodes 33 of the third and fourth transistors PMOS2 and NMOS2, the wire 29a belonging to the second wiring layer 20 and coupling together the other diffusion layers of the first transistors PMOS1 and the other diffusion layers of the third transistors PMOS2, the wire 42 belonging to the second wiring layer 20 and coupling together the one diffusion layers of the third transistors PMOS2 and the one diffusion layers of the fourth transistors NMOS2, and the wire 29b belonging to the second wiring layer 20 and coupling together the other diffusion layers of the second transistors NMOS1 and the other diffusion layers of the fourth transistors NMOS2. The BUFx2 cell 2d has the function of a buffer having a twofold driving capability.

(2NANDx2 Cell)

Next, a configuration of the 2NANDx2 cell 2e will be described. The plurality of cells provided over the main surface 31 of the semiconductor device 2 may also include the 2NANDx2 cell 2e.

FIG. 24 is a plan view illustrating the 2NANDx2 cell 2e in the semiconductor device according to the second embodiment. FIG. 24 also shows an equivalent circuit corresponding to the 2NANDx2 cell 2e. As shown in FIG. 24, when the 2NANDx2 cell 2e is viewed from thereabove (downwardly in the positive Z-axis direction), the 2NANDx2 cell 2e also has the first layout 91 and the second layout 92, similarly to the basic cell 2a. The 2NANDx2 cell 2e is configured to have the second wiring layer 20 provided over the base portion. A configuration of the base portion in the 2NANDx2 cell 2e is the same as the configuration of the base portion in the basic cell 2a described above so that a description thereof is omitted.

The second wiring layer 20 in the 2NANDx2 cell 2e will be described. As shown in FIG. 24, the 2NANDx2 cell 2e has the wires 44a, 44b, 44c, 45, and 46 belonging to the second wiring layer 20. The wire 44a couples together the sources S of the first transistors PMOS1 and the sources S of the third transistors PMOS2 via the wires 11s and 13s. The wire 44b is coupled to the sources S of the second transistors NMOS1 via the wires 12s. The wire 44c is coupled to the gate electrodes 33 of the first transistors PMOS1 via the wire 15.

The wire 45 includes the wire 45a extending in the X-axis direction, the wire 45b extending in the X-axis direction, and the wire 45c extending in the Y-axis direction and coupling together the wires 45a and 45b. The wire 45a is coupled to the drains D of the second transistors NMOS1 via the wire 12d. The wire 45b is coupled to the sources S of the fourth transistors NMOS2 via the wire 14s. Thus, the wire 45 couples together the drains D of the second transistors NMOS1 and the sources S of the fourth transistors NMOS2.

The wire 46 includes the three wires 46a, 46b, and 46c extending in the X-axis direction and the wire 46d extending in the Y-axis direction and connecting the wires 46a and 46b. The wire 46b is coupled to the drains D of the first transistors PMOS1 and the drains D of the third transistors PMOS2 via the wires 11d and 13d. The wire 46a is coupled to the drains D of the fourth transistors NMOS2 via the wire 14d. The wire 46c is coupled to the gate electrodes 33 of the third and fourth transistors via the wire 16. The wires 46c and 44c serve as the input terminals A and B of the 2NANDx2 cell 2e. The wire 46b serves as the output terminal YB of the 2NANDx2 cell 2e.

Thus, the 2NANDx2 cell 2e has the wire belonging to the second wiring layer 20 and coupling together the one diffusion layers of the first transistors PMOS1, the one diffusion layers of the third transistors PMOS2, and the one diffusion layers of the fourth transistors NMOS2, the wire 45 belonging to the second wiring layer 20 and coupling together the one diffusion layers of the second transistors NMOS1 and the other diffusion layers of the fourth transistors NMOS2, and the wire 44a belonging to the second wiring layer 20 and coupling together the other diffusion layers of the first transistors PMOS1 and the other diffusion layers of the third transistors PMOS2. The 2NANDx2 cell 2e has the function of a NAND having a twofold driving capability.

(2NORx2 Cell)

Next, a configuration of the 2NORx2 cell 2f will be described. The plurality of cells provided over the main surface 31 of the semiconductor device 2 may also include the 2NORx2 cell 2f.

FIG. 25 is a plan view illustrating the 2NORx2 cell 2f in the semiconductor device according to the second embodiment. FIG. 25 also shows an equivalent circuit corresponding to the 2NORx2 cell 2f. As shown in FIG. 25, when the 2NORx2 cell 2f is viewed from thereabove (downwardly in the positive Z-axis direction), the 2NORx2 cell 2f also has the first layout 91 and the second layout 92, similarly to the basic cell 2a. The 2NORx2 cell 2f is configured to have the second wiring layer 20 provided over the base portion. A configuration of the base portion in the 2NORx2 cell 2f is the same as the configuration of the base portion in the basic cell 2a described above so that a description thereof is omitted.

The second wiring layer 20 in the 2NORx2 cell 2f will be described. As shown in FIG. 25, the 2NORx2 cell 2f has the wires 47a, 47b, 47c, 48, and 49 belonging to the second wiring layer 20. The wire 47a is coupled to the sources S of the first transistors PMOS1 via the wires 11s. The wire 47b is coupled to the sources S of the second transistors NMOS1 and the sources S of the fourth transistors NMOS2 via the wires 12s and 14s. The wire 47c is coupled to the gate electrodes 33 of the first transistors PMOS1 via the wire 15.

The wire 48 includes the wire 48a extending in the X-axis direction, the wire 48b extending in the X-axis direction, and the wire 48c extending in the Y-axis direction and coupling together the wires 48a and 48b. The wire 48a is coupled to the drains D of the first transistors PMOS1 via the wire 11d. The wire 48b is coupled to the sources S of the third transistors PMOS2 via the wire 13s. Thus, the wire 48 couples together the drains D of the first transistors PMOS1 and the sources S of the third transistors PMOS2.

The wire 49 includes the three wires 49a, 49b, and 49c extending in the X-axis direction and the wire 49d extending in the Y-axis direction and connecting the wires 49a and 49b. The wire 49a is coupled to the drains D of the second transistors NMOS1 and the drains D of the fourth transistors NMOS2 via the wires 12d and 14d. The wire 49b is coupled to the drains D of the third transistors PMOS2 via the wire 13d. The wire 49d is coupled to the gate electrodes 33 of the third and fourth transistors via the wire 16. The wires 49c and 47c serve as the input terminals A and B of the 2NORx2 cell 2f. The wire 49b serves as the output terminal YB of the 2NORx2 cell 2f.

Thus, the 2NORx2 cell 2f has the wire 48 belonging to the second wiring layer 20 and coupling together the one diffusion layers of the first transistors PMOS1 and the other diffusion layers of the third transistors PMOS2, the wire belonging to the second wiring layer 20 and coupling together the one diffusion layers of the third transistors PMOS2, the one diffusion layers of the fourth transistors NMOS2, and the one diffusion layers of the second transistors NMOS1, and the wire 47b belonging to the second wiring layer 20 and coupling together the other diffusion layers of the second transistors NMOS1 and the other diffusion layers of the fourth transistors NMOS2. The 2NORx2 cell 2f has the function of a NOR having a twofold driving capability.

As described above, the semiconductor device 2 has the plurality of cells, e.g., any of the basic cell 2a, the INVx2 cell 2b, the INVx4 cell 2c, the BUFx2 cell 2d, the 2NANDx2 cell 2e, and the 2NORx2 cell 2f. In some cases, the semiconductor device 2 has at least two types among these cells. For example, the semiconductor device 2 has a first cell and a second cell different from the first cell in the pattern of the second wiring layer 20. Both of the first and second cells have the first layout 91 and the second layout 92 and have the base portions having the same configuration.

Next, the effects of the second embodiment will be described.

The basic cell 2a can be modified into a function cell such as the INVx2 cell 2b, the INVx4 cell 2c, the BUFx2 cell 2d, the 2NANDx2 cell 2e, or the 2NORx2 cell 2f by changing the wiring pattern of the second wiring layer 20. Accordingly, by disposing the basic cell 2a in a design process, it is possible to implement the function of the inverter, the buffer, the NAND, the NOR, or the like. The other components and effects are included in the statement in the first embodiment.

Third Embodiment

Figure 26:
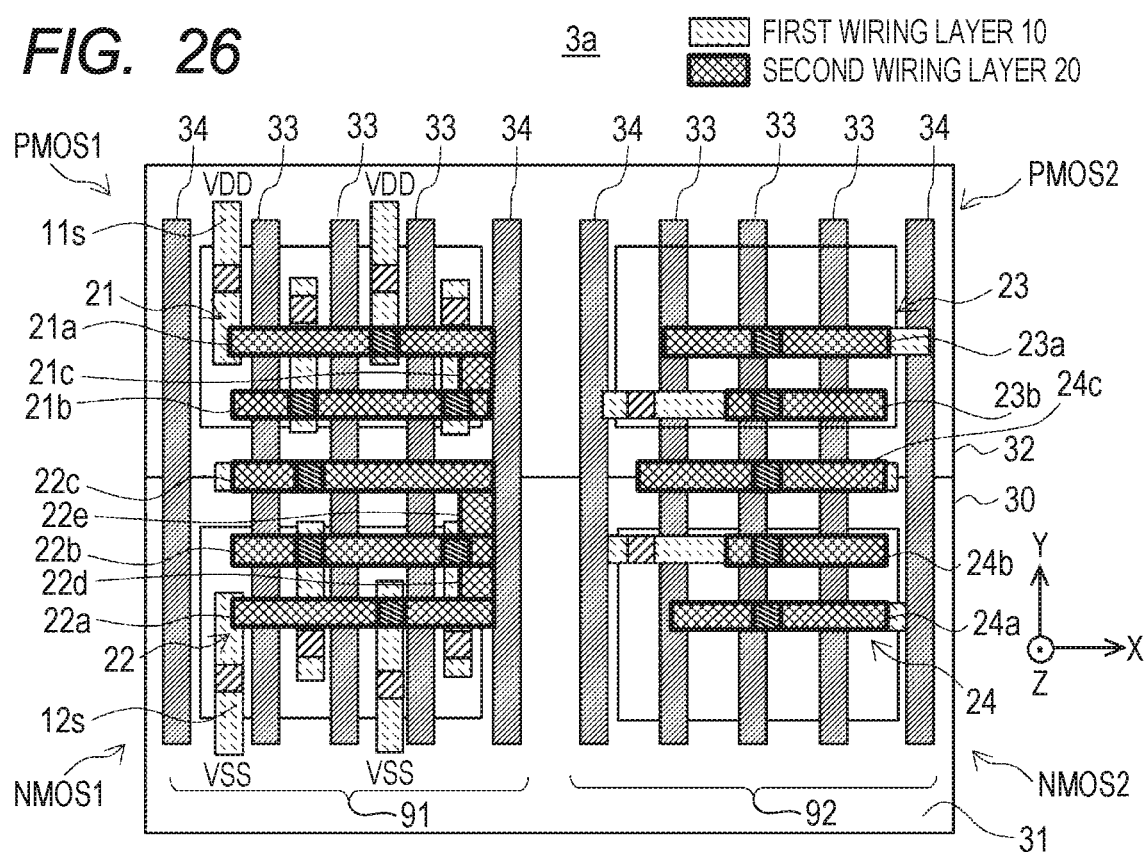
FIG. 26 is a plan view illustrating a basic cell in a semiconductor device according to a third embodiment.
Figure 27:
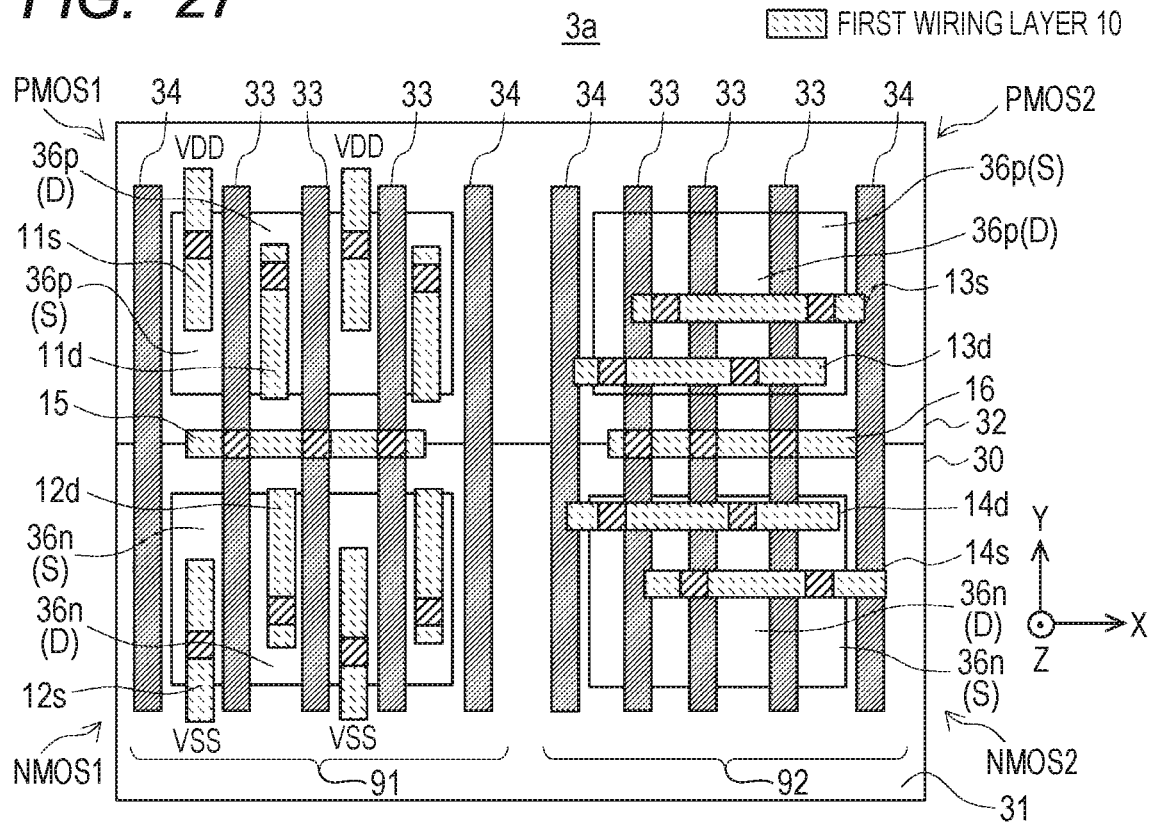
FIG. 27 is a plan view illustrating a base portion in the basic cell in the semiconductor device according to the third embodiment, in which a second wiring layer is removed from the basic cell.

Next, a third embodiment will be described. FIG. 26 is a plan view illustrating a basic cell 3a in a semiconductor device according to the third embodiment. FIG. 27 is a plan view illustrating a base portion in the basic cell 3a in the semiconductor device according to the third embodiment, in which the second wiring layer is removed from the basic cell 3a.

As shown in FIGS. 26 and 27, a semiconductor device 3 includes the semiconductor substrate 30 having the main surface 31, the first wiring layer 10 stacked over the main surface 31 of the semiconductor substrate 30 and patterned so as to include the plurality of wires, and the second wiring layer 20 stacked over the main surface 31 via the first wiring layer 10 so as to include the plurality of wires. Over the main surface 31 of the semiconductor substrate 30, the plurality of cells including the wires belonging to the first wiring layer 10 and the wires belonging to the second wiring layer 20 are provided.

Similarly to the basic cell 1a in the first embodiment, the basic cell 3a also includes the first wiring layer 10 provided over the main surface 31 of the semiconductor substrate 30 and having a predetermined pattern and the second wiring layer 20 provided over the first wiring layer and having a predetermined pattern. The basic cell 3a in the third embodiment is a cell having twelve transistors and, by changing the wiring pattern of the second wiring layer 20, the basic cell 3a can be modified into a function cell having the function of any of an inverter, a buffer, a NAND, a NOR, and the like.

(Base Portion in Basic Cell)

As shown in FIGS. 26 and 27, when the basic cell 3a is viewed from thereabove (downwardly in the positive Z-axis direction), the basic cell 3a has the first layout 91 and the second layout 92. The first layout 91 and the second layout 92 are disposed in juxtaposition in the X-axis direction. The second layout 92 is disposed on the positive side of the first layout 91 in the positive X-axis direction. The basic cell 3a is configured to have a base portion (configuration in FIG. 17) including the semiconductor substrate 30 and the first wiring layer 10, and the second wiring layer 20 provided over the base portion.

The first layout 91 includes the three first transistors PMOS1 and the three second transistors NMOS1. The first layout includes the first first-conductivity-type transistors PMOS1 having the respective gate electrodes 33 extending in the same direction and the second second-conductivity-type transistors NMOS1 having the respective gate electrodes 33 extending in the same direction. Two adjacent ones of the first transistors PMOS1 have one shared diffusion layer or the other shared diffusion layer, while two adjacent ones of the second transistors NMOS1 have one shared diffusion layer or the other shared diffusion layer.

For example, the first transistors PMOS1 are P-type MOS transistors. Each of the first transistors PMOS1 has the gate electrode 33 extending in the Y-axis direction. The individual first transistors PMOS1 are disposed in juxtaposition in the X-axis direction. Each of the first transistors PMOS1 and the first transistor PMOS1 adjacent thereto have the shared source S or drain D.

For example, the second transistors NMOS1 are N-type MOS transistors. Each of the second transistors NMOS1 has the gate electrode 33 extending in the Y-axis direction. The individual second transistors NMOS1 are disposed in juxtaposition in the X-axis direction. Each of the second transistors NMOS1 and the second transistor NMOS1 adjacent thereto have the shared source S or drain D. Note that, in FIGS. 26 and 27, to avoid complicated illustration, only some components are denoted by reference numerals.

In the first layout 91, the three first transistors PMOS1 having the shared source S or drain D and the three second transistors NMOS2 having the shared source or drain D are disposed in juxtaposition in the Y-axis direction. The three first transistors PMOS1 are disposed on the positive side of the three second transistors NMOS1 in the positive Y-axis direction.

The first layout 91 is divided across the Y-axis direction into a portion extending along the positive Y-axis direction and a portion extending along the negative Y-axis direction. In the portion of the P-type semiconductor substrate 30 extending along the positive Y-axis direction, the N-type well 32 is formed.

The three gate electrodes 33 are disposed over the N-type well 32 and the P-type semiconductor substrate 30 to extend in the Y-axis direction and be arranged in spaced-apart relation in the X-axis direction. On the other hand, the plurality of dummy electrodes 34 are formed over the N-type well 32 and the P-type semiconductor substrate 30 so as to extend in the Y-axis direction. The gate electrodes 33 and the dummy electrodes 34 are formed to be arranged in spaced-apart relation in the X-axis direction. Between the gate electrodes 33 and the dummy electrode 34 and between the N-type well 32 and the P-type semiconductor substrate 30, the insulating film 35 is formed.

The P-type diffusion layers 36p are formed in the N-type well 32 located on both sides of the gate electrodes 33. The N-type well 32 covered with the gate electrodes 33 is interposed between the P-type diffusion layers 36p. The N-type well 32 covered with the gate electrodes 33 functions as P-type channel layers. Accordingly, on the positive part of the first layout 91 in the positive Y-axis direction, the three first transistors PMOS1 are formed. The P-type diffusion layer 36p interposed between the adjacent two of the gate electrodes is the shared source S or drain D of the adjacent first transistors PMOS1.

The N-type diffusion layers 36n are formed in the P-type semiconductor substrate 30 located on both sides of the gate electrodes 33. The P-type semiconductor substrate 30 covered with the gate electrodes 33 is interposed between the N-type diffusion layers 36n. The P-type semiconductor substrate 30 covered with the gate electrodes 33 functions as the N-type channel layers. Accordingly, on the negative part of the first layout 91 in the negative Y-axis direction, the three second transistors NMOS1 are formed. The N-type diffusion layer 36n interposed between the adjacent two of the gate electrodes 33 is the shared source S or drain D of the adjacent second transistors NMOS1.

To the respective sources S of the first transistors PMOS1, the wires 11s are coupled via contacts. Consequently, the wires 11s (first wires) couple the respective other diffusion layers (e.g., sources S) of the first transistors PMOS1 to the first power supply VDD. To the respective drains D of the first transistors PMOS1, the wires 11d (second wires) are coupled via contacts. Note that, to the first power supply VDD, as the first wires, the wires 11d may also be coupled. For example, the wires 11s and the wires 11d extend in the Y-axis direction.

To the respective sources S of the second transistors NMOS1, the wires 12s are coupled via contacts. Consequently, the wires 12s (third wires) couple the respective other diffusion layers (e.g., sources S) of the second transistors NMOS1 to the second power supply VSS. To the respective drains D of the second transistors NMOS1, the wires 12d (fourth wires) are coupled via contacts. Note that, to the second power supply VSS, as the fourth wires, the wires 12d may also be coupled. For example, the wires 12s and the wires 12d extend in the Y-axis direction.

In the portion of the N-type well 32 closer to the negative side or edge thereof in the negative Y-axis direction, the wire 15 (fifth wire) is coupled to the gate electrodes 33 of the three first transistors PMOS1 and the three second transistors NMOS1 via contacts. Accordingly, the wire 15 is disposed between the first transistors PMOS1 and the second transistors NMOS1 in the Y-axis direction. For example, the wire 15 extends in the X-axis direction.

Thus, the first layout 91 includes the two wires 11d, the two wires 11s, the two wires 12d, the two wires 12s, and the wire 15. The two wires 11d, the two wires 11s, the two wires 12d, the two wires 12s, and the wire 15 belong to the first wiring layer 10 and are formed by patterning the first wiring layer 10.

The second layout 92 includes the three third transistors PMOS2 and the three fourth transistors NMOS2. The second layout 92 includes the first-conductivity-type third transistors PMOS2 having the respective gate electrodes 33 extending in the same direction and the second-conductivity-type fourth transistors NMOS2 having the respective gate electrodes 33 extending in the same direction. Two adjacent ones of the third transistors PMOS2 have one shared diffusion layer or the other shared diffusion layer, while two adjacent ones of the fourth transistors NMOS2 have one shared diffusion layer or the other shared diffusion layer.

For example, the third transistors PMOS2 are P-type MOS transistors. Each of the third transistors PMOS2 has the gate electrode 33 extending in the Y-axis direction. The individual third transistors PMOS2 are disposed in juxtaposition in the X-axis direction. Each of the third transistors PMOS2 and the third transistor PMOS2 adjacent thereto have the shared source S or drain D.

For example, the fourth transistors NMOS2 are N-type MOS transistors. Each of the fourth transistors NMOS2 has the gate electrode 33 extending in the Y-axis direction. The individual fourth transistors NMOS2 are disposed in juxtaposition in the X-axis direction. Each of the fourth transistors NMOS2 and the fourth transistor NMOS2 adjacent thereto have the shared source S or drain D.

In the second layout 92, the three third transistors PMOS2 having the shared source S or drain D and the three fourth transistors NMOS2 having the shared source or drain D are disposed in juxtaposition in the Y-axis direction. The three third transistors PMOS2 are disposed on the positive side of the three fourth transistors NMOS2 in the positive Y-axis direction.

Specifically, the second layout 92 is divided across the Y-axis direction into a portion extending along the positive Y-axis direction and a portion extending along the negative Y-axis direction. In the portion of the P-type semiconductor substrate 30 extending along the positive Y-axis direction, the N-type well 32 is formed.

The three gate electrodes 33 are disposed over the N-type well 32 and the P-type semiconductor substrate 30 to extend in the Y-axis direction and be arranged in spaced-apart relation in the X-axis direction. On the other hand, the plurality of dummy electrodes 34 are formed over the N-type well 32 and the P-type semiconductor substrate 30 so as to extend in the Y-axis direction. The gate electrodes 33 and the dummy electrodes 34 are formed to be arranged in spaced-apart relation in the X-axis direction. Between the gate electrodes 33 and the dummy electrodes 34 and between the N-type well 32 and the P-type semiconductor substrate 30, the insulating film 35 is formed.

The P-type diffusion layers 36p are formed in the N-type well 32 located on both sides of the gate electrodes 33. The N-type well 32 covered with the gate electrodes 33 is interposed between the P-type diffusion layers 36p. The N-type well 32 covered with the gate electrodes 33 functions as P-type channel layers. Accordingly, on the positive part of the second layout 92 in the positive Y-axis direction, the three third transistors PMOS2 are formed. The P-type diffusion layer 36p interposed between the adjacent two of the gate electrodes is the shared source S or drain D of the adjacent third transistors PMOS2.

The N-type diffusion layers 36n are formed in the P-type semiconductor substrate 30 located on both sides of the gate electrodes 33. Consequently, the P-type semiconductor substrate 30 covered with the gate electrodes 33 is interposed between the N-type diffusion layers 36n. The P-type semiconductor substrate 30 covered with the gate electrodes 33 functions as N-type channel layers. Accordingly, on the negative part of the second layout 92 in the negative Y-axis direction, the three fourth transistors NMOS2 are formed. The N-type diffusion layer 36n interposed between the adjacent two of the gate electrodes 33 is the shared source S or drain D of the adjacent fourth transistors NMOS2.

The wire 13s (sixth wire) couples together the respective sources S of the third transistors PMOS2 via contacts. Consequently, the wire 13s couples together the respective other diffusion layers (e.g., sources S) of the third transistors PMOS2. To the respective drains D of the third transistors PMOS2, the wire 13d (seventh wire) is coupled via contacts. Consequently, the wire 13d couples together the respective one diffusion layers (e.g., drains D) of the third transistors PMOS2. For example, the wire 13s and the wire 13d extend in the X-axis direction.

The wire 14s (eighth wire) couples together the respective sources S of the fourth transistors NMOS2 via contacts. Consequently, the wire 14s couples together the respective other diffusion layers (e.g., sources S) of the fourth transistors NMOS2. To the respective drains D of the fourth transistors NMOS2, the wire 14d (ninth wire) is coupled via contacts. Consequently, the wire 14d couples together the respective one diffusion layers (e.g., drains D) of the third transistors PMOS2. For example, the wire 14d and the wire 14s extend in the X-axis direction.

In the portion of the N-type well 32 closer to the negative side or edge thereof in the negative Y-axis direction, the wire 16 (tenth wire) is coupled to the shared gate electrodes 33 of the three third transistors PMOS2 and the three fourth transistors NMOS2 via contacts. For example, the wire 16 extends in the X-axis direction.

Thus, the second layout 92 includes the wire 13d, the wire 13s, the wire 14d, the wire 14s, and the wire 16. The wire 13d, the wire 13s, the wire 14d, the wire 14s, and the wire 16 belong to the first wiring layer 10 and are formed by patterning the first wiring layer 10. The wire 13s, the wire 13d, the wire 14s, and the wire 14d are electrically floating. In other words, the wire 13s, the wire 13d, the wire 14s, and the wire 14d are coupled neither to the first power supply VDD nor to the second power supply VSS.

(Second Wiring Layer in Basic Cell)

Next, the second wiring layer 20 in the basic cell 3a will be described. As shown in FIG. 26, the first layout 91 of the basic cell 3a has the wires 21 and 22 belonging to the second wiring layer 20. The wire 21 couples together the sources S and the drains D of the first transistors PMOS1 via the wires 11d and 11s. The wire 22 couples together the sources S and the drains D of the second transistors NMOS1 via the wires 12d and 12s. Thus, the first layout 91 has the wire coupling together the one diffusion layers and the other diffusion layers of the first transistors PMOS1 and the wire coupling together the one diffusion layers and the other diffusion layers of the second transistors NMOS1.

The wire 22 is also coupled to the gate electrodes 33 of the first and second transistors PMOS1 and NMOS1 via the wire 15.

The second layout 92 includes the wires 23 and 24 belonging to the second wiring layer 20. Specifically, the wire 23 includes the two wires 23a and 23b extending in the X-axis direction. The wire 23a is coupled to the wire 13s in the first wiring layer 10 via a via. The wire 23b is coupled to the wire 13d in the first wiring layer 10 via a via.

The wire 24 includes the three wires 24a, 24b, and 24c extending in the X-axis direction. The wire 24a is coupled to the wire 14s in the first wiring layer 10 via a via. The wire 24b is coupled to the wire 14d in the first wiring layer 10 via a via. The wire 24c is coupled to the wire 16 in the first wiring layer 10 via a via.

In the semiconductor device 3 in the present third embodiment also, by changing the wiring pattern of the second wiring layer 20, the basic cell 3a can be modified into a function cell having the function of the inverter, the buffer, the NAND, the NOR, or the like. The other components and effects are included in the statements in the first and second embodiments.

Fourth Embodiment

Figure 28:
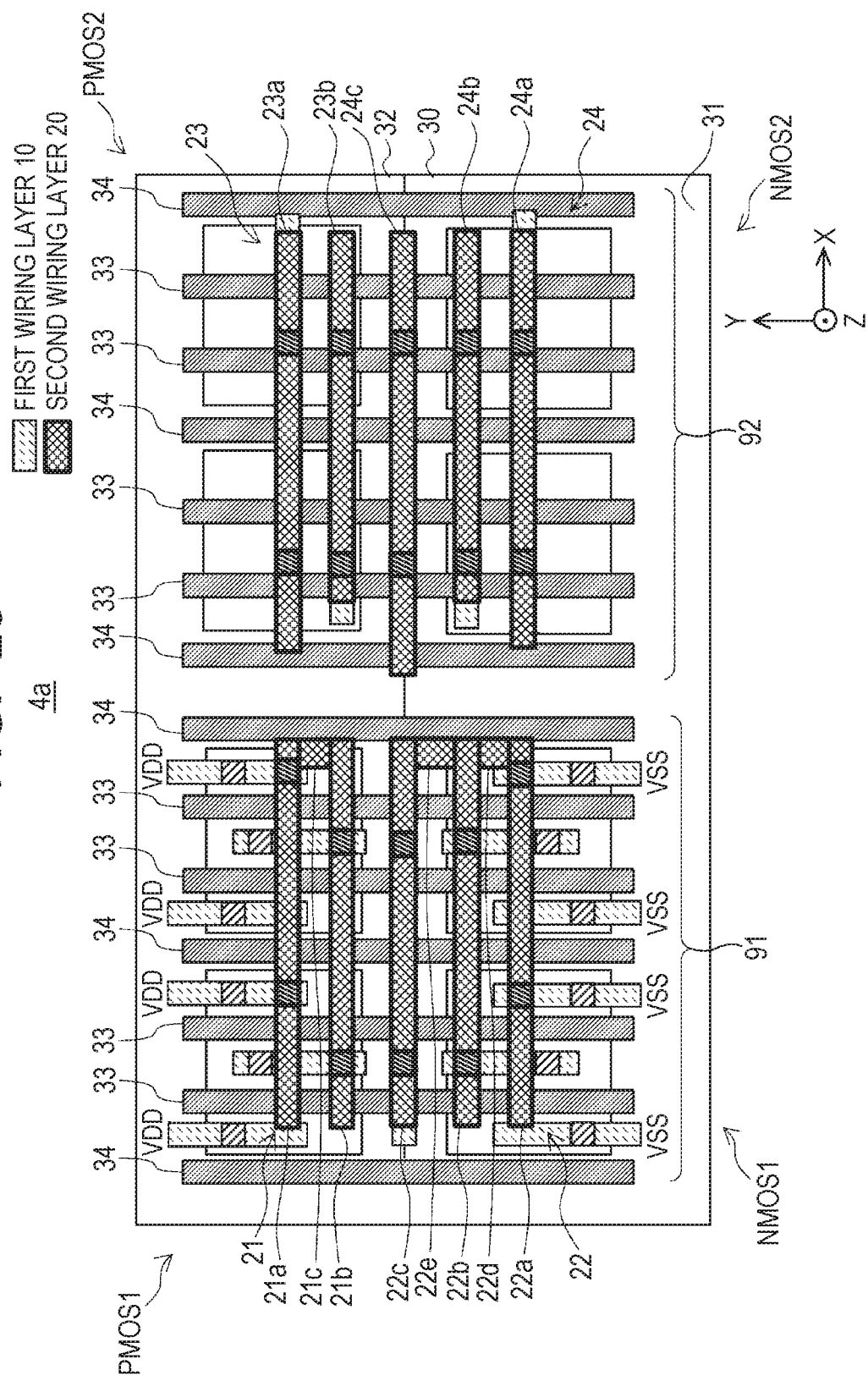
FIG. 28 is a plan view illustrating a basic cell in a semiconductor device according to a fourth embodiment.
Figure 29:
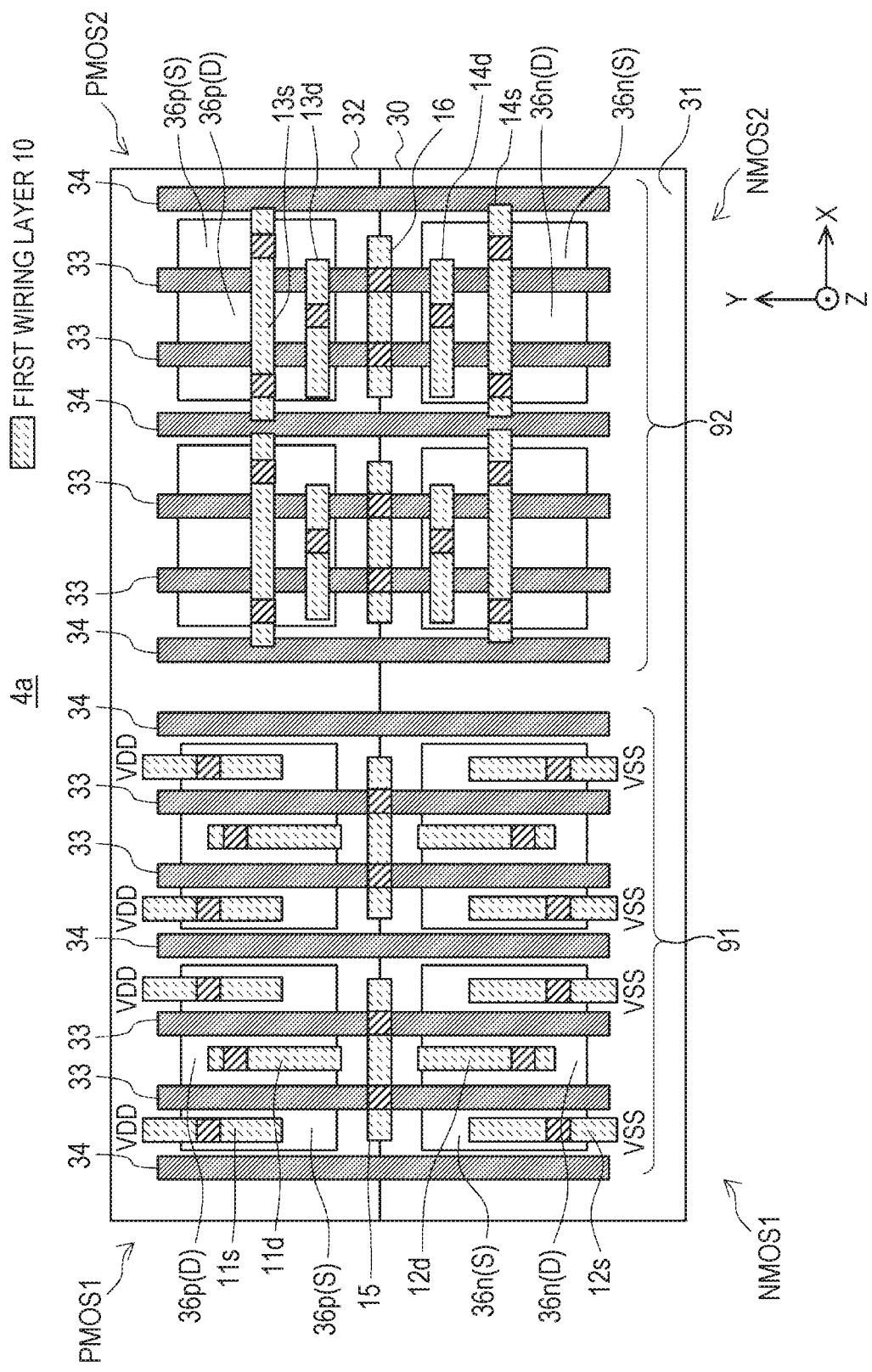
FIG. 29 is a plan view illustrating a base portion in the basic cell in the semiconductor device according to the fourth embodiment, in which a second wiring layer is removed from the basic cell.

Next, a fourth embodiment will be described. FIG. 28 is a plan view illustrating a basic cell 4a in a semiconductor device according to the fourth embodiment. FIG. 29 is a plan view illustrating a base portion in the basic cell 4a in the semiconductor device according to the fourth embodiment, in which the second wiring layer is removed from the basic cell 4a.

As shown in FIGS. 28 and 29, similarly to the basic cell 1a in the first embodiment, the basic cell 4a also includes the first wiring layer 10 provided over the main surface 31 of the semiconductor substrate 30 and having a predetermined pattern and the second wiring layer 20 provided over the first wiring layer and having a predetermined pattern. The basic cell 4a in a semiconductor device 4 is a cell having sixteen transistors and, by changing the wiring pattern of the second wiring layer 20 thereof, the basic cell 4a can be modified into a function cell having the function of any of an inverter, a buffer, a NAND, a NOR, and the like.

(Base Portion in Basic Cell)

As shown in FIGS. 28 and 29, when the basic cell 4a is viewed from thereabove (downwardly in the positive Z-axis direction), the basic cell 4a has the first layout 91 and the second layout 92. The first layout 91 and the second layout 92 are disposed in juxtaposition in the X-axis direction. The basic cell 4a is configured to have a base portion including the semiconductor substrate 30 and the first wiring layer 10, and the second wiring layer 20 provided over the base portion.

The first layout 91 has two pairs of the first-conductivity-type first transistors PMOS1 in each of which the two first transistors PMOS1 have one shared diffusion layer and two pairs of the second-conductivity-type second transistors NMOS1 in each of which the two second transistors NMOS1 have one shared diffusion layer. Accordingly, the first layout 91 is configured such that the two first layouts each provided in the basic cell 2a in the second embodiment are arranged in the X-axis direction.

To the respective sources S of the first transistors PMOS1, the wires 11s are coupled via contacts. The wires 11s (first wires) couple the respective other diffusion layers (e.g., sources S) of the first transistors PMOS1 to the first power supply VDD. To the respective drains D of the first transistors PMOS1, the wires 11d (second wires) are coupled via contacts. For example, the wires 11s and the wires 11d extend in the Y-axis direction.

To the respective sources S of the second transistors NMOS1, the wires 12s are coupled via contacts. The wires 12s (third wires) couple the respective other diffusion layers (e.g., sources S) of the second transistors NMOS1 to the second power supply VSS. To the respective drains D of the second transistors NMOS1, the wires 12d (fourth wires) are coupled via contacts. For example, the wires 12s and 12d extend in the Y-axis direction.

The second layout 92 has two pairs of the first-conductivity-type third transistors PMOS2 in each of which the two third transistors PMOS2 have one shared diffusion layer and two pairs of the fourth-conductivity-type fourth transistors NMOS2 in each of which the two fourth transistors NMOS2 have one shared diffusion layer. Accordingly, the second layout 92 is configured such that the two second layouts 92 each provided in the basic cell 2a in the second embodiment are arranged in the X-axis direction.

The wires 13s (sixth wires) couple together the respective sources S of the third transistors PMOS2 via contacts. Consequently, the wires 13s couple together the respective other diffusion layers (e.g., source S) of the third transistors PMOS2. To the respective drains D of the third transistors PMOS2, the wires 13d (seventh wires) are coupled via contacts. For example, the wires 13s and the wires 13d extend in the X-axis direction.

The wires 14s (eighth wires) couple together the respective sources S of the fourth transistors NMOS2 via contacts. Consequently, the wires 14s couple together the respective other diffusion layers (e.g., sources S) of the fourth transistors NMOS2. To the respective drains D of the fourth transistors NMOS2, the wires 14d (ninth wires) are coupled via contacts. For example, the wires 14d and the wires 14s extend in the X-axis direction.

(Second Wiring Layer in Basic Cell)

Next, the second wiring layer 20 in the basic cell 4a will be described. As shown in FIG. 28, the first layout 91 of the basic cell 4a has the wires 21 and 22 belonging to the second wiring layer 20. The wire 21 couples together the sources S and the drains D of the first transistors PMOS1 via the wires 11d and 11s. The wire 22 couples together the sources S and the drains D of the second transistors NMOS1 via the wires 12d and the wires 12s. Thus, the first layout 91 has the wire 21 coupling together the one diffusion layers and the other diffusion layers of the first transistors PMOS1 and the wire 22 coupling together the one diffusion layers and the other diffusion layers of the second transistors NMOS1.

The wire 22 is also coupled to the gate electrodes 33 of the first transistors PMOS1 and the second transistors NMOS1 via the wires 15.

The second layout 92 includes the wires 23 and 24 belonging to the second wiring layer 20. The wire 23 includes the two wires 23a and 23b extending in the X-axis direction. The wire 23a is coupled to the wires 13s in the first wiring layer 10 via vias. The wire 23b is coupled to the wires 13d in the first wiring layer 10 via vias.

The wire 24 includes the three wires 24a, 24b, and 24c extending in the X-axis direction. The wire 24a is coupled to the wires 14s in the first wiring layer 10 via vias. The wire 24b is coupled to the wires 14d in the first wiring layer 10 via vias. The wire 24c is coupled to the wires 16 in the first wiring layer 10 via vias.

In the semiconductor device 4 in the present fourth embodiment also, by changing the wiring pattern of the second wiring layer 20, the basic cell 4a can be modified into a function cell having the function of the inverter, the buffer, the NAND, the NOR, or the like. The other components and effects are included in the statements in the first to third embodiments.

(Design Flow)

Figure 30:
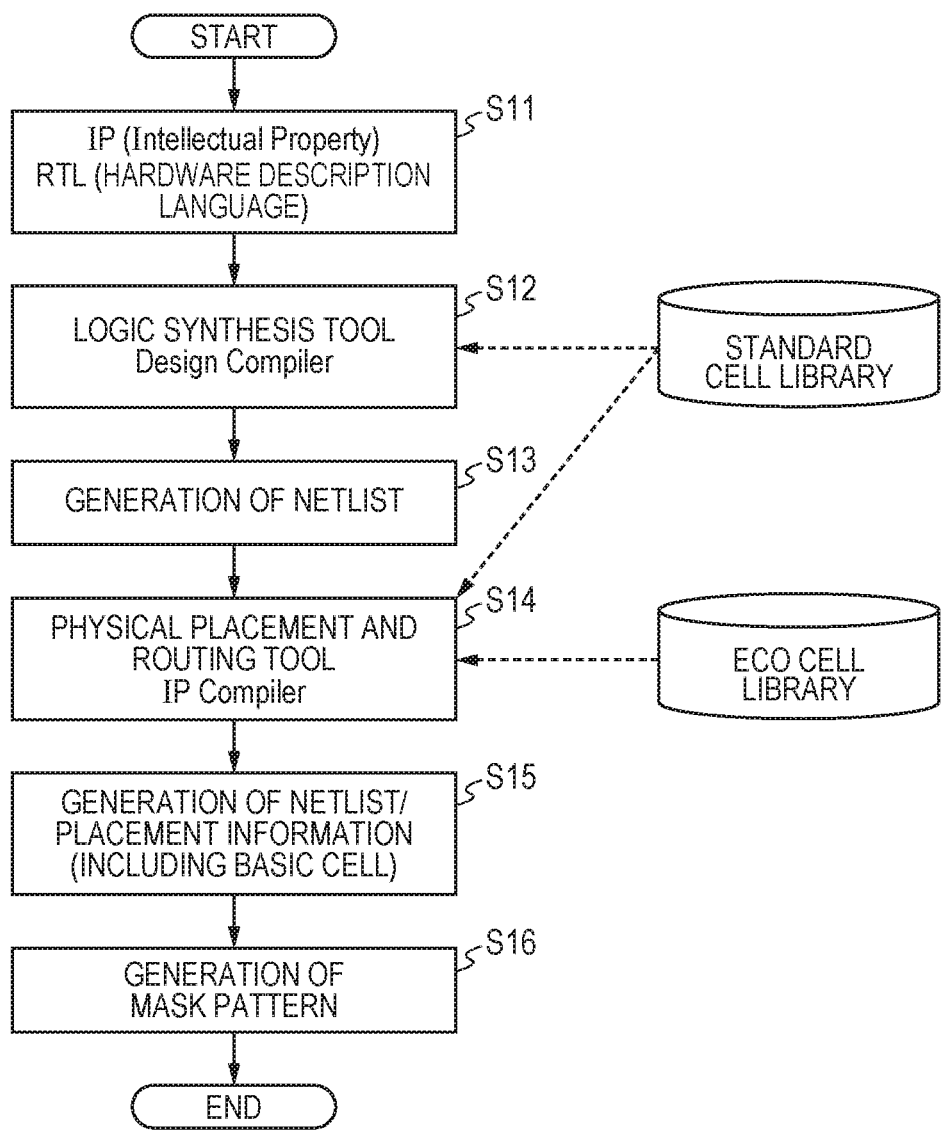
FIG. 30 is a flow chart diagram illustrating a design flow for each of the semiconductor devices according to the first to fourth embodiments.

Next, a design flow for forming the cells in the semiconductor devices described in the first to fourth embodiments will be described. FIG. 30 is a flow chart diagram illustrating the design flow according to the first to fourth embodiments. As shown in Step S11 in FIG. 30, IP (Intellectual Property) and RTL (hardware description language) are provided. Then, as shown in Step S12, a logic synthesis tool is provided. Note that, when the logic synthesis tool is provided, a standard cell library may also be used. Then, as shown in Step S13, a netlist is generated. Then, as shown in Step S14, a physical placement and routing tool is provided. When the physical placement and routing tool is provided, an ECO cell library may also be used. The ECO library corresponds to a library of basic cells and function cells. Alternatively, the standard cell library may also be used. Then, as shown in Step S15, a netlist including the basic cell and placement information are generated. Then, as shown in Step S16, a mask pattern is generated.

Figure 31:
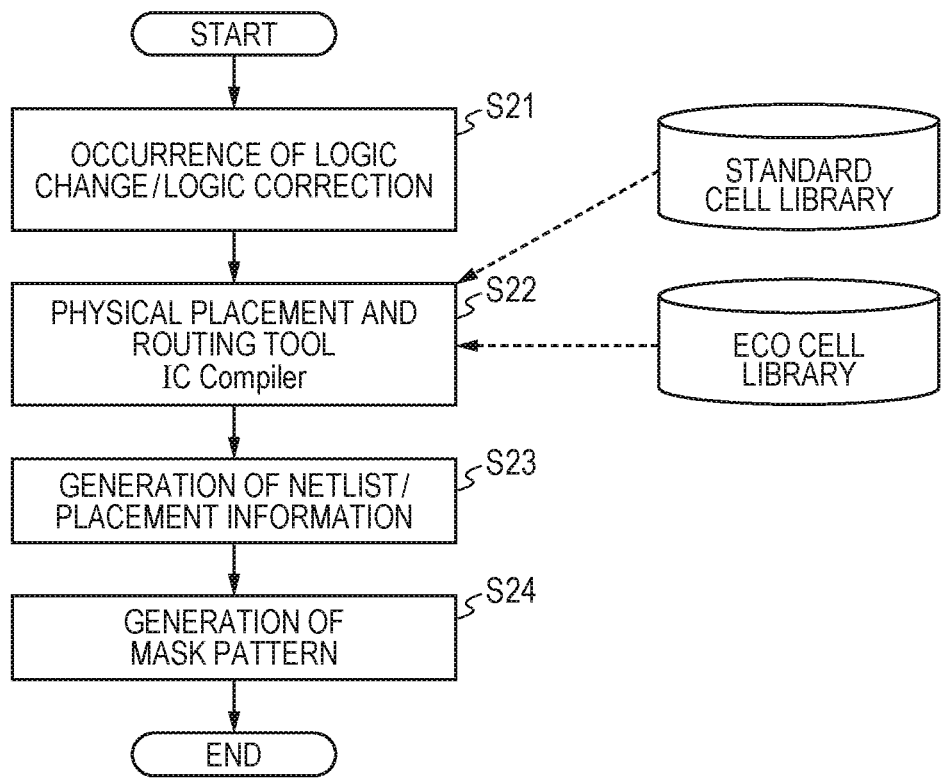
FIG. 31 is a flow chart diagram illustrating an ECO flow in which the basic cell in each of the semiconductor devices according to the first to fourth embodiments is modified into a function cell.

Next, an ECO flow in which the basic cell in each of the semiconductor devices described in the first to fourth embodiments is modified into a function cell will be described. FIG. 31 is a flow chart diagram illustrating the ECO flow in which the basic cell in each of the semiconductor devices described in the first to fourth embodiments is modified into a function cell. As shown in Step S21 in FIG. 31, first, a logic change/correction occurs. In this case, a change to be made in a circuit is extracted and a necessary function cell is extracted. Then, as shown in Step S22, the physical placement and routing tool is provided. When the physical placement and routing tool is provided, the ECO cell library may also be used. Using the ECO cell library, the basic cell is modified into the function cell. Also, coupling/rewiring of the individual cells is performed. Note that, when the physical placement and routing tool is provided, the standard cell library may also be used. Then, as shown in Step S23, the netlist/placement information is generated. Then, as shown in Step S24, a mask pattern is generated. Thus, mask pattern data in which the wires coupling together the individual cells are corrected is formed. This allows the circuit corrected by modifying the basic cell into the function cell to be manufactured.

While the invention achieved by the present inventors has been specifically described heretofore on the basis of the embodiments, the present invention is not limited to the embodiments described above. It will be appreciated that various changes and modifications can be made in the invention within the scope not departing from the gist thereof. The following matters are also included in the technical idea described in the first to fourth embodiments.

(Note 1)

A semiconductor device, includes:

a semiconductor substrate having a main surface;

a first wiring layer stacked over the main surface of the semiconductor substrate and patterned so as to include a plurality of wires; and a second wiring layer stacked over the main surface via the first wiring layer and patterned so as to include a plurality of wires, in which, over the main surface, a plurality of cells each including the wires belonging to the first wiring layer and the wires belonging to the second wiring layer are provided, in which the plurality of cells include a first cell and a second cell different from the first cell in a pattern of the second wiring layer, in which each of the first cell and the second cell has a first layout and a second layout, in which the first layout includes:

two first transistors having a first conductivity type and one shared diffusion layer;

two second transistors having a second conductivity type and one shared diffusion layer;

a first wire coupling the other diffusion layer of each of the first transistors to a first power supply;

a second wire coupled to the shared one diffusion layer of the first transistors;

a third wire coupling the other diffusion layer of each of the second transistors to a second power supply; and a fourth wire coupled to the shared one diffusion layer of the second transistors, in which the second layout includes:

two third transistors having the first conductivity type and one shared diffusion layer; and two fourth transistors having the second conductivity type and one shared diffusion layer, and in which the first wire, the second wire, the third wire, and the fourth wire belong to the first wiring layer.

(Note 2)

A semiconductor device, includes:

a semiconductor substrate having a main surface;

a first wiring layer stacked over the main surface of the semiconductor substrate and patterned so as to include a plurality of wires; and a second wiring layer stacked over the main surface of the semiconductor substrate via the first wiring layer and patterned so as to include a plurality of wires, in which a plurality of cells each including the wires belonging to the first wiring layer and the wires belonging to the second wiring layer include a first cell and a second cell different from the first cell in a pattern of the second wiring layer, in which each of the first cell and the second cell has a first layout and a second layout, in which the first layout includes:

three first transistors having a first conductivity type and respective gate electrodes extending in the same direction, two adjacent ones of the first transistors having one shared diffusion layer or the other shared diffusion layer;

three second transistors having a second conductivity type and respective gate electrodes extending in the same direction, two adjacent ones of the second transistors having one shared diffusion layer or the other shared diffusion layer;

a first wire coupling the other diffusion layer of each of the first transistors to a first power supply;

a second wire coupled to the one diffusion layer of each of the first transistors;

a third wire coupling the other diffusion layer of each of the second transistors to a second power supply; and a fourth wire coupled to the one diffusion layer of each of the second transistors, in which the second layout includes:

three third transistors having the first conductivity type and respective gate electrodes extending in the same direction, two adjacent ones of the third transistors having one shared diffusion layer or the other shared diffusion layer; and three fourth transistors having the second conductivity type and respective gate electrodes extending in the same direction, two adjacent ones of the fourth transistors having one shared diffusion layer or the other shared diffusion layer, and in which the first wire, the second wire, the third wire, and the fourth wire are included in the first wiring layer.

(Note 3)

In the semiconductor device according to Note 2, the second layout further includes:

a sixth wire coupling together the respective one diffusion layers of the third transistors;

a seventh wire coupling together the respective other diffusion layers of the third transistors;

an eighth wire coupling together the respective one diffusion layers of the fourth transistors; and a ninth wire coupling together the respective other diffusion layers of the fourth transistors.

(Note 4)

A semiconductor device, includes:

a semiconductor substrate having a main surface;

a first wiring layer stacked over the main surface of the semiconductor substrate and patterned so as to include a plurality of wires; and a second wiring layer stacked over the main surface via the first wiring layer and patterned so as to include a plurality of wires, in which, over the main surface, a plurality of cells each including the wires belonging to the first wiring layer and the wires belonging to the second wiring layer are provided, in which the plurality of cells include a first cell and a second cell different from the first cell in a pattern of the second wiring layer, in which each of the first cell and the second cell has a first layout and a second layout, in which the first layout has:

two pairs of first transistors in each of which the two first transistors have a first conductivity type and one shared diffusion layer;

two pairs of second transistors in each of which the two second transistors have a second conductivity type and one shared diffusion layer;

a first wire coupling the other diffusion layer of each of the first transistors to a first power supply;

a second wire coupled to the shared one diffusion layer of the first transistors;

a third wire coupling the other diffusion layer of each of the second transistors to a second power supply; and a fourth wire coupled to the shared one diffusion layer of the second transistors, in which the second layout has:

two pairs of third transistors in each of which the two third transistors have the first conductivity type and one shared diffusion layer; and two pairs of fourth transistors in each of which the two fourth transistors have the second conductivity type and one shared diffusion layer, and in which the first wire, the second wire, the third wire, and the fourth wire belong to the first wiring layer.

(Note 5)

In the semiconductor device according to Note 4, the second layout further has:

a sixth wire coupling together the respective other diffusion layers of the third transistors;

a seventh wire coupled to the shared one diffusion layer of the third transistors;

an eighth wire coupling together the respective other diffusion layers of the fourth transistors; and a ninth wire coupled to the shared one diffusion layer of the fourth transistors.

(Note 6)

A semiconductor device, includes:

a semiconductor substrate having a main surface;

a first wiring layer stacked over the main surface of the semiconductor substrate and patterned so as to include a plurality of wires; and a second wiring layer stacked over the main surface via the first wiring layer and patterned so as to include a plurality of wires, in which, over the main surface, a plurality of cells each including the wires belonging to the first wiring layer and the wires belonging to the second wiring layer are provided, in which at least any of the plurality of cells has a first layout and a second layout, in which the first layout includes:

a first transistor;

a second transistor having a conductivity type different from that of the first transistor;

a first wire coupling either one diffusion layer of the first transistor to a first power supply;

a second wire coupled to the other diffusion layer of the first transistor;

a third wire coupling either one diffusion layer of the second transistor to a second power supply; and a fourth wire coupled to the other diffusion layer of the second transistor, in which the second layout includes:

a third transistor; and a fourth transistor having a conductivity different from that of the third transistor, in which the first wire, the second wire, the third wire, and the fourth wire belong to the first wiring layer, and in which each of the cells can be modified so as to have a function of at least one of an inverter, a buffer, a NAND, and a NOR by changing a pattern of the second wiring layer.

(Note 7)

In the semiconductor device according to Note 6, the second layout further includes:

a sixth wire coupled to either one diffusion layer of the third transistor;

a seventh wire coupled to the other diffusion layer of the third transistor;

an eighth wire coupled to either one diffusion layer of the fourth transistor; and a ninth wire coupled to the other diffusion layer of the fourth transistor, the sixth wire, the seventh wire, the eighth wire, and the ninth wire belong to the first wiring layer, and the sixth wire, the seventh wire, the eighth wire, and the ninth wire are electrically floating.

(Note 8)

In the semiconductor device according to Note 6, the sixth wire, the seventh wire, the eighth wire, and the ninth wire extend in one direction in a plane parallel with the main surface, and the first wire, the second wire, the third wire, and the fourth wire extend in the other direction crossing the one direction in the plane.

(Note 9)

In the semiconductor device according to Note 6, the first layout includes a fifth wire coupled to a gate electrode of the first and second transistors, the second layout includes a tenth wire coupled to a gate electrode of the third and fourth transistors, and the fifth wire and the tenth wire belong to the first wiring layer.

(Note 10)

In the semiconductor device according to Note 6, the first cell includes:

an eleventh wire belonging to the second wiring layer and coupling together one diffusion layer and the other diffusion layer of the first transistor; and a twelfth wire belonging to the second wiring layer and coupling together one diffusion layer and the other diffusion layer of the second transistor.

(Note 11)

In the semiconductor device according to Note 10, the twelfth wire is coupled also to a gate electrode of the first and second transistors.

What is claimed is:

1. A semiconductor device, comprising:
a function cell designed using a basic cell including a first wiring layer provided over a main surface of a semiconductor substrate and having a predetermined pattern and a second wiring layer provided over the first wiring layer and having a predetermined pattern, the function cell corresponding to the basic cell which is modified to have a predetermined function by changing the pattern of the second wiring layer at a design stage,
wherein the function cell has a first layout and a second layout which are disposed in juxtaposition in one direction in a plane parallel with the main surface,
wherein the function cell is provided with the predetermined function by coupling together wires belonging to the respective second wiring layers of the first layout and the second layout,
wherein the first layout includes:
a first transistor;
a second transistor disposed in juxtaposition with the first transistor in another direction crossing the one direction in the plane and having a conductivity type different from that of the first transistor;
a first wire coupling either one diffusion layer of the first transistor to a first power supply;
a second wire coupled to the other diffusion layer of the first transistor;
a third wire coupling either one diffusion layer of the second transistor to a second power supply;
a fourth wire coupled to the other diffusion layer of the second transistor; and a fifth wire disposed between the first transistor and the second transistor in the other direction and coupled to a shared gate electrode of the first and second transistors, wherein the second layout includes:

a third transistor;

a fourth transistor disposed in juxtaposition with the third transistor in the other direction and having a conductivity type different from that of the third transistor;

a sixth wire coupled to either one diffusion layer of the third transistor;

a seventh wire coupled to the other diffusion layer of the third transistor;

an eighth wire coupled to either one diffusion layer of the fourth transistor;

a ninth wire coupled to the other diffusion layer of the fourth transistor; and a tenth wire disposed between the third transistor and the fourth transistor in the other direction and coupled to a shared gate electrode of the third and fourth transistors, wherein the first wire, the second wire, the third wire, and the fourth wire each belonging to the first wiring layer extend in the other direction, and wherein the fifth wire, the sixth wire, the seventh wire, the eighth wire, the ninth wire, and the tenth wire each belonging to the first wiring layer extend in the one direction.

2. The semiconductor device according to claim 1, wherein the function cell includes:

a wire belonging to the second wiring layer and coupling together the one diffusion layer and the other diffusion layer of the first transistor and the other diffusion layer of the third transistor;

a wire belonging to the second wiring layer and coupling together the one diffusion layer and the other diffusion layer of the second transistor, the other diffusion layer of the fourth transistor, and the gate electrode of the first and second transistors; and a wire belonging to the second wiring layer and coupling together the one diffusion layer of the third transistor and the one diffusion layer of the fourth transistor, and wherein the function cell has a function of an inverter.

3. The semiconductor device according to claim 1, wherein the function cell includes:

a wire belonging to the second wiring layer and coupling together the one diffusion layer of the first transistor, the one diffusion layer of the second transistor, the one diffusion layer of the third transistor, and the one diffusion layer of the fourth transistor;

a wire belonging to the second wiring layer and coupling together the other diffusion layer of the first transistor and the other diffusion layer of the third transistor;

a wire belonging to the second wiring layer and coupling together the other diffusion layer of the second transistor and the other diffusion layer of the fourth transistor; and a wire belonging to the second wiring layer and coupling together the gate electrode of the first and second transistors and the gate electrode of the third and fourth transistors, and wherein the function cell has a function of an inverter having a twofold driving capability.

4. The semiconductor device according to claim 1, wherein the function cell includes:

a wire belonging to the second wiring layer and coupling together the one diffusion layer of the first transistor, the one diffusion layer of the second transistor, and the gate electrode of the third and fourth transistors;

a wire belonging to the second wiring layer and coupling together the other diffusion layer of the first transistor and the other diffusion layer of the third transistor;

a wire belonging to the second wiring layer and coupling together the one diffusion layer of the third transistor and the one diffusion layer of the fourth transistor; and a wire belonging to the second wiring layer and coupling together the other diffusion layer of the second transistor and the other diffusion layer of the fourth transistor, and wherein the function cell has a function of a buffer.

5. The semiconductor device according to claim 1, wherein the function cell includes:

a wire belonging to the second wiring layer and coupling together the one diffusion layer of the first transistor, the one diffusion layer of the third transistor, and the one diffusion layer of the fourth transistor;

a wire belonging to the second wiring layer and coupling together the one diffusion layer of the second transistor and the other diffusion layer of the fourth transistor; and a wire belonging to the second wiring layer and coupling together the other diffusion layer of the first transistor and the other diffusion layer of the third transistor, and wherein the function cell has a function of a NAND.

6. The semiconductor device according to claim 1, wherein the function cell includes:

a wire belonging to the second wiring layer and coupling together the one diffusion layer of the first transistor and the other diffusion layer of the third transistor;

a wire belonging to the second wiring layer and coupling together the one diffusion layer of the third transistor, the one diffusion layer of the fourth transistor, and the one diffusion layer of the second transistor; and a wire belonging to the second wiring layer and coupling together the other diffusion layer of the second transistor and the other diffusion layer of the fourth transistor, and wherein the function cell has a function of a NOR.

7. A semiconductor device, comprising:

a function cell designed using a basic cell including a first wiring layer provided over a main surface of a semiconductor substrate and having a predetermined pattern and a second wiring layer provided over the first wiring layer and having a predetermined pattern, the function cell corresponding to the basic cell which is modified to have a predetermined function by changing the pattern of the second wiring layer at a design stage, wherein the function cell has a first layout and a second layout which are disposed in juxtaposition in one direction in a plane parallel with the main surface, wherein the function cell is provided with the predetermined function by coupling together wires belonging to the respective second wiring layers of the first layout and the second layout, wherein the first layout includes:

two first transistors having a first conductivity type and one shared diffusion layer;

two second transistors disposed in juxtaposition with the two first transistors in another direction crossing the one direction in the plane and having a second conductivity type and one shared diffusion layer;

a first wire coupling the other diffusion layer of each of the first transistors to a first power supply;

a second wire coupled to the shared one diffusion layer of the first transistors;

a third wire coupling the other diffusion layer of each of the second transistors to a second power supply;

a fourth wire coupled to the shared one diffusion layer of the second transistors; and a fifth wire disposed between the first transistors and the second transistors in the other direction and coupled to shared gate electrodes of the first and second transistors, wherein the second layout includes:

two third transistors having the first conductivity type and one shared diffusion layer;

two fourth transistors disposed in juxtaposition with the two third transistors in the other direction and having the second conductivity type and one shared diffusion layer;

a sixth wire coupling together the respective other diffusion layers of the third transistors;

a seventh wire coupled to the shared one diffusion layer of the third transistors;

an eighth wire coupling together the respective other diffusion layers of the fourth transistors;

a ninth wire coupled to the shared one diffusion layer of the fourth transistors; and a tenth wire disposed between the third transistors and the fourth transistors in the other direction and coupled to shared gate electrodes of the third and fourth transistors, wherein the first wire, the second wire, the third wire, and the fourth wire each belonging to the first wiring layer extend in the other direction, and wherein the fifth wire, the sixth wire, the seventh wire, the eighth wire, the ninth wire, and the tenth wire each belonging to the first wiring layer extend in the one direction.

8. The semiconductor device according to claim 7, wherein the function cell includes:

a wire belonging to the second wiring layer and coupling together the one diffusion layers and the other diffusion layers of the first transistors and the other diffusion layers of the third transistors;

a wire belonging to the second wiring layer and coupling together the one diffusion layers and the other diffusion layers of the second transistors, the other diffusion layers of the fourth transistors, and the gate electrodes of the first and second transistors; and a wire belonging to the second wiring layer and coupling together the one diffusion layers of the third transistors and the one diffusion layers of the fourth transistors, and wherein the function cell has a function of an inverter having a twofold driving capability.

9. The semiconductor device according to claim 7, wherein the function cell includes:

a wire belonging to the second wiring layer and coupling together the one diffusion layers of the first transistors, the one diffusion layers of the second transistors, the one diffusion layers of the third transistors, and the one diffusion layers of the fourth transistors;

a wire belonging to the second wiring layer and coupling together the other diffusion layers of the first transistors and the other diffusion layers of the third transistors;

a wire belonging to the second wiring layer and coupling together the other diffusion layers of the second transistors and the other diffusion layers of the fourth transistors; and a wire belonging to the second wiring layer and coupling together the gate electrodes of the first and second transistors and the gate electrodes of the third and fourth transistors, wherein the function cell has a function of an inverter having a fourfold driving capability.

10. The semiconductor device according to claim 7, wherein the function cell includes:

a wire belonging to the second wiring layer and coupling together the one diffusion layers of the first transistors, the one diffusion layers of the second transistors, and the gate electrodes of the third and fourth transistors;

a wire belonging to the second wiring layer and coupling together the other diffusion layers of the first transistors and the other diffusion layers of the third transistors;

a wire belonging to the second wiring layer and coupling together the one diffusion layers of the third transistors and the one diffusion layers of the fourth transistors; and a wire belonging to the second wiring layer and coupling together the other diffusion layers of the second transistors and the other diffusion layers of the fourth transistors, and wherein the function cell has a function of a buffer having a twofold driving capability.

11. The semiconductor device according to claim 7, wherein the function cell includes:

a wire belonging to the second wiring layer and coupling together the one diffusion layers of the first transistors, the one diffusion layers of the third transistors, and the one diffusion layers of the fourth transistors;

a wire belonging to the second wiring layer and coupling together the one diffusion layers of the second transistors and the other diffusion layers of the fourth transistors; and a wire belonging to the second wiring layer and coupling together the other diffusion layers of the first transistors and the other diffusion layers of the third transistors, and wherein the function cell has a function of a NAND having a twofold driving capability.

12. The semiconductor device according to claim 7, wherein the function cell includes:

a wire belonging to the second wiring layer and coupling together the one diffusion layers of the first transistors and the other diffusion layers of the third transistors;

a wire belonging to the second wiring layer and coupling together the one diffusion layers of the third transistors, the one diffusion layers of the fourth transistors, and the one diffusion layers of the second transistors; and a wire belonging to the second wiring layer and coupling together the other diffusion layers of the second transistors and the other diffusion layers of the fourth transistors, and wherein the function cell has a function of a NOR having a twofold driving capability.

13. A semiconductor device, comprising:

a function cell designed using a basic cell including a first wiring layer provided over a main surface of a semiconductor substrate and having a predetermined pattern and a second wiring layer provided over the first wiring layer and having a predetermined pattern, the function cell corresponding to the basic cell which is modified to have a predetermined function by changing the pattern of the second wiring layer at a design stage, wherein, over the main surface, a plurality of cells including the function cells and the basic cells are provided, wherein each of the basic cells has a first layout and a second layout which are disposed in juxtaposition in one direction in a plane parallel with the main surface,
wherein the first layout includes:
a first transistor;
a second transistor disposed in juxtaposition with the first transistor in another direction crossing the one direction in the plane and having a conductivity type different from that of the first transistor;
a first wire coupling either one diffusion layer of the first transistor to a first power supply;
a second wire coupled to the other diffusion layer of the first transistor;
a third wire coupling either one diffusion layer of the second transistor to a second power supply;
a fourth wire coupled to the other diffusion layer of the second transistor; and
a fifth wire disposed between the first transistor and the second transistor in the other direction and coupled to a shared gate electrode of the first and second transistors,
wherein the second layout includes:
a third transistor;
a fourth transistor disposed in juxtaposition with the third transistor in the other direction and having a conductivity type different from that of the third transistor;
a sixth wire coupled to either one diffusion layer of the third transistor;
a seventh wire coupled to the other diffusion layer of the third transistor;
an eighth wire coupled to either one diffusion layer of the fourth transistor;
a ninth wire coupled to the other diffusion layer of the fourth transistor; and
a tenth wire disposed between the third transistor and the fourth transistor in the other direction and coupled to a shared gate electrode of the third and fourth transistors,
wherein the first wire, the second wire, the third wire, and the fourth wire each belonging to the first wiring layer extend in the other direction, and
wherein the fifth wire, the sixth wire, the seventh wire, the eighth wire, the ninth wire, and the tenth wire each belonging to the first wiring layer extend in the one direction.

14. The semiconductor device according to claim 13, wherein the sixth wire, the seventh wire, the eighth wire, and the ninth wire are electrically floating.

15. The semiconductor device according to claim 13, wherein each of the basic cells includes:
an eleventh wire belonging to the second wiring layer and coupling together the one diffusion layer and the other diffusion layer of the first transistor; and
a twelfth wire belonging to the second wiring layer and coupling together the one diffusion layer and the other diffusion layer of the second transistor.

16. The semiconductor device according to claim 15, wherein the twelfth wire is coupled also to the gate electrode of the first and second transistors.

17. The semiconductor device according to claim 13, wherein each of the basic cells includes:
a wire belonging to the second wiring layer, coupled to the sixth wire, and extending in the one direction;
a wire belonging to the second wiring layer, coupled to the seventh wire, and extending in the one direction;
a wire belonging to the second wiring layer, coupled to the eighth wire, and extending in the one direction;
a wire belonging to the second wiring layer, coupled to the ninth wire, and extending in the one direction; and
a wire belonging to the second wiring layer, coupled to the tenth wire, and extending in the one direction.

18. The semiconductor device according to claim 13, wherein the basic cell can be modified into at least one of function cells which are an inverter, a buffer, a NAND, and a NOR by changing a pattern of the wires in the second wiring layer.

19. The semiconductor device according to claim 13, wherein threshold voltages of the first transistor and the second transistor are higher than threshold voltages of the third transistor and the fourth transistor.

20. The semiconductor device according to claim 13, wherein threshold voltages of the transistors included in the function cells are higher than threshold voltages of the transistors included in the basic cells.

* * * * *